US006473330B1

(12) United States Patent
Ogiwara et al.

(10) Patent No.: US 6,473,330 B1
(45) Date of Patent: Oct. 29, 2002

(54) CHAIN TYPE FERROELECTRIC MEMORY WITH ISOLATION TRANSISTORS COUPLED BETWEEN A SENSE AMPLIFIER AND AN EQUALIZATION CIRCUIT

(75) Inventors: Ryu Ogiwara, Kamakura; Daisaburo Takashima, Yokohama; Sumio Tanaka, Tokyo; Yukihito Oowaki; Yoshiaki Takeuchi, both of Yokohama, all of (JP)

(73) Assignee: Kabushiki Kaisha Toshiba, Kawasaki (JP)

( * ) Notice: Subject to any disclaimer, the term of this patent is extended or adjusted under 35 U.S.C. 154(b) by 152 days.

(21) Appl. No.: 09/585,081

(22) Filed: Jun. 1, 2000

(30) Foreign Application Priority Data

Jun. 2, 1999 (JP) .............................. 11-155131

(51) Int. Cl.[7] .............................................. G11C 11/22
(52) U.S. Cl. ...................... 365/145; 365/205; 365/190; 365/202
(58) Field of Search .......................... 365/145, 230.03, 365/205, 190, 208, 207, 206, 202

(56) References Cited

U.S. PATENT DOCUMENTS

| 5,903,492 A |   | 5/1999 | Takashima ................... 365/145 |
| 6,094,370 A | * | 7/2000 | Takashima ................... 365/145 |
| 6,300,654 B1 | * | 10/2001 | Corvasce et al. ........... 257/296 |

FOREIGN PATENT DOCUMENTS

| DE | 197 24 449 A | 12/1997 | ........... G11C/11/22 |
| EP | 0 631 287 A | 12/1994 | ........... G11C/11/22 |
| JP | 10-255483 | 9/1998 | ........... G11C/14/00 |
| JP | 11-177036 | 7/1999 | ........... H01L/27/10 |

OTHER PUBLICATIONS

Takashima et al., "High–Density Chain Ferroelectric Random Access Memory (CFRAM)", 1997 Symposium on VLSI Circuits Digest of Technical Papers, pp. 83–84.*
Takashima et al., "A Sub–40ns Random Access Chain FRAM Architecture with a 7ns Cell Plate Line Drive", ISSCC Digest of Technical Papers, Feb. 15, 1999, pp. 102–103 and 450.*
D. Takashima, et al., "Gain Cell Block Architecture for Gigabit–Scale Chain Ferroelectric RAM" 1999 Symposium on VLSI Circuits.

* cited by examiner

*Primary Examiner*—Andrew Q. Tran
(74) *Attorney, Agent, or Firm*—Banner & Witcoff, Ltd.

(57) ABSTRACT

A chain type ferroelectric random access memory has a memory cell unit comprising ferroelectric memory cells electrically connected in series to each other, a plate line connected to an electrode of the memory cell unit, a bit line connected to the other electrode of the memory cell unit via a switching transistor, a sense amplifier which amplifies the voltages of this bit line and its complementary bit line, and a transistor inserted between the switching transistor and the sense amplifier, and that a value, being the minimum value of the gate voltage in the transistor obtained during elevation of the plate line voltage and comparative amplification, is smaller than a value, being the maximum value of the gate voltage in the transistor obtained during fall of the plate line voltage and comparative amplification. With these features, decrease in the accumulated charge of polarization in the memory cell is reduced and occurrence of disturb is prevented during read/write operations.

16 Claims, 30 Drawing Sheets

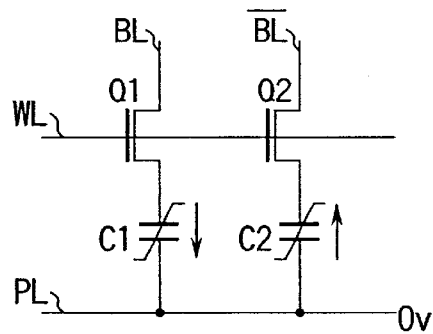
(PRIOR ART) FIG. 26A
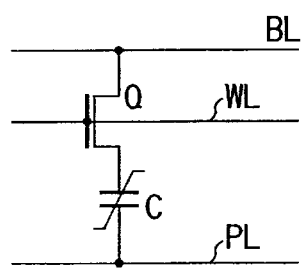
FIG. 25A
(PRIOR ART)
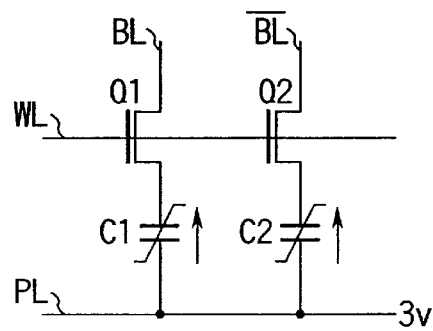
(PRIOR ART) FIG. 26B
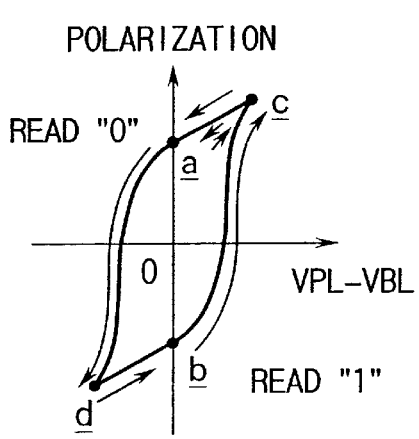
FIG. 25B
(PRIOR ART)
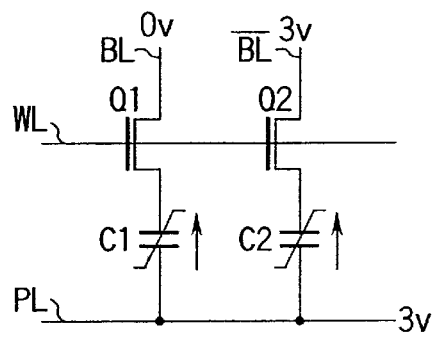
(PRIOR ART) FIG. 26C
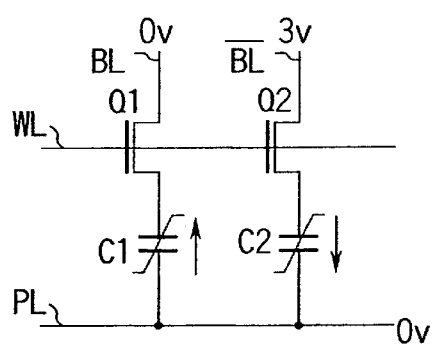
(PRIOR ART) FIG. 26D

CHAIN TYPE FERROELECTRIC MEMORY WITH ISOLATION TRANSISTORS COUPLED BETWEEN A SENSE AMPLIFIER AND AN EQUALIZATION CIRCUIT

CROSS-REFERENCE TO RELATED APPLICATIONS

This application is based upon and claims the benefit of priority from the prior Japanese Patent Application No. 11-155131, filed Jun. 2, 1999, the entire contents of which are incorporated herein by reference.

BACKGROUND OF THE INVENTION

The present invention relates to a semiconductor memory used in integrated memory circuits and integrated memory circuits for use with logic devices and more specifically to a ferroelectric random access memory and a chain type ferroelectric random access memory having memory cells of conventional architecture operated at low boost voltages, also to DRAM, a ferroelectric random access memory and a chain type ferroelectric random access having memory cells of conventional architecture operated by a negative word line method or a boosted sense ground method at low boost voltages.

The ferroelectric material has a hysteresis character in the relationship between applied electric field and induced polarization, wherein if the voltage applied across the electrodes of a ferroelectric thin film is returned to zero, some magnitude of polarization remains. Namely, the polarization generated when a voltage was applied is maintained even after the applied voltage has been removed. Another characteristic feature of this material is that if a certain magnitude of inverse voltage is applied, the direction of polarization is accordingly inverted in the ferroelectric material.

With focus on the above characteristics of the ferroelectric material, a ferroelectric random access memory has been developed that has an array of memory cells where the polarization in a ferroelectric thin film is stored as logical information.

There are two representative structures for ferroelectric random access memory cells: a structure in which a ferroelectric thin film is used as an insulative thin film inserted between the two electrodes of a capacitor that holds information; and the other structure in which a ferroelectric thin film is used as the gate insulative film in a MOS transistor used for switching operation.

The former structure is obtained by replacing the capacitor in the DRAM cell with a ferroelectric capacitor. Dipole charge of either two directions of polarity is taken out from the ferroelectric capacitor through a MOS transistor that serves as a transfer gate. Since this operation is a destructive readout, the read data is written back after readout.

The following are the basic structure, characteristics and principles in write/read operations of the former type of ferroelectric random access memory cells.

As types of ferroelectric random access memory cells, there are a 1T1C-type cell of which equivalent circuit is shown in FIG. 25A and a 2T2C-type cell comprising two 1T1C-type cells of which equivalent circuit is shown in FIG. 27A.

In the 1T1C-type cell shown in FIG. 25A, a MOS transistor Q as a transfer gate and a ferroelectric capacitor C serving as memory are electrically connected in series. A word line WL is electrically connected to the gate of the MOS transistor Q, a bit line BL to an electrode (drain) of the MOS transistor Q and a plate line PL to an electrode (plate) of the capacitor C.

FIG. 25B is a hysteresis loop that explains how the 1T1C-type ferroelectric random access memory cell shown in FIG. 25A reads logical data "0" and "1", indicating the relationship between a voltage (difference between the plate line voltage VPL and the bit line voltage VBL) applied to a ferroelectric thin film inserted between the electrodes of a ferroelectric capacitor and the magnitude of induced polarization P(C/m). The points "a" and "b" represent the magnitude of remnant polarization.

As hysteresis characteristics shown in FIG. 25B indicate, a cell can represent two different logical states by two residual polarization (Pr) points, "a" and "b", which are the magnitudes of polarization observed when no voltage (V=0) is applied across the electrodes of the ferroelectric thin film in a ferroelectric capacitor.

Next, the principles of read/write operations in a 1T1C-type ferroelectric random access memory cell are explained with reference to the hysteresis loop shown in FIG. 25B.

First, the bit line voltage VBL is equalized to the ground voltage at the precharge cycle, and then the equalization is released. After the transistor Q is turned on and the word line WL is selected, the plate line voltage VPL is elevated from the ground voltage to the supply voltage to extract the charge stored in the capacitor C to the bit line. The resulting change in the bit line voltage is compared with the reference voltage generated from a cell for reference use and amplified by a sense amplifier (not shown).

When data "0" is read, the polarity in the capacitor C is not inverted and the amount of electric charge read out to the bit line is small. As a result of comparative amplification by the sense amplifier, the bit line (on the side of storage node in the capacitor C) voltage becomes equal to the ground voltage. Thus the polarization of the capacitor C moves from point "a" to point "c" on the hysteresis curve.

On the other hand, when data "1" is read, the polarity in the capacitor C is inverted and the amount of charge read out to the bit line when the supply power voltage is applied as the above plate line voltage VPL is larger than that in the operation of reading "0". As a result of comparative amplification by the sense amplifier, the bit line (on the side of storage node in the capacitor C) voltage becomes equal to the supply power voltage. Thus the polarization in the capacitor C moves from point "b" to point "c" and then point "a" on the hysteresis curve.

Next, the data latched in the sense amplifier is sent to a data line (not shown) and the plate line voltage VPL is reduced to the ground voltage. Then, the polarization state moves back to point "a" when reading data "0" and moves to point "d" when reading data "1".

Later, when the transistor Q is turned off, the polarization state moves from point "d" to point "b" when reading "1" and then the rewrite operation to the capacitor C is completed.

The above was an explanation of read/rewrite operations. When new data is written, the voltage equal to the supply power voltage should be applied to the bit line if data "1" is written, and the voltage equal to the ground voltage to an input/output line (not shown) if data "0" is written, while the supply power voltage is applied to the plate line.

In the 2T2C-type cell shown in FIG. 26A, a first bit line BL is electrically connected to an electrode of the first transistor Q1 in the first cell, and a second bit line /BL, paired with the first bit line BL, is electrically connected to an electrode of the second transistor Q2 in the second cell. The gates of two transistors Q1 and Q2 have a common word line WL, and the plate electrodes of the two capacitors C1 and C2 have a common plate line PL. The above two bit line BL and /BL are electrically connected to a sense amplifier (not shown) for amplifying the bit line sense voltage and an equalizer circuit (not shown), for example.

Next, the principles of read/write operations in the 2T2C-type ferroelectric random access memory cell are explained.

FIGS. 26A to 26D indicate the applied voltage and the state of polarization in the ferroelectric capacitor during write operation. FIGS. 27A to 27C indicate the applied voltage and the state of polarization in the ferroelectric capacitor during read operation.

FIG. 28 shows the voltage applied to the plate line during above data write and read operations. During write and read operations in the ferroelectric memory cell, the direction of polarization is controlled by changing the plate voltage PL in the selected memory cell as 0V→3V→0V, for example.

(A) In the case of writing data, the plate line voltage PL is set to 0V at first, and the voltages of the bit line pair BL and /BL are equalized to 0V. Now it is assumed that the two capacitors C1 and C2 have polarization of which directions are opposite to each other as shown in FIG. 26A.

First, the equalization of the bit lines is released. Next, as shown in FIG. 26B, 4.5V, for example, is applied to the word line WL and the two transistors Q1 and Q2 are turned on. Then 3V, for example, is applied to the plate line PL, and the charges in the capacitors C1 and C2 are read out to the bit line pair BL and /BL. At this moment, a voltage is induced across the electrodes of the capacitor C1 and its polarity is inverted but the polarity of the capacitor C2 is not inverted.

Next, as shown in FIG. 26C, 3V, for example, is applied to either of the bit lines BL or /BL (/BL, for example), and 0V to the rest (BL, for example), and then the plate line PL is returned to 0V as shown in FIG. 26D. As a result, a voltage is induced across the electrodes of the second capacitor C2 and its polarity is inverted but the polarity of the first capacitor C1 is not inverted. Thus polarization with polarity opposite to the initial direction has been written. Later, the word line WL is returned to 0V, and the two transistors Q1 and Q2 are returned to an off state.

(B) In the case of reading data, the plate line PL is set to 0V at first, and the bit line pair BL and /BL are equalized to 0V. It is assumed at this moment that two capacitors C1 and C2 have polarization of which directions are opposite to each other as shown in FIG. 27A.

First, the equalization of the bit lines is released. Next, as shown in FIG. 27B, 4.5V, for example, is applied to the word line WL and the two transistors Q1 and Q2 are turned on. Then 3V, for example, is applied to the plate line PL, and the charges in the capacitors C1 and C2 are read out to the bit line pair BL and /BL. At this moment, a voltage is induced across the electrodes of the second capacitor C2 and its polarity is inverted but the polarity of the first capacitor C1 is not inverted. As a result, the bit line voltage V(BL) becomes lower than the bit line voltage /V(BL). The voltages read from the two capacitors C1 and C2 are amplified by the sense amplifier, and the bit line voltage V(BL) and the bit line voltage /V(BL) become 0V and 3V, respectively, as the output of the sense amplifier.

Then the plate line PL is returned to 0V as shown in FIG. 27C. As a result, a voltage is induced across the electrodes of the second capacitor C2 and its polarity is inverted again but the polarity of the first capacitor C1 is not inverted, returning to the initial state. Later, the word line WL is returned to 0V and the two transistors Q1 and Q2 are returned to an off state.

Such ferroelectric random access memory is under an intensive development effort these years because compared with other types of nonvolatile memory such as flash memory it allows a larger number of rewrites, takes shorter time for write operation, and operates at lower voltages with less power.

Such ferroelectric random access memory with those characteristics is expected to replace conventional memory such as DRAM, flash memory and SRAM. Also its integration with logic devices is raising great expectations. Furthermore, since the ferroelectric random access memory operates with no battery backup and at high speed, its use in non-contacting cards (RF-ID: Radio Frequency-Identification) has started.

On the other hand, if the bit line in the ferroelectric random access memory is made in a folded configuration, its line width cannot be made thinner than $8F^2$ (F is the minimum design line width). There is another problem that the operation speed of the ferroelectric random access memory is lower than that of DRAM because it drives the plate line containing a large capacity.

To solve those problems, the following papers have been presented to propose new architectures for chain FRAM: VLSI Circuit Sympo. 1997 p. 83–84 "High-Density Chain Ferroelectric Random Access Memory (CFRAM)"; and ISSCC Tech. Dig. Papers, pp. 102–103, February 1999 "A Sub-40 ns Random-Access Chain FRAM Architecture with 7 ns Cell-Plate-Line Drive".

This type of ferroelectric random access memory has an array of memory cell units comprising two or more serially connected ferroelectric memory cells where the electrodes of the ferroelectric capacitor are electrically connected to the source and the drain of the MOS transistor. Any memory cell can be accessed as desired by turning on the transistors of non-selected cells and turning off the transistor of the selected cell.

According to those papers for chain type ferroelectric random access memory, a higher operation speed and a higher device density are provided, because its cell size becomes a half that of the conventional ferroelectric random access memory and its bit line width becomes ¼ that of the conventional ferroelectric random access memory. The following is a brief explanation of the conventional ferroelectric random access memory.

FIG. 29 is a schematic description of part of the conventional chain type ferroelectric random access memory electric circuit and in particular part of the memory cell array and part of the peripheral circuit.

In FIG. 29, memory cell units are arrayed in line in the memory cell area. In this memory cell unit, more than one memory cell is serially connected of which electrodes in the ferroelectric capacitor are electrically connected to the source and the drain of an enhanced-type (E-type) NMOS transistor.

The present example shows a representative memory cell unit comprising serially connected 8 memory cells, M0–M7 and BM0–BM7. The transistors in those cells, M0–M7, are denoted as Tr0–Tr7, the capacitors as C0–C7, and likewise the transistors in the cells BM0–BM7 are denoted as BTr0–BTr7, and the capacitors as BC0–BC7.

The gates of those transistors Tr0–Tr7 and BTr0–BTr7 are electrically connected to corresponding word lines WLr<0>–WLr<7>, and one electrode of the memory cell unit is electrically connected to the plate line PL<0> or PL<1>. The other electrode is electrically connected to the bit line BL or its complementary bit line BBL through a MOS transistor QB0 or QB1 that is used for selecting a block.

An equalizing circuit EQ, flip-flop-type sense amplifier SA and column selection gate CG are electrically connected to the above bit line pair BL and BBL.

The MOS transistors QB0 and QB1 that are used for selecting a block are controlled by the block select signals V(BSr<0>) and V(BSr<1>), the equalization circuit EQ is controlled by the equalization control signal V(BEQL), the sense amplifier SA is controlled by sense amplifier activation control signals V(SEN) and V(BSEP), and the column selection gate CG is controlled by the column select control signal V(CSL).

However, there is a typical problem in such structure shown in FIG. 29 that the stored polarization is reduced and a disturb takes place during conventional read/rewrite/write operations. This problem is discussed in detail as follows.

First Example of Conventional Write Operation

FIG. 30 shows a timing chart and a voltage waves figure has almost the same architecture the nodes BL1R–BL7R during operation in which the cells M0 and BM0 are selected by selecting a word line Wr<0>, for example, for a 2T2C-type cells shown in FIG. 29, data "0" is read from the cell M0 by the single plate pulse driving method, and then data "1" is written from outside the chip.

This first examples of operation is explained in detail below with reference to FIG. 30.

First, the equalization control signal V(BEQL) is lowered to release the equalization of the pair of bit lines, and the word line control voltage V(WLr<0>) is lowered to select a word line WLr<0>. Next, the block select signals V(BSr<0>) and V(BSr<1>) are lifted to connect the memory cells M0 and BM0 to the bit line pair BL and BBL. Later, the plate line voltages V(PL<0>) and V(PL<1>) are lifted to read the charge of polarization in the memory cells M0 and BM0 out to the bit lines BL and BBL.

Then the sense amplifier activation signal V(SEN) is lifted and the sense amplifier activation signal V(BSEP) is lowered to activate the sense amplifier SA to perform comparative amplification. At this time since the polarization data stored in the memory cell MO is "0", namely, it has a direction from the plate line to the sense amplifier, as a result of the comparative amplification, the nodes BL1R–BL7R stand at the lifted plate line voltage but the node BL0R stands at 0V, as shown in FIG. 29.

Later, the column select signal V(CSL) is selected while the sense amplifier is activated, and data "1" is written from outside the chip through the column selection gate CG. Then if the elevated voltage in the word line is low, the nodes BL1R–BL7R are boosted significantly. As a result voltages develop between:

Node BL7R and node BL6R;
Node BL6R and node BL5R;
Node BL5R and node BL4R;
Node BL4R and node BL3R;
Node BL3R and node BL2R;
Node BL2R and node BL1R.

The reasons are shown below.

As described above, when the node voltage is further elevated by the sense amplifier SA than the lifted plate line voltage, the source voltages of the cell transfer gates Tr0–Tr7 rise and the voltage differences between the gates and the sources of the transfer gates Tr0–Tr7 grow. As a result, the transfer gates Tr0–Tr7 turn off because of a rise in their threshold level due to bias effects in the board. Since the node voltages are further boosted by the sense amplifier SA after Tr0–Tr7 have been turned off, this voltage increment provided by the sense amplifier SA is shared by the capacity existing between the sense amplifier SA and the cell transfer gates Tr0–Tr7.

Consequently, voltage arises at both electrodes of each of the cell transfer gates Tr0–Tr7 and the level of polarization is lowered. In particular, between the node BL2R and the node BL1R, a large voltage bias appears. If the polarity of the memory cell M1 that has not been selected agrees with the direction from the plate line to the sense amplifier (namely, data is "0"), an electric field appears to reduce this accumulated polarization. This effect is called disturb.

<Second Example of Conventional Write Operation>

FIG. 31 consists of a timing chart and a voltage waves figure has almost the same architecture the nodes BL1R–BL7R during operations in which the cells M0 and BM0 are selected by selecting the word line Wr<0>, for example, for the 2T2C-type cells shown in FIG. 29, data "0" is read from the cell M0 by the double plate pulse driving method, and then data "1" is written from outside the chip.

This second examples of operation is explained in detail below with reference to FIG. 31.

First, the equalization control signal V(BEQL) is lowered to release the equalization of the pair of bit lines. The word line control voltage V(WLr<0>) is lowered to select a word line WLr<0>. Next, the block select signals V(BSr<0>) and V(BSr<1>) are lifted to connect the memory cells M0 and BM0 to the bit line pair BL and BBL.

Later, the plate line voltages V(PL<0>) and V(PL<1>) are lifted and lowered by pulses to read the charge of polarization in the memory cells M0 and BM0 out to the bit lines BL and BBL.

Then the sense amplifier activation signal V(SEN) is lifted and the sense amplifier activation signal V(BSEP) is lowered to activate the sense amplifier SA to perform comparative amplification. At this point in time, since the polarization data stored in the memory cell M0 is "0", namely, it has a direction from the plate line to the sense amplifier, as a result of the comparative amplification, the nodes BL1R–BL7R stand at the lifted plate line voltage but the node BL0R stands at 0V, as shown in FIG. 31.

Later, the column select signal V(CSL) is selected while the sense amplifier is activated, and data "1" is written from outside the chip through the column selection gate CG. Then if the elevated voltage in the word line is low, the nodes BL1R–BL7R are boosted significantly. As a result voltage differences appear between:

Node BL7R and node BL6R;
Node BL6R and node BL5R;
Node BL5R and node BL4R;
Node BL4R and node BL3R;
Node BL3R and node BL2R;
Node BL2R and node BL1R. The reasons are shown below.

As described above, when the node voltage is further elevated by the sense amplifier SA than the lifted plate line voltage, the source voltages of the cell transfer gates rise and the voltage differences between the gates and the sources of the transfer gates grow. As a result, the transfer gates Tr0–Tr7 turn off because of a rise in their threshold level due to bias effects in the board. Since the node voltages are further boosted by the sense amplifier SA after Tr0–Tr7 have been turned off, this voltage increment provided by the sense amplifier SA is shared by the capacity existing between the sense amplifier SA and the cell transfer gates Tr0–Tr7.

Consequently, voltage arises at both electrodes of each of the cell transfer gates Tr0–Tr7 and the level of polarization is lowered. In particular, between the node BL2R and the node BL1R, a large voltage bias appears. If the polarity of the memory cell M1 that has not been selected agrees with the direction from the plate line to the sense amplifier (namely, data is "0"), an electric field appears to reduce this accumulated polarization. This effect is called disturb.

Third Example of Conventional Write Operation

FIG. 32 shows a timing chart and a voltage waves figure has almost the same architecture the nodes BL1R–BL7R during operation in which the cells BM7 and M7 are selected by selecting a word line Wr<7>, for example, for the 2T2C-type cells shown in FIG. 29, data "1" is read from the cell M7 by the double plate pulse driving method.

This third examples of operation is explained in detail below with reference to FIG. 32.

First, the equalization control signal V(BEQL) is lowered to release the equalization of the pair of bit lines. The word line control voltage V(WLr<7>) is lowered to select word line WLr<7>. Next, the block select signals V(BSr<0>) and V(BSr<1>) are lifted to connect the memory cells BM7 and M7 to the bit line pair BL and BBL.

Later, the plate line voltages V(PL<0>) and V(PL<1>) are lifted to read the charge of polarization in the memory cells BM7 and M7 out to the bit lines BL and BBL.

Then the sense amplifier activation signal V(SEN) is lifted and the sense amplifier activation signal V(BSEP) is lowered to activate the sense amplifier SA to perform comparative amplification. At this time since the polarization data stored in the memory cell BM7 is "1", namely, it has a direction from the sense amplifier to the plate line, the nodes BBL0R-BBL7R are boosted significantly when the plate line voltages V(PL<0>) and V(PL<1>) are changed from "L" to "H" if the elevated voltage in the word line is low. As a result voltage differences appear between:

Node BBL7R and node BBL6R;
Node BBL6R and node BBL5R;
Node BBL5R and node BBL4R;
Node BBL4R and node BBL3R;
Node BBL3R and node BBL2R;
Node BBL2R and node BBL1R.

The reasons are shown below.

If the elevated voltage in the word line is low and the threshold level of the transfer gates BTr0–BTr7 is high, when the node voltage is boosted by the plate line to a value higher than the supply power voltage of the sense amplifier SA, the source voltage of each cell transfer gate rises and the voltage differences between the gates and the sources of the transfer gates BTr0–BTr7 grow. As a result, the transfer gates BTr0–BTr7 turn off because of a rise in their threshold level due to bias effects in the board. Since the node voltages are further boosted by the sense amplifier SA after BTr0–BTr7 have been turned off, this voltage increment provided by the sense amplifier SA is shared by the capacity existing between the plate line and the cell transfer gates BTr0–BTr7.

Consequently, between the node BBL7R and the node BBL6R in particular, a large voltage bias appears. If the polarity of the memory cell BM6 that has not been selected agrees with the direction from the sense amplifier to the plate line (namely, data is "1"), an electric field appears to reduce the accumulated polarization. This effect is called disturb.

The above explanations were made for the case in which the bit line was precharged to 0V during data read. However, in the first and second examples of operation, disturb also takes place even when the bit line is precharged to a high level during data read.

To date, the above problem itself with regard to disturb in the conventional chain type ferroelectric random access memory has not been pointed out or no solution has been presented.

Moreover, there is another problem in FRAM of the conventional memory cell structure that when data is read by the single plate pulse driving method, the plate voltage is significantly boosted and the reliability of the cell capacitor is undermined. The reasons are shown below.

FIG. 33 is a schematic description of part of a ferroelectric random access memory having the conventional memory cell architecture and in particular part of the memory cell array and part of the peripheral circuit.

In FIG. 33, memory cells are arrayed in lines in the memory cell area. In this example, two memory cells M0 and BM0 are taken as examples, the transistors in these cells are denoted as Tr0 and BTr0, and the capacitors as C0 and BC0. One of the electrodes of each capacitor C0 and BC0 is electrically connected to the plate lines PL<0> and PL<B0>, respectively; the gates of the transistors Tr0 and BTr0 are electrically connected to the word lines WL<0> and WL<B0>; and one of the electrodes of the transistors Tr0 and BTr0 is electrically connected to the bit line BL and its complementary bit line BBL, respectively.

An equalizing circuit EQ, flip-flop-type sense amplifier SA and column selection gate CG are electrically connected to the above bit line pair BL and BBL.

The equalization circuit EQ is controlled by the equalization control signals V(BEQL), the sense amplifier SA is controlled by the sense amplifier activation control signals V(SEN) and V(BSEP), and the column selection gate CG is controlled by the column selection control signal V(CSL).

FIG. 34 is a timing chart indicating an operation in which the word lines WL<0> and WL<B0> in the ferroelectric random access memory shown in FIG. 33 are selected to select the cells M0 and BM0, and data "1" is read from the cell M0 by the single plate pulse driving method.

The above operation is explained in detail with reference to FIG. 34. It is assumed that the cell M0 has a polarity directing from the bit line to the plate line (data "1") and the cell BM0 has a polarity directing from the plate line to the bit line (data "0").

First, the equalization of the bit lines BL and BBL is released by reducing the equalization control signal V(BEQL) to be ready to read data out to the bit lines BL and BBL. Next, the word lines WL<0> and WL<B0> are selected by elevating the word line voltages V(WL<0>) and V(WL<B0>) from 0V to VPP. Then the charges of polarization in the memory cells M0 and BM0 are read out to the bit line pair, BL and BBL, by lifting the plate line voltage V(PL<0>) and V(PL<B0>) from 0V to V(PLPW).

At the next step, the sense amplifier activation signal V(SEN) is raised and the sense amplifier signal V(BSEP) is lowered to activate the sense amplifier SA and perform sense amplification. Data is read out from the chip by raising the column select signal V(CSL) to turn on the column selection gate CG.

Since the above sense amplification is conducted when the plate line voltages V(PL<0>) and V(PL<B0>) are raised to V(PLPW), the plate line voltage V(PL<0>) is boosted up to a voltage higher than V(PLPW) because of a coupling of the bit line BL and the plate line PL<0> when data "1" stored in the cell M0 is read out.

Later, the plate line voltages V(PL<0>) and V(PL<B0>) are lowered to 0V and the word line voltages V(WL<0>) and V(WL<B0>) are also lowered from VPP to 0V to make the word lines WL<0> and WL<B0> non-selected. Finally, the sense amplifier activation signal V(SEN) is lowered and the sense amplifier signal V(BSEP) is raised to deactivate the sense amplifier SA.

As pointed out before, there is a problem that when the plate voltage is significantly boosted by a coupling of the bit line BL and the plate line PL<0>, the reliability of the cell capacitor is affected.

On the other hand, as the supply power voltage for semiconductor memory has been lowered, its operation speed is also lowered unless the threshold value of MOS transistor is lowered in proportion. However, since information is stored in a form of electric charge in a capacitor in the memory cell in DRAM, the threshold in the transfer gate cannot be reduced. As a result, the minimum value of the threshold is left around 0.7V.

Because the threshold in MOS transistor cannot be lowered, the following two problems occur:

(1) If MOS transistor is made smaller, its threshold value remains high. Then charge density in the board becomes extremely high, resulting in an increase in the electric field at the junction, an increase in leakage current at the junction and a decline in the refresh characteristics;

(2) Since the voltage difference between the word line voltage VWL and the bit line voltage VBL cannot be enhanced enough to turn on the cell transfer gate, a high voltage boost rate (VWL/VBL) is required. Consequently, the design of the booster circuit becomes complicated.

Then the following two proposals have allowed DRAM to reduce the threshold value of MOS transistor. Those technologies aim at reducing current leakage at the transfer gate even under a low threshold value.

(1) Negative Word Line (NWL) Method

FIG. 35A and FIG. 35B indicate a schematic configuration of a DRAM employing the NWL method and the relationship between the word line WL and the high level voltage VBL(H) and the low-level voltage VBL(L) of the bit lines BL and /BL.

In FIG. 35A, Q is the cell transfer gate, C the cell capacitor, WL the word line, WLD the word line driver, BL and /BL the bit line pair, SA the sense amplifier, and SDA the sense amplifier driver.

In this method, the low level "L" of voltage amplified by the sense amplifier SA, namely, the bit line voltage VBL(L), is set to the ground voltage VSS, and the voltage "L" of the word line WL is set to the negative voltage VBB. Then a negative bias VBB is applied between the gate and the source of the cell transfer gate Q and the cut-off characteristics of the transfer gate Q are improved.

Note that the high level "H" of the word line WL has been boosted to a value higher than the high level "H" of the output of the sense amplifier SA, namely, the bit line voltage VBL(H), by an amount of the threshold value Vth3 of the cell transfer gate Q plus α (namely, at least Vth3).

(2) Boosted Sense Ground (BSG) Method

FIG. 36A and FIG. 36B indicate a schematic configuration of a DRAM employing the BSG method and the relationship between the word line WL and the high level voltage VBL(H) and the low-level voltage VBL(L) of the bit lines BL and /BL.

In FIG. 36A, Q is the cell transfer gate, C the cell capacitor, WL the word line, WLD the word line driver, BL and /BL the bit line pair, SA the sense amplifier, SDA the sense amplifier driver, and VOFF the off-set voltage.

In this method, the low level "L" of voltage amplified by the sense amplifier SA, namely, the bit line voltage VBL(L), is set to a value higher by VOFF than the ground voltage VSS. Since a negative bias VOFF is applied between the gate and the source of the cell transfer gate Q, the cut-off characteristics of the transfer gate Q are improved.

Note that the high level "H" of the word line WL has been boosted to a value higher than the high level "H" of the output of the sense amplifier SA, namely, the bit line voltage VBL(H), by an amount of the threshold value Vth2 of the cell transfer gate Q plus α (namely, at least Vth2).

As mentioned above, those methods have been proposed to meet requirements for lower power consumption and lower voltage in DRAM. However, as long as a positive value is used as the threshold value of the cell transfer gate, a value of VPP higher than the supply power voltage VCC plus Vth (the threshold value of the cell transfer gate) is required as the boost voltage for the word line. The same holds true for conventional ferroelectric random access memory.

As pointed out above, there is a problem in the conventional ferroelectric random access memory that disturb is induced during read/write operations and that the accumulated polarization is attenuated.

There is another problem in FRAM of the conventional memory cell structure that when data is read by the single plate pulse driving method, the plate voltage is significantly boosted and the reliability of the cell capacitor is affected.

Another problem in DRAM and ferroelectric random access memory of the conventional memory cell structure is that a booster circuit is necessary to provide a word line voltage higher than the supply voltage plus the threshold value of the cell transfer gate because they use a positive value for the threshold of the cell transfer gate in both cases of the NWL and BSG methods.

BRIEF SUMMARY OF THE INVENTION

The present invention has been accomplished to overcome the above problems and has its object to provide a ferroelectric memory which is capable of reducing the occurrence of disturb during read/write operations in chain type ferroelectric random access memory, reducing or eliminating the decrease in polarization charge stored in the memory cell.

Another object of this invention is to provide a ferroelectric memory which is capable of reducing the boost of the plate line during read/write operations by the single plate pulse driving method in order not to affect the reliability of the cell capacitor.

Also, another object of this invention is to provide a semiconductor memory such as a ferroelectric random access memory which is capable of operating at low voltages and consuming less power.

The features of a first aspect of the present invention for a ferroelectric random access memory are that it has a memory cell unit comprising serially connected memory cells where both electrodes of each of the ferroelectric capacitor are electrically connected to the source and the drain of the first MOS transistor respectively, a plurality of word lines each of which is electrically connected to the gate of each first MOS transistor in the memory cell unit, a plate line electrically connected to an electrode of the memory cell unit, the bit line electrically connected to the other electrode of the memory cell unit via a switching device for selecting a block, a sense amplifier which amplifies the voltages of a bit line pair of the bit line and its complementary bit line, and the second MOS transistor inserted between the switching device for selecting a block and the sense amplifier; and that if the minimum value of the gate voltage in the second MOS transistor is denoted as VPP1 when the plate line voltage is elevated and the sense amplifier is performing comparative amplification, and if the maximum value of the gate voltage in the second MOS transistor is denoted as VPP2 when the plate line voltage is lowered and the sense amplifier is performing comparative amplification, the relation VPP1<VPP2 is provided.

The features of a second aspect of the present invention for a ferroelectric random access memory are that it has a memory cell array comprising more than one memory cell where an electrode of the first MOS transistor is electrically connected to at least one ferroelectric capacitor, a word line connected to the gate of the first MOS transistor, the bit line electrically connected to the first MOS transistor node on the other side of the transistor where the ferroelectric capacitor is electrically connected, a plate line electrically connected to the first MOS transistor at its node on the other side of the transistor where the ferroelectric capacitor is electrically connected, a sense amplifier which amplifies the voltage of a bit line pair of the bit line and its complementary bit line, and the second MOS transistor inserted between the bit line and the sense amplifier; and that if the minimum value of the gate voltage in the second MOS transistor is denoted as VPP1 when the plate line voltage is elevated and the sense amplifier is performing comparative amplification, and if the maximum value of the gate voltage in the second MOS transistor is denoted as VPP2 when the plate line voltage is lowered and the sense amplifier is performing comparative amplification, the relation VPP1<VPP2 is provided.

In the features of the first and second aspects of the present invention for a ferroelectric random access memory, if the maximum value of the gate voltage in the second MOS transistor is denoted as VPP3 when the plate line voltage is elevated and the sense amplifier is not performing comparative amplification, VPP1<VPP3 is preferable. In this case, the value of VPP3 is equal to or greater than the sum of the maximum amplitude in the bit line voltage and the threshold voltage of the second MOS transistor.

In the features of the first and second aspects of the present invention for a ferroelectric random access memory, it is preferable that VPP2 is equal to or greater than sum of the maximum amplitude in the bit line voltage and the threshold voltage of the second MOS transistor (the same as the boosted voltage VPP on the word line).

In the features of the first and second aspects of the present invention for a ferroelectric random access memory, it is preferable that VPP1 is less than the sum of the maximum amplitude in the bit line voltage and the threshold voltage of the second MOS transistor.

In the features of the first and second aspects of the present invention for a ferroelectric random access memory, VPP1 may be the same as the maximum amplitude in the bit line voltage or the external supply power voltage VCC or 0V.

Another feature of the first aspect of the present invention for a ferroelectric random access memory may include an additional equalization circuit. This equalization circuit is electrically connected to the bit line pair between the switching device for block selection and the second MOS transistor, and equalizes the bit line pair to 0V at a specified timing.

In this case, it is possible to write again the polarization with a direction from the plate line to the sense amplifier in the memory cell by controlling the equalization circuit to turn on while the gate voltage of the second MOS transistor is 0V, and to control the equalization circuit to turn on only when the sense amplifier becomes inactive.

The above operations can be employed when data is written from outside the memory chip after data is read out from the selected cell in the memory cell unit and when data is written again after data is read out from the selected cell in the memory cell unit.

Also, when data is written again after data is read out from the selected cell in the memory cell unit and when data is written from outside the memory chip after data is read out from the selected cell in the memory cell unit, it is possible to write again the polarization with a direction from the plate line to the sense amplifier in the memory cell by controlling the equalization circuit to turn on while the gate voltage of the second MOS transistor is 0V.

Further features of the first aspect of the present invention for a ferroelectric random access memory are an addition of a pair of the third transistors and an addition of a pair of the fourth transistors to the first embodiment of this invention. Each of the third transistors receives the voltage of each bit line at its control electrode, and the pair of the input/output nodes of the sense amplifier are electrically connected between each pair of the electrodes of the transistors. Each of the fourth transistors is inserted between the pair of the input/output nodes of the sense amplifier and each bit line, and controlled to convey data which was amplified by the sense amplifier to each bit line by being turned on after the plate line voltage fell to 0V.

A third aspect of the present invention for semiconductor memory is featured by having a memory cell comprising at least one first MOS transistor with a threshold of 0V or near 0V and at least one capacitor as memory electrically connected to an electrode of the above transistor, a word line electrically connected to the gate of the first MOS transistor, a bit line electrically connected to the first MOS transistor at the node on the other side of the transistor where the capacitor for memory is electrically connected, and a sense amplifier that compares the voltage at the bit line with the reference voltage and amplifies the bit line voltage.

Another feature of the third aspect of the present invention for semiconductor memory is that the insulative film employed between the electrodes of the capacitor for memory may be a ferroelectric thin film.

A further feature of the third aspect of the present invention for semiconductor memory is that the insulative film employed between the electrodes of the capacitor for memory may be a gate oxide film.

The features of a fourth aspect of the present invention for semiconductor memory are that it has a memory cell unit comprising serially connected memory cells where both electrodes of each of the ferroelectric capacitor are electrically connected to the source and the drain of the first MOS transistor respectively, a plurality of word lines each of which is electrically connected to the gate of the first MOS transistor in the memory cell unit, a plate line electrically connected to an electrode of the memory cell unit, each first MOS transistor for block select of which electrode is electrically connected to the other electrode of the memory cell unit, the bit line electrically connected to the other electrode of the first MOS transistor, a sense amplifier which amplifies the voltage of a bit line pair of the bit line and its complementary bit line. Also the first MOS transistor is featured by having a threshold value of 0V or near 0V.

Another feature of the third and fourth aspect of the present invention for semiconductor memory is that the boosted voltage on the word line may be equal to the supply power voltage.

Another feature of the third and fourth aspect of the present invention for semiconductor memory is that the voltage on the word line may be a negative value when it has not been selected.

A further feature of the third and fourth aspect of the present invention for semiconductor memory is that the output of the lower voltage given by the sense amplifier may be a positive value in one of the first to the fifth embodiments of the present invention for semiconductor memory.

According to a fifth aspect of the present invention, there is provided a ferroelectric memory comprising a memory cell unit comprising a plurality of memory cells in each of which one of the two electrodes of a ferroelectric capacitor is electrically connected to the source of a first MOS transistor and the other electrode to the drain thereof; a plurality of word lines each of which is electrically connected to the gate of the first MOS transistor; a plate line electrically connected to one of the two electrodes of the memory cell unit; a bit line electrically connected to the other electrode of the memory cell unit via a block select switching device; a sense amplifier to compare and amplify the voltages of a bit line pair of the bit line and its complementary bit line; an equalization circuit connected between the bit line pair, for equalizing the bit line pair to 0V with a specific timing; and a second MOS transistor inserted between the equalization circuit and the sense amplifier, for selectively disconnecting the equalization circuit and the sense amplifier from each other, with a disconnection control signal applied to the gate thereof.

According to a sixth aspect of the present invention, there is provided a ferroelectric memory comprising a memory cell unit comprising a plurality of memory cells in each of which one of the two electrodes of a ferroelectric capacitor is electrically connected to the source of a first MOS transistor and the other electrode to the drain thereof; a plurality of word lines each of which is electrically connected to the gate of the first MOS transistor; a plate line electrically connected to one of the two electrodes of the memory cell unit; a bit line electrically connected to the other electrode of the memory cell unit via a block select switching device; a sense amplifier to compare and amplify the voltages of a bit line pair of the bit line and its complementary bit line; a pair of second transistors each of which receives the voltage of the bit line pair at each control electrode, the pair of the input/output nodes of the sense amplifier being electrically connected to between each pair of the electrodes of the transistors; and a pair of third transistors for data writing each of which is inserted between the pair of the input/output nodes of the sense amplifier and the bit line pair, and controlled to convey data which was amplified by the sense amplifier to the bit line pair.

In the ferroelectric memory according to the sixth aspect of the present invention, the ferroelectric memory may further comprise an equalization circuit connected between the bit line pair, for equalizing the bit line pair to 0V with a specific timing.

According to a seventh aspect of the present invention, there is provided a ferroelectric memory comprising a memory cell array comprising a plurality of memory cells in each of which an electrode of a first MOS transistor is electrically connected to an electrode of at least one ferroelectric capacitor; a word line which is electrically connected to the gate of the first MOS transistor; a bit line electrically connected to the first transistor at the node on the other side of the transistor where the ferroelectric capacitor is electrically connected; a plate line electrically connected to the ferroelectric capacitor at the node on the other side on the capacitor where the first MOS transistor is electrically connected; a sense amplifier to compare and amplify the voltages of a bit line pair of the bit line and its complementary bit line; an equalization circuit connected between the bit line pair, for equalizing the bit line pair to 0V with a specific timing; and a second MOS transistor inserted between the equalization circuit and the sense amplifier, for selectively disconnecting the equalization circuit and the sense amplifier from each other, with a disconnection control signal applied to the gate thereof.

According to an eighth aspect of the present invention, there is provided a semiconductor memory comprising a memory cell comprising at least one first MOS transistor having a threshold level of 0V or near 0V and at least one capacitor to store information electrically connected at one terminal thereof to an electrode of the transistor; a word line electrically connected to the gate of the first MOS transistor; a bit line electrically connected to the first MOS transistor at the node on the other side of the transistor where the memory capacitor is connected; a plate line connected to the other terminal of the capacitor; and a sense amplifier which compares the voltages on the bit line and its complementary bit line and amplifies the voltage difference.

According to a ninth aspect of the present invention, there is provided a ferroelectric memory comprising a memory cell unit comprising a plurality of memory cells in each of which one of the two electrodes of a ferroelectric capacitor is electrically connected to the source of a first MOS transistor having a threshold level of 0V or near 0V and the other electrode to the drain thereof; a plurality of word lines each of which is electrically connected to the gate of the first MOS transistor; a plate line electrically connected to one of the two electrodes of the memory cell unit; a bit line electrically connected to the other electrode of the memory cell unit via a block select switching device; a sense amplifier to compare and amplify the voltages of a bit line pair of the bit line and its complementary bit line; and an equalization circuit connected between the bit line pair, for equalizing the bit line pair to 0V with a specific timing.

According to a tenth aspect of the present invention, there is provided a semiconductor memory comprising a memory cell comprising at least one first MOS transistor having a threshold level of 0V or near 0V and at least one capacitor to store information electrically connected at one terminal thereof to an electrode of said transistor, the other terminal of the capacitor being connected to a predetermined power supply potential; a word line electrically connected to the gate of said first MOS transistor; a bit line electrically connected to the first MOS transistor at the node on the other side of said transistor where the memory capacitor is connected; and a sense amplifier which compares the voltages on the bit line and its complementary bit line and amplifies the voltage difference.

Additional objects and advantages of the invention will be set forth in the description which follows, and in part will be obvious from the description, or may be learned by practice of the invention. The objects and advantages of the invention may be realized and obtained by means of the instrumentalities and combinations particularly pointed out hereinafter.

BRIEF DESCRIPTION OF THE SEVERAL VIEWS OF THE DRAWING

The accompanying drawings, which are incorporated in and constitute a part of the specification, illustrate presently preferred embodiments of the invention, and together with the general description given above and the detailed description of the preferred embodiments given below, serve to explain the principles of the invention.

FIG. 25A is a circuit diagram equivalent to a 1T1C-type ferroelectric random access memory cell.

FIG. 25B is the hysteresis loop indicating data "0" and "1" read operations in the cell capacitor.

FIG. 26A–FIG. 26D are the equivalent circuits of a 2T2C-type ferroelectric random access memory cell illustrating its write operation and the direction of polarization in a ferroelectric capacitor.

DETAILED DESCRIPTION OF THE INVENTION

By referring to the accompanying drawings, embodiments of the present invention will be described in detail below.
<First Embodiment>

Figure 1:
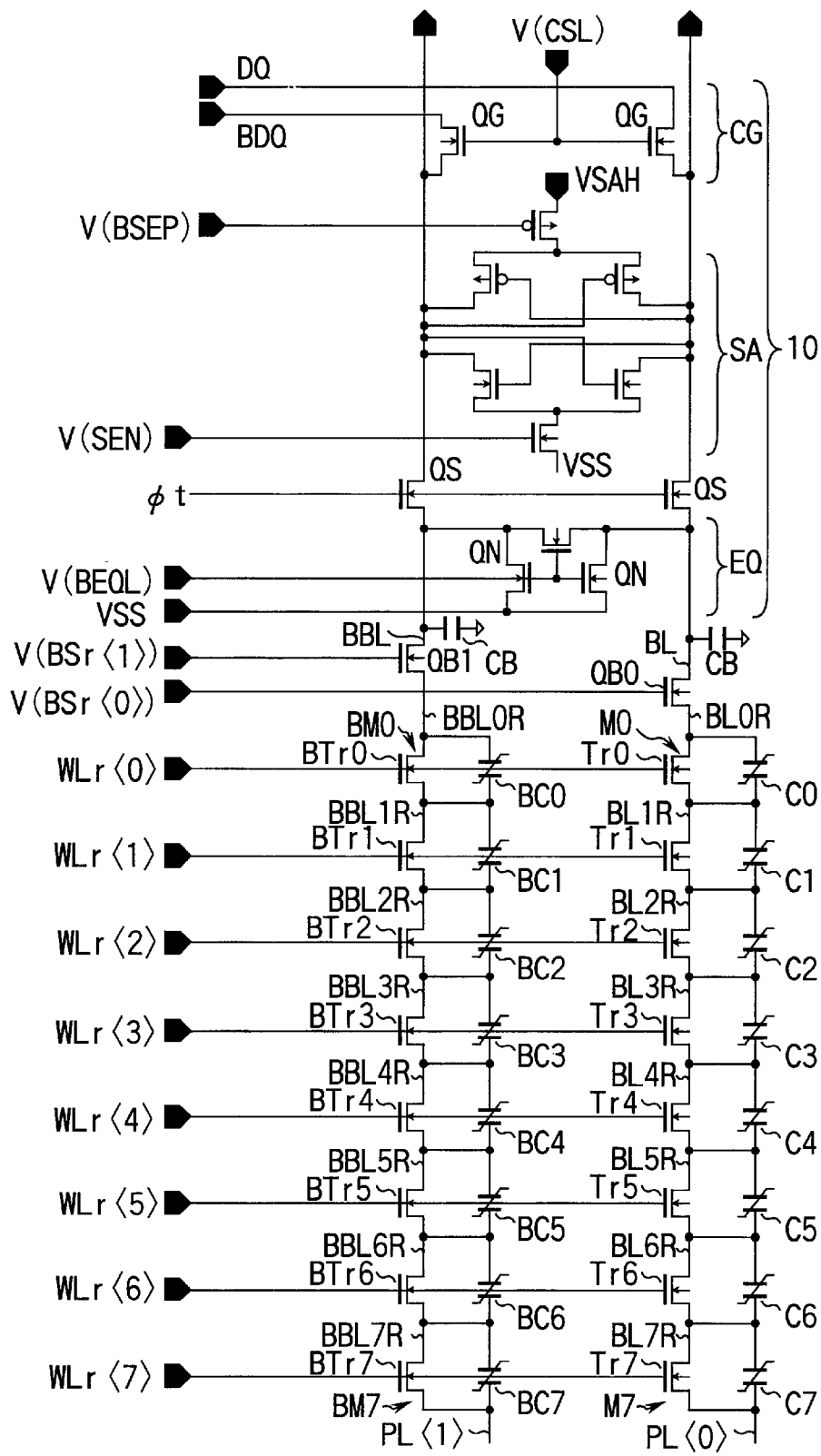
FIG. 1 is a schematic representation of part of the electric circuit of a chain type ferroelectric random access memory according to the first embodiment of the invention.

FIG. 1 is a schematic representation of part of the electric circuit of a chain type ferroelectric random access memory according to the first embodiment of the invention and more specifically part of circuit connection of the memory cell array and its peripheral circuit.

In FIG. 1, memory cell units are arrayed in lines in the memory cell area. Each memory cell unit consists of a plurality of serially connected memory cells where both electrodes of each ferroelectric capacitor are electrically connected to the source and the drain of an E-type NMOS transistor, respectively.

In the figure, two cell units of eight memory cells M0–M7 and another eight memory cells BM0–BM7 are shown as an example. The transistors and the capacitors in the cells M0–M7 are denoted as Tr0–Tr7 and C0–C7, and the transistors and the capacitors in the cells BM0–BM7 as BTr0–BTr7 and BC0–BC7.

The gates of the transistors Tr0–Tr7 and BTr0–BTr7 are electrically connected to the word lines WLr<0>–WLr<7>; one electrode of each cell unit is electrically connected to PL<0> or PL<1>; and the other electrode is electrically connected to one of the pair of complementary bit lines BL and BBL via the MOS transistor QB0 or QB1 used for block selection.

Based on address signal, one of the word lines WLr<0>–WLr<7> is selected by a word line select circuit (not shown) and then supplied one of the word line drive voltages V(WLr<0>)–V(WLr<7>).

Based on address signal, the plate line PL<0> or PL<1> is selected by a plate line select circuit (not shown) and then supplied a plate line voltage, V(PL<0>) or V(PL<1>).

The MOS transistors QB0 and QB1 for block selection are controlled by the block select signals V(BSr<0>) and V(BSr<1>).

The bit lines BL and BBL are electrically connected to a sense amplifier area 10. This sense amplifier area has an equalization circuit EQ to equalize the bit line pair BL and BBL, a sense amplifier SA to amplify the BL and BBL voltages, and a column selection gate CG.

Between the equalization circuit EQ and the sense amplifier SA, an NMOS transistor QS is serially inserted in the BL and BBL lines. Based on a separate control signal φt applied to the gate of the transistor QS, the equalization circuit EQ and the sense amplifier SA are selectively connected or isolated.

The equalization circuit EQ which is controlled by an equalization control signal V(BEQL) has NMOS transistors QN each of which is electrically connected between the ground voltage line where a bit line precharge voltage VSS is applied and the bit line BL and BBL, respectively, and an NMOS transistor QE inserted between the bit lines BL and BBL.

The sense amplifier SA consists of an NMOS part which is electrically connected to the bit line pair BL and BBL at a pair of sense nodes and controlled of its active/inactive state by a sense amplifier activation signal V(SEN), and a PMOS part which is electrically connected to the bit line pair BL and BBL at a pair of sense nodes and controlled of its active/inactive state by a sense amplifier activation signal V(BSEP).

The NMOS part, of which drains are electrically connected to the bit line pair BL and BBL as conventional cases, consists of two NMOS transistors of which gates are electrically connected to the bit line pair BL and BBL and an NMOS transistor of which gate receives the sense amplifier activation signal V(SEN) and inserted in common between the sources of the two NMOS transistors and the lower ("L") voltage side VSS of the sense amplifier.

The PMOS part, of which drains are electrically connected to the bit line pair BL and BBL as conventional cases, consists of two PMOS transistors of which gates are electrically connected to the bit line pair BL and BBL and a PMOS transistor of which gate receives the sense amplifier activation signal V(BSEP) and inserted in common between the sources of the two PMOS transistors and the higher ("H") voltage side VCC of the sense amplifier. As conventional cases, the column selection gate CG consists of NMOS transistors QG inserted each between a pair of data lines DQ and BDQ which are shared by the two columns (the bit line pair BL and BBL). This column selection gate is switched by a column select line CSL prepared for selecting a desired bit line pair BL and /BL, and transfers data in the bit line pair BL and BBL after the data is amplified by the sense amplifier in the corresponding column to the data line pair DQ and BDQ. This column selection gate also serves to write data entered from outside the chip to a desired bit line pair BL and /BL.

FIRST EXAMPLE

Figure 2:
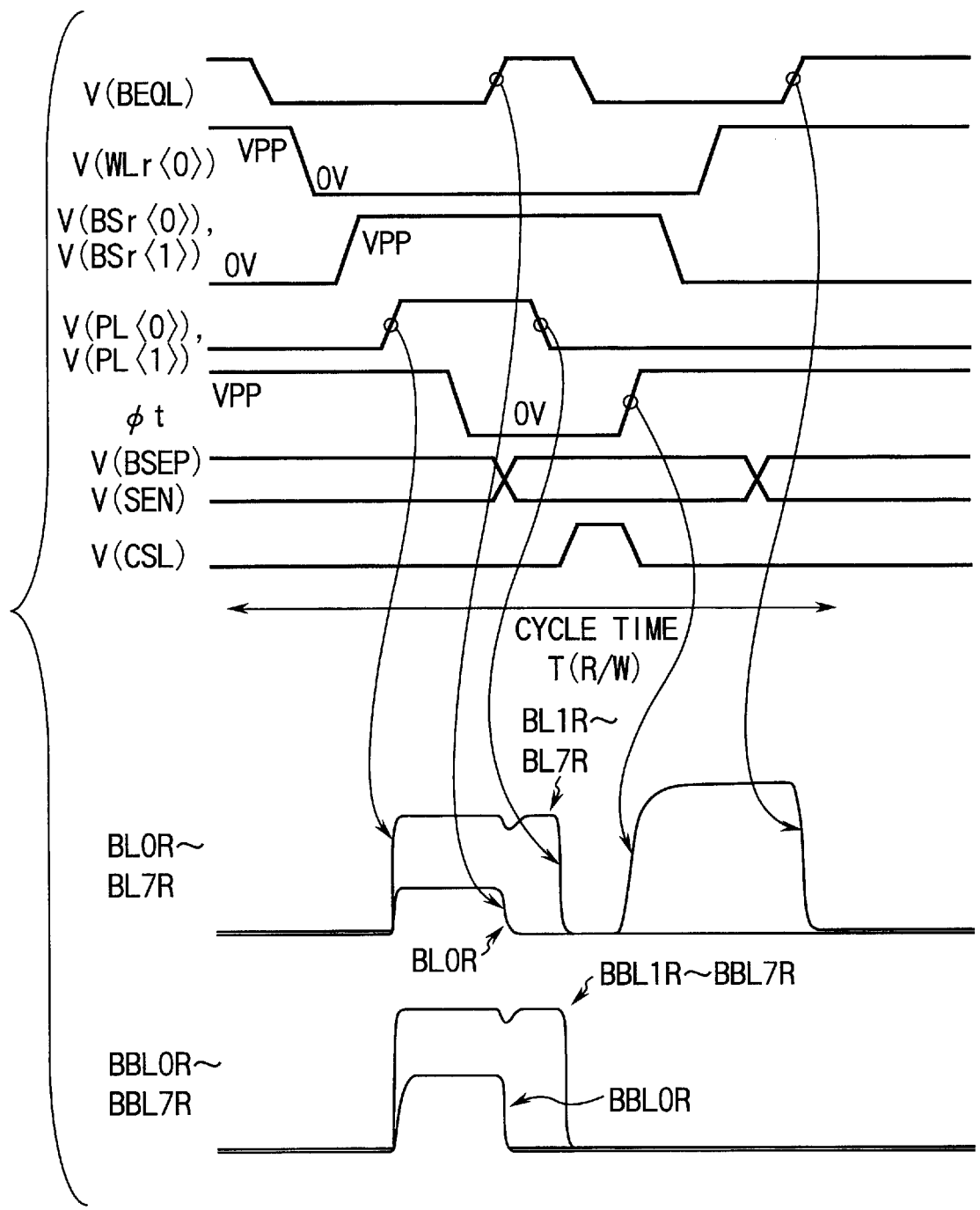
FIG. 2 is a timing chart showing a series of operations in the first embodiment of the invention of the chain type ferroelectric random access memory shown in FIG. 1 and a voltage wave figure showing detailed changes in voltage at the nodes BL0r–BL7r and BBL0r–BBL7r shown in FIG. 1.

FIG. 2 is a timing chart showing a series of operations in the chain type ferroelectric random access memory shown in FIG. 1 observed when it reads/writes data or writes data from outside of the chip in a 2T2C-type memory cell by the single plate pulse driving method, and a voltage wave figure showing detailed changes in voltage at the nodes BL0R–

BL7R of the cell transistors Tr0–Tr7 and the nodes BBL0r–BBL7r of the cell transistors BTr0–BTr7 shown in FIG. 1.

When selecting a word line, for example WLr<0>, it is assumed that the polarization with a direction from the plate line PL<0> to the bit line BL (namely, data "0") is written in the cell M0 on the BL side and the polarization with a direction from the bit line BL to the plate line PL<0> (namely, data "1") is written in the cell BM0 on the BBL side; and that data "0" and data "1" are read from the memory cells M0 and BM0, respectively, and data "0" and data "1" are written from outside the chip.

The above operation is explained in detail below.

First, the equalization control signal V(BEQL) is lowered to "L" to release the equalization of the bit line pair BL and BBL to make them in a floating state to be ready to read data out to the bit line pair BL and BBL.

Next, the word line voltage V(WLr<0>) is lowered from VPP to 0V to be ready to apply voltage to the electrodes of the cell M0 and BM0. Then the block select signals V(BSr<0>) and V(BSr<1>) are raised from 0V to "H" to turn on the block selection transistors QB0 and QB1 and the plate line voltages V(PL<0>) and V(PL<1>) are raised from "L" to "H" to read data out to the bit line pair BL and BBL. To be more specific, the charge read out to the node BL0R of the cell transistor Tr0 and the charge read out to the node BBL0R of the cell transistor BTr0 are then read out to a pair of sense nodes of the sense amplifier SA, by elevating the voltage on the plate line.

Next, the isolation control signal φt is lowered from VPP to 0V to turn off the isolation transistor QS to isolate the bit line pair BL and BBL between the equalization circuit EQ and the sense amplifier SA. Then the sense amplifier activation signal V(BSEP) is lowered and the sense amplifier activation signal V(SEN) is raised to perform sense amplification with the sense amplifier SA. During the above isolation, the column selection signal V(CSL) is raised to "H" to read the data stored in the sense amplifier SA to outside the chip and to write data from outside the chip to the sense amplifier SA.

On the other hand, as mentioned before, after the isolation transistor QS is turned off, the equalization control signal V(BEQL) is raised to "H" to equalize the bit line pair BL and BBL to 0V. By this operation, data "0" (namely, the polarization with a direction from the plate line to the bit line) is written in the cells M0 and BM0.

Next, the plate line voltages V(PL<0>) and V(PL<1>) are lowered to 0V and the equalization control signal V(BEQL) is lowered to "L" to release the equalization of the bit line pair BL and BBL to make them in the floating state again. Then the data latched by the sense amplifier SA is written in the bit line pair BL and BBL by raising the isolation control signal φt from 0V to VPP to turn on the isolation transistor QS.

Then if the voltage on the BL side in the sense amplifier area 10 is "H", the polarization with a direction from the bit line to the plate line is again written in the cell M0 on the BL side. However, if the voltage on the BL side in the sense amplifier area 10 is "L", the polarization with a direction from the plate line to the bit line, which was the data written for the first time during the power-down of the isolation transistor QS, is continued to be written as it is.

In this example of the first embodiment of the inactivation, the data in the cell M0 is changed into the polarization with a direction from the bit line BL to the plate line PL<0> (namely, data "1") and the polarization with a direction from the plate line PL<1> to the bit line (namely, data "0") is continued to be written in the cell BM0 as it is.

Later, the word line WLr<0> is raised to VPP, the sense amplifier activation signals V(SEN) and V(BSEP) are deactivated, and the equalization control signal V(BEQL) is raised to "H".

The above description is an explanation of the write cycle operation in which data is written to a memory cell from outside the chip after the data is read out. The read/rewrite cycle operation can also be explained as below based on the timing chart shown in FIG. 2.

First, the equalization control signal V(BEQL) is lowered to "L" to release the equalization of the bit line pair BL and BBL to make them in a floating state to be ready to read data out to the bit line pair BL and BBL.

Next, the word line voltage V(WLr<0>) is lowered from VPP to 0V to be ready to apply both electrodes of the cell M0 and BM0. Then the block select signals V(BSr<0>) and V(BSr<1>) are raised from 0V to "VPP" to turn on the block selection transistors QB0 and QB1 and the plate line voltages V(PL<0>) and V(PL<1>) are raised from "L" to "H" to read data out to the bit line pair BL and BBL. To be more specific, the charges read out to the node BL0R of the cell transistor Tr0 and the node BBL0R of the cell transistor BTr0 are then read out to a pair of sense nodes of the sense amplifier SA, by elevating the voltage on the plate line. Next, the isolation control signal φt is lowered from VPP to 0V to turn off the isolation transistor QS to isolate the bit line pair BL and BBL between the equalization circuit EQ and the sense amplifier SA. Then the sense amplifier activation signal V(BSEP) is lowered and the sense amplifier activation signal V(SEN) is raised to perform sense amplification with the sense amplifier SA. During the above isolation the column selection signal V(CSL) is raised to "H" to read data to the sense amplifier SA and write data to the sense amplifier SA from outside the chip.

On the other hand, as mentioned before, after the isolation transistor QS is turned off, the equalization control signal V(BEQL) is raised to "H" to equalize the bit line pair BL and BBL to 0V. By this operation, data "0" (namely, the polarization with a direction from the plate line to the bit line) is written in the cells M0 and BM0. Next, the plate line voltages V(PL<0>) and V(PL<1>) are lowered to 0V and the equalization control signal V(BEQL) is lowered to "L" to release the equalization of the bit line pair BL and BBL to make them in the floating state again. Then the data latched by the sense amplifier SA is written in the bit line pair BL and BBL by raising the isolation control signal φt from 0V to VPP to turn on the isolation transistor QS.

Then if the voltage on the BL side in the sense amplifier area 10 is "H", the polarization with a direction from the bit line to the plate line is again written in the cell M0 on the BL side. However, if the voltage on the BL side in the sense amplifier area 10 is "L", the polarization with a direction from the plate line to the bit line, which was the data written for the first time during the power-down of the transistor QS, is continued to be written as it is.

In this example of the first embodiment of the inactivation, the data in the cell M0 is changed into the polarization with a direction from the plate line PL<0> to the bit line (namely, data "0"), and the polarization with a direction from the bit line BL to the plate line PL<1> (namely, data "1") is continued to be written in the cell BM0 as it is.

Later, the word line WLr<0> is raised to VPP, the sense amplifier activation signals V(SEN) and V(BSEP) are deactivated, and the equalization control signal V(BEQL) is raised to "H".

The above read cycle and the write cycle have the same driving mode of the equalization control signal V(BEQL), and the read cycle time T(R) and the write cycle time T(R/W) are equal to each other.

In the chain type ferroelectric random access memory in the first example of the present invention, the transistor for isolation QS is inserted between the cell array and the sense amplifier SA, and the equalization circuit EQ to equalize the bit line pair BL and BBL to the ground voltage with a specific timing is inserted between the above isolation transistor QS and the cell array. As a result, it is possible to prevent the disturb referred to before.

In more specific, the isolation transistor QS is turned off to protect data latched by the sense amplifier SA and then the equalization circuit EQ is turned on to write data "0" in the cell. Next, the plate line is lowered to 0V and the isolation transistor QS is turned on after the equalization circuit EQ is turned off. Then the data latched by the sense amplifier SA or entered from outside the chip is written in the cell. Since data is written while the plate line voltage has been lowered to 0V, both plate line voltage and bit line voltage do not become 0V at the same time.

Thus the voltages at the nodes BL0R–BL7R of the cell transistors Tr0–Tr7 and the nodes BBL0r–BBL7r of the cell transistors BTr0–BTr7 shown in FIG. 1 are not boosted, or the source voltages of the cell transistors Tr0–Tr7 and BTr0–BTr7 are not raised, or the cell transistors are not turned off because of the bias effect in the board. As a result, the disturb is not caused which is a phenomenon that the accumulated charge of polarization decreases due to a voltage bias appearing at the electrodes of the cell transfer gate.

Also in the chain type ferroelectric random access memory in the first example of the present invention, since the sense amplification is performed after the isolation transistor QS is turned off, there is a secondary advantage that the imbalance in capacitance in the cell capacitors is isolated from the sense amplifier SA. Another secondary advantage is that the large parasitic capacitance CB in the bit lines is also isolated from the sense amplifier SA and the sensing operation is performed at a high speed.

In the above first example of the present invention, a series of read/write operations in 2T2C-type cells are shown. However, even in 1T1C-type cells, the read/write operations can be performed easily by selecting a cell and comparing the voltage read out from this cell to the bit line with a reference voltage separately generated (for example, a voltage read out from a reference cell to the counterpart bit line complementary to the above bit line).

SECOND EXAMPLE

This example differs from the first one in that the method of driving the equalization control signal V(BEQL) in the read cycle is different from that in the write cycle, and each cycle can be optimized independently.

In the example, the operation of write cycle is the same as that shown in FIG. 2 as mentioned before, but the operation of read cycle is performed as follows.

Figure 3:
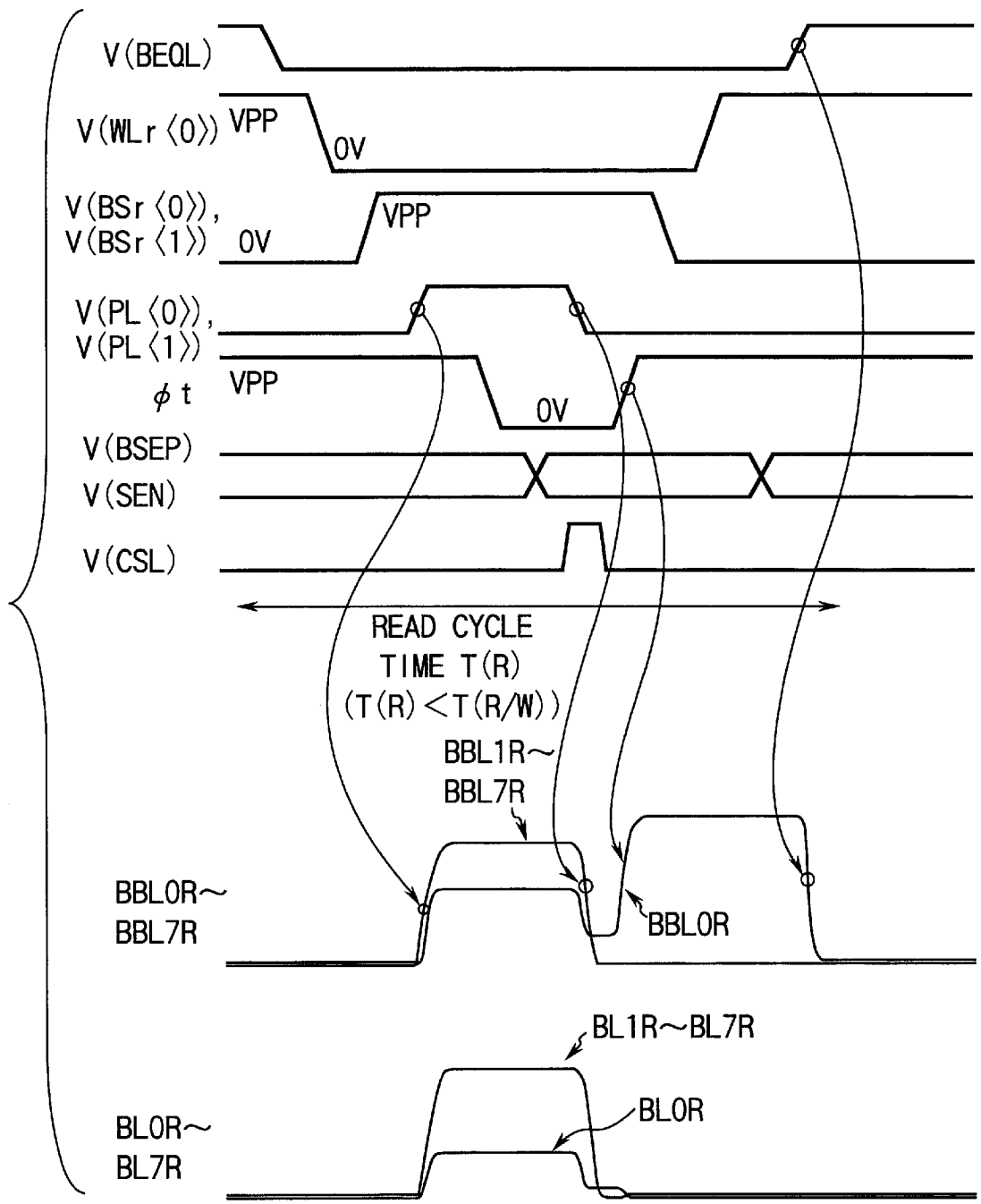
FIG. 3 is a timing chart showing a series of operations in the second embodiment of the invention of the chain type ferroelectric random access memory shown in FIG. 1 and a voltage wave figure showing detailed changes in voltage at the nodes BL0r–BL7r and BBL0r–BBL7r shown in FIG. 1.

FIG. 3 is a timing chart showing a series of read cycle operations of the chain type ferroelectric random access memory in FIG. 1 observed when it reads/rewrites data from/to a 2T2C-type memory cell by the single plate pulse driving method, and a voltage wave figure showing detailed changes in voltage at the nodes BL0R–BL7R of the cell transistors Tr0–Tr7 and the nodes BBL0r–BBL7r of the cell transistors BTr0–BTr7 shown in FIG. 1.

When selecting a word line, for example WLr<0> as in the case of the first example, it is assumed that the polarization with a direction from the plate line PL<0> to the bit line BL (namely, data "0") is written in the cell M0 on the BL side and the polarization with a direction from the bit line BL to the plate line PL<1> (namely, data "1") is written in the cell BM0 on the BBL side; and that data "0" and data "1" are read from the memory cells M0 and BM0, respectively, and then written back.

The above operation is explained in detail below with reference to FIG. 3.

First, the equalization control signal V(BEQL) is lowered to "L" to release the equalization of the bit line pair BL and BBL to make them in a floating state to be ready to read data out to the bit line pair BL and BBL.

Next, the word line voltage V(WLr<0>) is lowered from VPP to 0V to be ready to apply both electrodes of the cell M0 and BM0. Then the block select signals V(BSr<0>) and V(BSr<1>) are raised from 0V to "VPP" to turn on the block selection transistors QB0 and QB1 and the plate line voltages V(PL<0>) and V(PL<1>) are raised from "L" to "H" to read data out to the bit line pair BL and BBL. At this moment, the charge read out to the node BL0R of the cell transistor Tr0 and the charge read out to the node BBL0r of the cell transistor BTr0 are then read out to a pair of sense nodes of the sense amplifier SA.

Next, the isolation control signal φt is lowered from VPP to 0V to turn off the isolation transistor QS to isolate the bit line pair BL and BBL between the equalization circuit EQ and the sense amplifier SA.

Then the sense amplifier activation signal V(BSEP) is lowered and the sense amplifier activation signal V(SEN) is raised to perform sense amplification with the sense amplifier SA. During the above isolation the column selection signal V(CSL) is raised to read the data stored in the sense amplifier SA to outside the chip.

In the first example, after the isolation transistor QS is turned off, the bit line pair BL and BBL are equalized to 0V to write data "0" (namely, the polarization with a direction from the plate line to the bit line) in both cells M0 and BM0. However, it should be noted here that the bit line pair BL and BLL are not equalized to 0V in order to speed up operations in the second example.

When the bit line pair BL and BLL are not equalized to 0V, the voltage in the bit line where the data on the "L" side is read out stands at near 0V but not exactly 0V. At this step, data "0" is not written perfectly. However, it causes no problem because upon power-off the voltage returns to its original position (the y intercept of polarization axis) on the hysteresis loop of the cell capacitor.

Next, the plate line voltages V(PL<0>) and V(PL<1>) are lowered to 0V and the data latched by the sense amplifier SA is written in the bit line pair BL and BBL by raising the isolation control signal φt from 0V to VPP to turn on the isolation transistor QS.

Then if the voltage on the BL side in the sense amplifier area 10 is "H", the polarization with a direction from the bit line to the plate line is again written in the cell M0 on the BL side. However, if the voltage on the BL side in the sense amplifier area 10 is "L", the polarization with a direction from the plate line to the bit line, which was the data written for the first time, is continued to be written in the cell M0 on the BL side.

Namely, in this example, the plate line voltages V(PL<0>) and V(PL<1>) are raised to "H" while the voltages of the bit line pair BL and BBL are near 0V to write data "0" in the cell M0 and BM0, and then the plate line voltages V(PL<0>)

and V(PL<1>) are lowered to 0V to write data "1" from the sense amplifier SA to the cell BM0.

Later, the word line WLr<0> is raised to VPP, the sense amplifier activation signals V(SEN) and V(BSEP) are deactivated, and the equalization control signal V(BEQL) is raised to "H".

Therefore, in the second example as the case of the first example, since both plate line voltage and bit line voltage do not become "H" at the same time, such disturb does not take place that was referred to in the first example of the conventional operation. Also since the sense amplification is performed after the isolation transistor QS is turned off, there is a secondary advantage that the imbalance in capacitance in the cell capacitors is isolated from the sense amplifier SA. The large parasitic capacitance CB in the bit lines is also isolated from the sense amplifier SA and the sensing operation can be performed at a high speed.

This second example differs from the first one in the method of equalizing the bit line pair BL and BBL during the operation of read cycle. Namely, in the read (and write) cycle in the first example, the equalization control signal V(BEQL) must be raised and lowered while the isolation transistor QS is turned off. However, in the read cycle in the second example, the equalization control signal V(BEQL) can be left low while the isolation transistor QS is turned off. As a result, in the second example, it is possible to optimize the read cycle and the write cycle independently to make the read cycle time T(R) shorter than the write cycle time T(R/W).

In the above second example of the present invention, a series of read/write operations in 2T2C-type cells are shown. However, even in 1T1C-type cells, the read/write operations can be performed easily by selecting a cell and comparing the voltage read out from this cell to the bit line with a reference voltage separately generated (for example, a voltage read out from a reference cell to the counterpart bit line complementary to the above bit line).

THIRD EXAMPLE

This example differs from the first and second examples in that it employs the double plate pulse driving method instead of the single plate pulse driving method.

Figure 4:
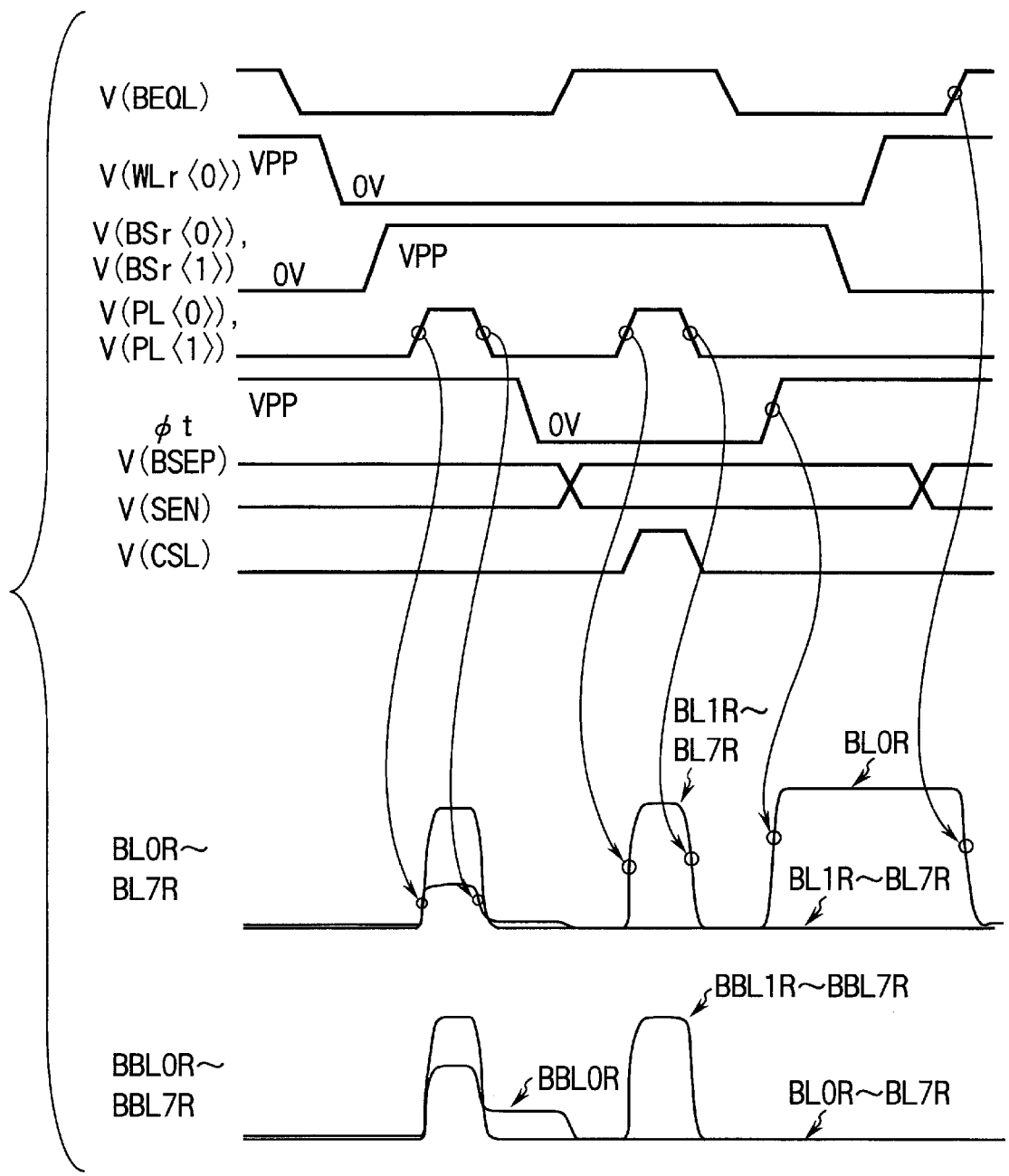
FIG. 4 is a timing chart showing a series of operations in the third embodiment of the invention of the chain type ferroelectric random access memory shown in FIG. 1 and a voltage wave figure showing detailed changes in voltage at the nodes BL0r–BL7r and BBL0r–BBL7r shown in FIG. 1.

FIG. 4 is a timing chart showing a series of operations of the chain type ferroelectric random access memory in FIG. 1 observed when it reads data and writes data from outside the chip to a 2T2C-type memory cell by the double plate pulse driving method, and a voltage wave figure showing detailed changes in voltage at the nodes BL0R–BL7R of the cell transistors Tr0–Tr7 and the nodes BBL0r–BBL7r of the cell transistors BTr0–BTr7 shown in FIG. 1.

When selecting a word line, for example WLr<0> as the case of the first example, it is assumed that the polarization with a direction from the plate line PL<0> to the bit line BL (namely, data "0") is written in the M0 on the BL side and the polarization with a direction from the bit line BL to the plate line PL<1> (namely, data "1") is written in the cell BM0 on the BBL side; and that data "0" and data "1" are read from the memory cells M0 and BM0, respectively, and then data "1" and data "0" are written from outside the chip.

The above operation is explained in detail below with reference to FIG. 4.

First, the equalization control signal V(BEQL) is lowered to "L" to release the equalization of the bit line pair BL and BBL to make them in a floating state to be ready to read data.

Next, the word line voltage V(WLr<0>) is lowered from VPP to 0V to be ready to apply voltage to both electrodes of the cell M0 and BM0. Then the block select signals V(BSr<0>) and V(BSr<1>) are raised from 0V to VPP to turn on the block selection transistors QB0 and QB1 and the plate line voltages V(PL<0>) and V(PL<1>) are driven from "L" to "H" to "L" with pulses to read the difference in polarization as data out to the bit line pair BL and BBL. At this time, the charge read out to the node BL0R of the cell transistor Tr0 and the charge read out to the node BBL0R of the cell transistor BTr0 are then read out to a pair of sense nodes of the sense amplifier SA.

Next, the isolation control signal ϕt is lowered from VPP to 0V to turn off the isolation transistor QS to isolate the bit line pair BL and BBL between the equalization circuit EQ and the sense amplifier SA. Then the sense amplifier activation signal V(BSEP) is lowered and the sense amplifier activation signal V(SEN) is raised to perform sense amplification with the sense amplifier SA. During the above isolation, the column selection signal V(CSL) is raised to "H" to read the data stored in the sense amplifier SA to outside the chip and to write data from outside the chip in the sense amplifier SA.

On the other hand, as mentioned before, after the isolation transistor QS is turned off, the equalization control signal V(BEQL) is raised to "H" to equalize the bit line pair BL and BBL to 0V. During this equalization, data "0" (namely, the polarization with a direction from the plate line to the bit line) is written in both cells M0 and BM0 by driving the plate line voltages V(PL<0>) and V(PL<1>) from "L" to "H" to "L" with pulses.

Next, after the equalization control signal V(BEQL) is lowered to "L" to release the equalization of the bit line pair BL and BBL to make them in the floating state again, the data latched by the sense amplifier SA is written in the bit line pair BL and BBL by raising the isolation control signal ϕt from 0V to VPP to turn on the isolation transistor QS.

Then if the voltage on the BBL side in the sense amplifier area 10 is "H", the polarization with a direction from the bit line to the plate line is again written in the cell BM0 on the BBL side. However, since the voltage on the BBL side in the sense amplifier area 10 is "L", the polarization with a direction from the plate line to the bit line, which was the data written for the first time during the power-down of the transistor QS, is continued to be written as it is. On the other hand, since the voltage on the BL side in the sense amplifier area 10 is "H" because of the write from outside the chip, the polarization with a direction from the bit line to the plate line is written in the cell M0 on the BL side.

Namely, in this example, the plate line voltages V(PL<0>) and V(PL<1>) are raised while the voltages of the bit line pair BL and BBL are equalized to 0V to write data "0" in the cell M0 and BM0, and data "1" and data "0" are written in the cells M0 and BM0, respectively, from the sense amplifier SA while the plate line voltages V(PL<0>) and V(PL<1>) are lowered to 0V.

Later, the word line WLr<0> is raised to VPP, the sense amplifier activation signals V(SEN) and V(BSEP) are deactivated, and the equalization control signal V(BEQL) is raised to "H".

Therefore, in the third example as the case of the first example, since both plate line voltage and bit line voltage do not become "H" at the same time, such disturb does not take place that was referred to in the second example of the conventional operation. Also since the sense amplification is performed after the isolation transistor QS is turned off, there is a secondary advantage that the imbalance in capacitance in the cell capacitors is isolated from the sense amplifier SA. Also the large parasitic capacitance CB in the bit lines is isolated from the sense amplifier SA and the sensing operation can be performed at a high speed.

In the above third example of the present invention, a series of read/write operations in 2T2C-type cells are shown. However, even in 1T1C-type cells, the read/write operations can be performed easily by selecting a cell and comparing the voltage read out from this cell to the bit line with a reference voltage separately generated (for example, a voltage read out from a reference cell to the counterpart bit line complementary to the above bit line).

FOURTH EXAMPLE

Compared with the third example in which the word line WLr<0> was selected to select the cell M0 and BM0 and the double plate pulse driving method was employed for read/write operations, in this fourth example the word line WLr<7> is selected to select the cells M7 and BM7 and the double plate pulse driving method is employed.

Figure 5:
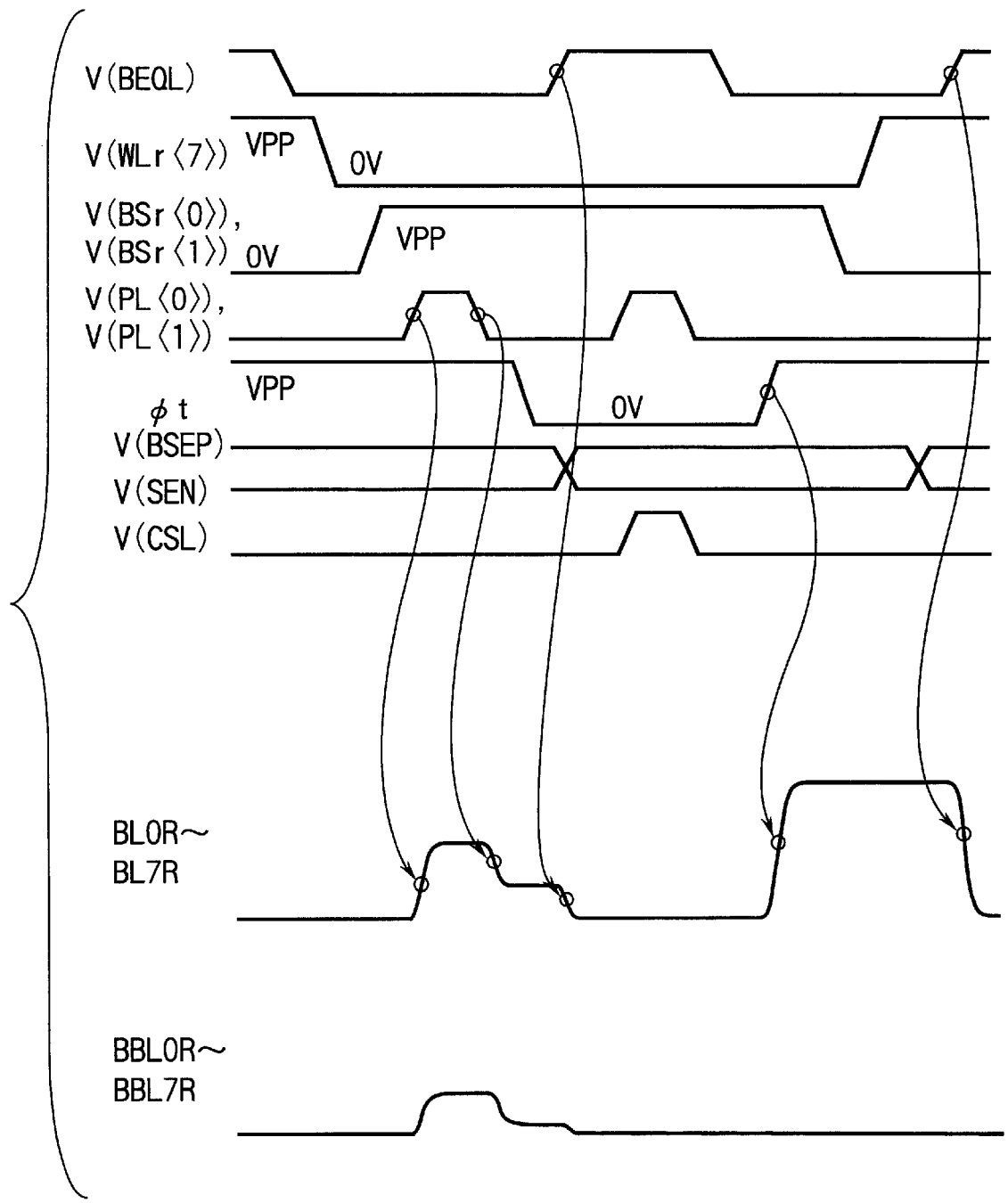
FIG. 5 is a timing chart showing a series of operations in the fourth embodiment of the invention of the chain type ferroelectric random access memory shown in FIG. 1 and a voltage wave figure showing detailed changes in voltage at the nodes BL0r–BL7r and BBL0r–BBL7r shown in FIG. 1.

FIG. 5 is a timing chart showing a series of operations of the chain type ferroelectric random access memory in FIG. 1 observed when it reads/rewrites data from/to a 2T2C-type memory cell by the double plate pulse driving method, and a voltage wave figure showing detailed changes in voltage at the nodes BL0R–BL7R of the cell transistors Tr0–Tr7 and the nodes BBL0r–BBL7r of the cell transistors BTr0–BTr7 shown in FIG. 1.

When selecting a word line, for example WLr<7>, it is assumed that the polarization with a direction from the plate line PL<0> to the bit line BL (namely, data "0") is written in the cell M7 on the BL side and the polarization with a direction from the bit line BL to the plate line PL<1> (namely, data "1") is written in the cell BM7 on the BBL side; and that data "0" and data "1" are read from the memory cells M7 and BM7, respectively, and then they are written back.

The above operation is explained in detail below with reference to FIG. 5.

First, the equalization control signal V(BEQL) is lowered to "L" to release the equalization of the bit line pair BL and BBL to make them in a floating state to be ready to read data out to the bit line pair BL and BBL.

Next, the word line voltage V(WLr<7>)) is lowered from VPP to 0V to be ready to apply voltage to both electrodes of the cells M7 and BM7. Then the block select signals V(BSr<0>) and V(BSr<1>) are raised from 0V to VPP to turn on the block select transistors QB0 and QB1. Later, the plate line voltages V(PL<0>) and V(PL<1>) are driven from "L" to "H" to "L" with pulses to read only the difference in polarization as data out to the bit line pair BL and BBL.

Then, the isolation control signal ϕt is lowered from VPP to 0V to turn off the isolation transistor QS to isolate the bit line pair BL and BBL between the equalization circuit EQ and the sense amplifier SA. Then the sense amplifier activation signal V(BSEP) is lowered and the sense amplifier activation signal V(SEN) is raised to perform sense amplification with the sense amplifier SA. During the above isolation, the column selection signal V(CSL) is raised to "H" to read the data stored in the sense amplifier SA to outside the chip and to write data from outside the chip to the sense amplifier SA.

On the other hand, as mentioned before, after the isolation transistor QS is turned off, the equalization control signal V(BEQL) is raised to "H" to equalize the bit line pair BL and BBL to 0V. During this equalization, data "0" (namely, the polarization with a direction from the plate line to the bit line) is written in both cells M7 and BM7 by driving the plate line voltages V(PL<0>) and V(PL<1>) from "L" to "H" to "L" with pulses.

Next, after the equalization control signal V(BEQL) is lowered to "L" to release the equalization of the bit line pair BL and BBL to make them in the floating state again, the data latched by the sense amplifier SA is written in the bit line pair BL and BBL by raising the isolation control signal ϕt from 0V to VPP to turn on the isolation transistor QS.

Then if the voltage on the BL side in the sense amplifier area 10 is "H", the polarization with a direction from the bit line to the plate line is again written in the cell M7 on the BL side. However, if the voltage on the BL side in the sense amplifier area 10 is "L", the polarization with a direction from the plate line to the bit line, which was the data written for the first time during the power-down of the isolation transistor QS, is continued to be written in the cell M7.

Namely, in this example, the plate line voltages V(PL<0>) and V(PL<1>) are raised while the voltages of the bit line pair BL and BBL are equalized to 0V to write data "0" in the cell M7 and BM7, and while the plate line voltages V(PL<0>) and V(PL<1>) are lowered to 0V, data "1" is written from the sense amplifier SA to the cell BM7.

Later, the word line WLr<7> is raised to VPP, the sense amplifier activation signals V(SEN) and V(BSEP) are deactivated, and the equalization control signal V(BEQL) is raised to "H".

Therefore, in the fourth example as the case of the first example, since both plate line voltage and bit line voltage do not become "H" at the same time, such disturb does not take place that was referred to in the third example of the conventional operation. Also since the sense amplification is performed after the isolation transistor QS is turned off, there is a secondary advantage that the imbalance in capacitance in the cell capacitors is isolated from the sense amplifier SA. Also the large parasitic capacitance CB in the bit lines is isolated from the sense amplifier SA and the sensing operation is performed at a high speed.

In the above fourth example of the present invention, a series of read/write operations in the 2T2C-type cells were shown. However, even in 1T1C-type cells, the read/write operations can be performed easily by selecting a cell and comparing the voltage read out from this cell to the bit line with a reference voltage separately generated (for example, a voltage read out from a reference cell to the counterpart bit line complementary to the above bit line).

FIFTH EXAMPLE

In the first example, the plate line voltage was lowered to 0V, the equalization control signal V(BEQL) was lowered to "L", and then data was written in the bit line pair BL and BBL. The fifth example is different from the first example in that operations can be performed at higher speed in this example by starting to write data in the bit line pair BL and BBL before the plate line voltage falls to 0V completely.

Figure 6:
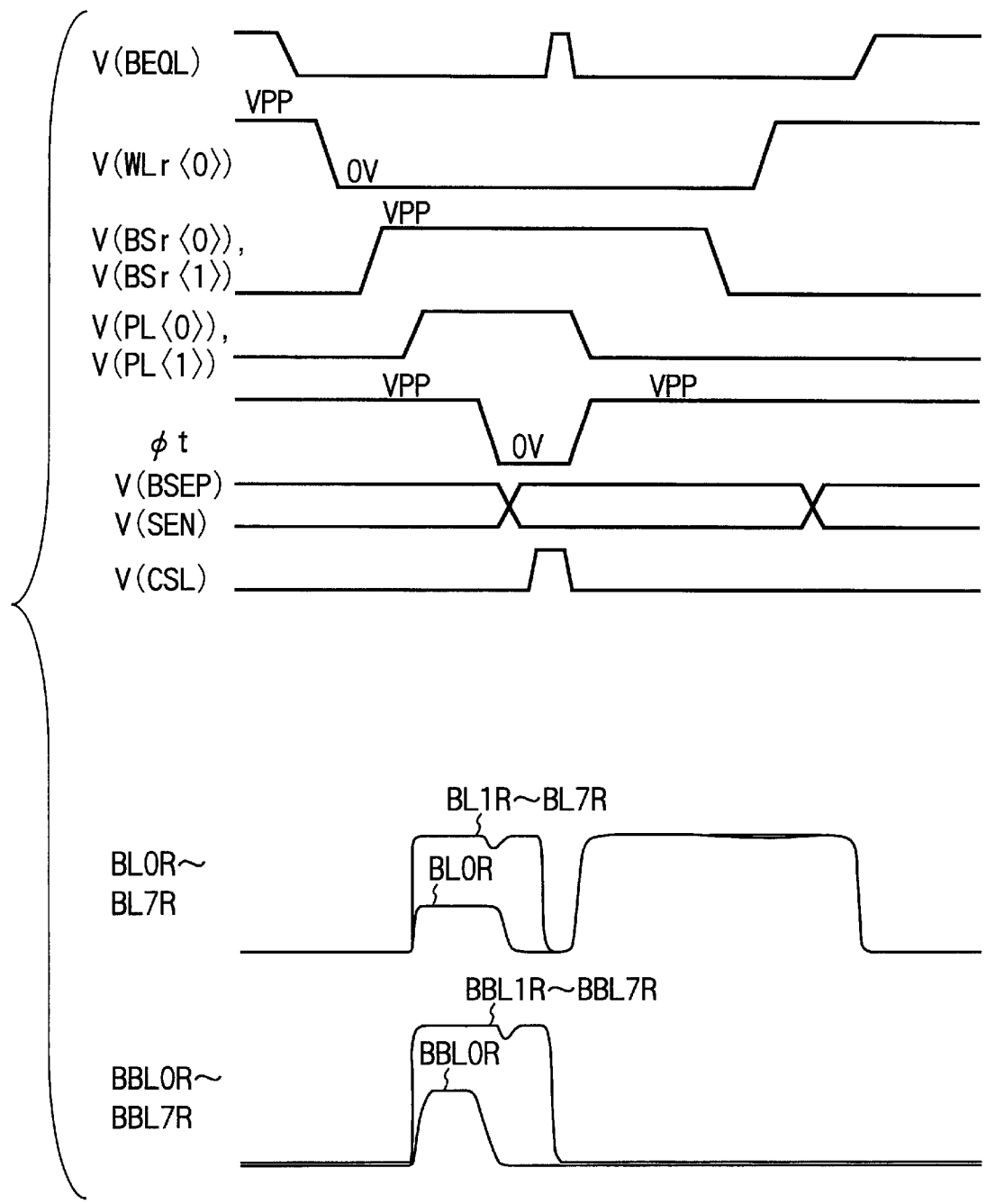
FIG. 6 is a timing chart showing a series of operations in the fifth embodiment of the invention of the chain type ferroelectric random access memory shown in FIG. 1 and a voltage wave figure showing detailed changes in voltage at the nodes BL0r–BL7r and BBL0r–BBL7r shown in FIG. 1.

FIG. 6 is a timing chart showing a series of operations of the chain type ferroelectric random access memory in FIG. 1 observed when it reads data or writes data from outside of the chip in a 2T2C-type memory cell by the single plate pulse driving method, and a voltage wave figure showing detailed changes in voltage at the nodes BL0R-BL7R of the cell transistors Tr0–Tr7 and the nodes BBL0r–BBL7r of the cell transistors BTr0–BTr7 shown in FIG. 1.

When selecting a word line, for example WLr<0>, it is assumed that the polarization with a direction from the plate line PL<0> to the bit line BL (namely, data "0") is written in the cell M0 on the BL side and the polarization with a direction from the bit line BL to the plate line PL<1> (namely, data "1") is written in the cell BM0 on the BBL side; and that data "0" is read from the memory cells M0 and data "1" is written from outside the chip.

The above operation is explained in detail below with reference to FIG. 6.

First, the equalization control signal V(BEQL) is lowered to "L" to release the equalization of the bit line pair BL and BBL to make them in a floating state to be ready to read data out to the bit line pair BL and BBL.

Next, the word line voltage V(WLr<0>) is lowered from VPP to 0V to be ready to apply voltage to both electrodes of the cell M0 and BM0. Then the block select signals V(BSr<0>) and V(BSr<1>) are raised from 0V to VPP to turn on the block selection transistors QB0 and QB1 and the plate line voltages V(PL<0>) and V(PL<1>) are raised from "L" to "H" to read data out to the bit line pair BL and BBL. To be more specific, the charge read out to the node BL0R of the cell transistor Tr0 and the charge read out to the node BBL0R of the cell transistor BTr0 are then read out to a pair of sense nodes of the sense amplifier SA, by elevating voltage on the plate line.

Next, the isolation control signal φt is lowered from VPP to 0V to turn off the isolation transistor QS to isolate the bit line pair BL and BBL between the equalization circuit EQ and the sense amplifier SA. Then the sense amplifier activation signal V(BSEP) is lowered and the sense amplifier activation signal V(SEN) is raised to perform sense amplification with the sense amplifier SA. During the above isolation, the column selection signal V(CSL) is raised to "H" to read the data stored in the sense amplifier SA to outside the chip and to write data from outside the chip to the sense amplifier SA.

On the other hand, as mentioned before, after the isolation transistor QS is turned off, the equalization control signal V(BEQL) is raised to "H" to equalize the bit line pair BL and BBL to 0V. By this operation, data "0" (namely, the polarization with a direction from the plate line to the bit line) is written in the cells M0 and BM0.

Next, the plate line voltages V(PL<0>) and V(PL<1>) are lowered to 0V and the equalization control signal V(BEQL) is lowered to "L" to release the equalization of the bit line pair BL and BBL to make them in the floating state again. Then the data latched by the sense amplifier SA is written in the bit line pair BL and BBL by raising the isolation control signal φt from 0V to VPP to turn on the isolation transistor QS.

Then if the voltage on the BL side in the sense amplifier area 10 is "H", the polarization with a direction from the bit line to the plate line is again written in the cell M0 on the BL side. However, if the voltage on the BL side in the sense amplifier area 10 is "L", the polarization with a direction from the plate line to the bit line, which was the data written for the first time during the power-down of the transistor QS, is continued to be written as it is.

In this example of the first embodiment of the inactivation, the data in the cell M0 is changed into the polarization with a direction from the bit line BL to the plate line PL<1> (namely, data "1") and the polarization with a direction from the plate line PL<0> to the bit line (namely, data "0") is continued to be written in the cell BM0 as it is.

Later, the block select signals V(BSr<0>) and V(BSr<1>) are lowered from "H" to "L" to turn off the block select transistors QB0 and QB1. Next, the word line WLr<0> is raised to VPP, the sense amplifier activation signals V(SEN) and V(BSEP) are deactivated, and the equalization control signal V(BEQL) is raised to "H".

This fifth example, as is the case with the first example, provides an improvement that disturb is reduced. A secondary effect is that the imbalance in capacitance in the cell capacitors is isolated from the sense amplifier SA. Further, since the parasitic capacitance CB in the bit lines is also isolated from the sense amplifier SA, the sensing operation is performed at a high speed.

Also the fifth example is featured by an advantage that operations can be performed at a higher speed than in the first example because the write of the data latched by the sense amplifier SA to the bit line pair BL and BBL starts before the plate line voltages V(PL<0>) and V(PL<1>) reach 0V completely.

In the above fifth example of the present invention, a series of read/write operations in 2T2C-type cells are shown. However, even in 1T1C-type cells, the read/write operations can be performed easily by selecting a cell and comparing the voltage read out from this cell to the bit line with a reference voltage separately generated (for example, a voltage read out from a reference cell to the counterpart bit line complementary to the above bit line).

SIXTH EXAMPLE

This example describes operations for the case in which the "L" level of the isolation control signal φt has a value different from that in the read and write cycles in the first example.

Figure 7:
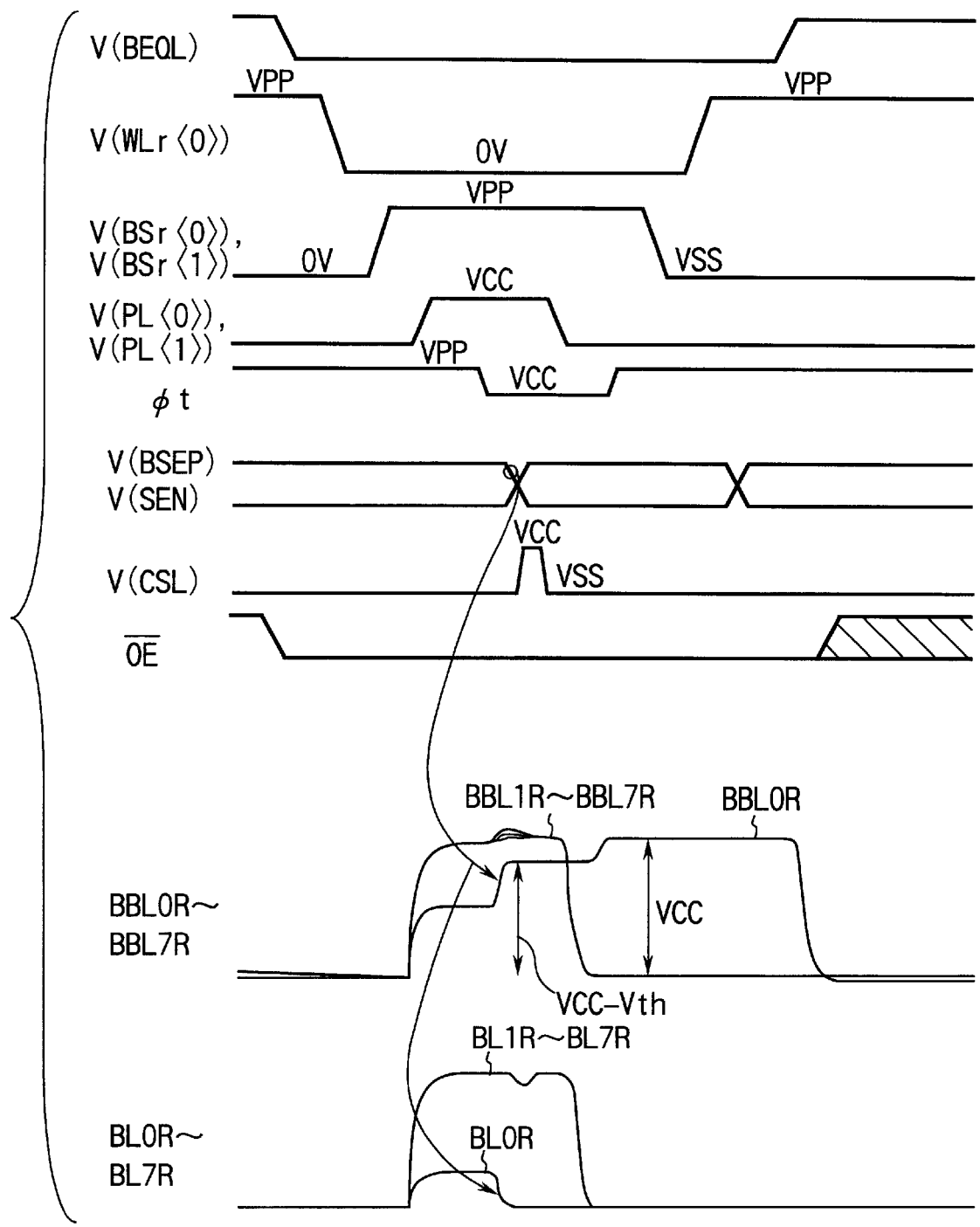
FIG. 7 is a timing chart showing a series of operations as a read cycle in the sixth embodiment of the invention of the chain type ferroelectric random access memory shown in FIG. 1 and a voltage wave figure showing detailed changes in voltage at the nodes BL0r–BL7r and BBL0r–BBL7r shown in FIG. 1.

FIG. 7 is a timing chart showing a series of read cycle operations of the chain type ferroelectric random access memory in FIG. 1 observed when it reads/rewrites data in a 2T2C-type memory cell by the single plate pulse driving method, and a voltage wave figure showing detailed changes in voltage at the nodes BL0R-BL7R of the cell transistors Tr0–Tr7 and the nodes BBL0r–BBL7r of the cell transistors BTr0–BTr7 shown in FIG. 1.

Figure 8:
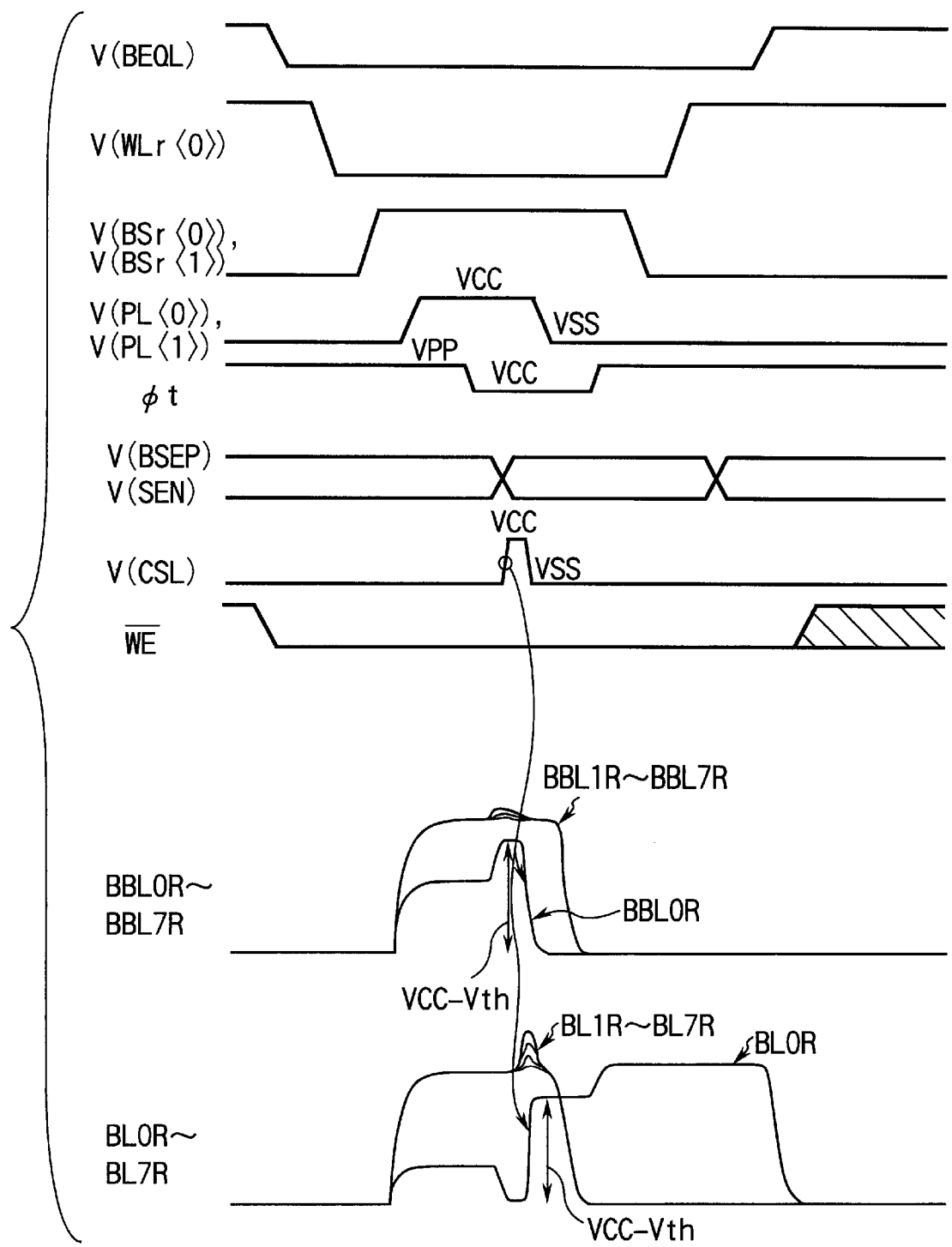
FIG. 8 is a timing chart showing a series of operations as a write cycle in the sixth embodiment of the invention of the chain type ferroelectric random access memory shown in FIG. 1 and a voltage wave figure showing detailed changes in voltage at the nodes BL0r–BL7r and BBL0r–BBL7r shown in FIG. 1.

FIG. 8 is a timing chart showing a series of operations of the chain type ferroelectric random access memory in FIG. 1 observed when it reads data and then writes data from outside of the chip to a 2T2C-type memory cell by the single plate pulse driving method, and a voltage wave figure showing detailed changes in voltage at the nodes BL0R–BL7R of the cell transistors Tr0–Tr7 and the nodes BBL0r–BBL7r of the cell transistors BTr0–BTr7 shown in FIG. 1.

First, referring to FIG. 7, the operations during a read cycle are specifically explained. When selecting a word line, for example WLr<0>, it is assumed that the polarization with a direction from the plate line PL<0> to the bit line BL (namely, data "0") is written in the cell M0 on the BL side and the polarization with a direction from the bit line BL to the plate line PL<1> (namely, data "1") is written in the cell BM0 on the BBL side; and that data "0" is read out from the memory cells M0 and then written back there.

First, after the output enable control signal/OE is active ("L") and data is ready to be sent out, the equalization control signal V(BEQL) is lowered to "L" to release the equalization of the bit line pair BL and BBL to make them in a floating state to be ready to read the data out to the bit line pair BL and BBL.

Next, the word line voltage V(WLr<0>) is lowered from VPP to 0V to be ready to apply voltage to both electrodes of the cell M0 and BM0. Then the block select signals V(BSr<0>) and V(BSr<1>) are raised from 0V to VPP to turn on the block selection transistors QB0 and QB1 and the plate line voltages V(PL<0>) and V(PL<1>) are raised from "L" to "H" to read data out to the bit line pair BL and BBL. The charge read out to the node BL0r of the cell transistor Tr0 and the charge read out to the node BBL0R of the cell transistor BTr0 are then read out to a pair of sense nodes of the sense amplifier SA.

Then the isolation control signal φt is lowered from VPP to a specific value lower than VPP (VCC, in this case). Then the sense amplifier activation signal V(BSEP) is lowered and the sense amplifier activation signal V(SEN) is raised to perform sense amplification with the sense amplifier SA. While the isolation control signal φt is lowered to VCC, the column selection signal V(CSL) is raised to read data stored in the sense amplifier SA to outside the chip.

It should be noted that although in the sixth example the isolation control signal φt was lowered from VPP to 0V and then the isolation transistor QS was completely turned off, the isolation control signal φt is lowered from VPP to only "VCC" in this example.

If the isolation control signal φt is lowered from VPP to VCC, the voltages at the nodes BBL1r–BBL7r of the cell transistors BTr1–BTr7 are lifted to "H", by elevation of the plate line voltages V(PL<0>) and V(PL<1>). As a result, the node BBL0r of the cell transistor BTr0 is lifted by the sense amplifier but just raised to VCC-Vth. Therefore, the amount of boost of the nodes BBL1r–BBL7r of the cell transistors BTr1–BTr7 becomes smaller than when the node BBL0r is lifted to VCC. As a result, the amount of disturb can be reduced.

Next, the plate line voltages V(PL<0>) and V(PL<1>) are lowered to 0V and the data latched by the sense amplifier SA is written in the bit line pair BL and BBL by turning the isolation control signal φt back to VPP to turn on the isolation transistor QS. If the voltage on the BL side in the sense amplifier area 10 is "H", the polarization with a direction from the bit line to the plate line is again written in the cell M0 on the BL side. However, if the voltage on the BL side in the sense amplifier area 10 is "L", the polarization with a direction from the plate line to the bit line, which was the data written for the first time, is continued to be written in the cell M0 on the BL side.

Namely, in this example, when the plate line voltages V(PL<0>) and V(PL<1>) are raised to "H", the voltage on the BL side in the sense amplifier area 10 (data "0") is written in the cell M0. On the other hand, when the voltage on the BBL side in the sense amplifier area 10 (data "1") is rewritten in the cell BM0, the time to restore the voltage at the node BBL0r to VCC is short and operations become faster because the voltage at the node BBL0r has already reached VCC-Vth when the isolation control signal φt returns to VPP.

Later, the block select signals V(BSr<0>) and V(BSr<1>) are lowered from VPP to 0V to turn off the block select transistors QB0 and QB1. Next, the word line voltage V(WLr<0>) is raised to VPP, the sense amplifier activation signals V(SEN) and V(BSEP) are deactivated, and the equalization control signal V(BEQL) is raised to "H".

Namely, in the read cycle in the sixth example, since the voltage at the node BBL0r of the cell transistor BTr0 is controlled to rise to just VCC-Vth. Also the isolation control signal φt is returned to VCC to raise the voltage at the node BBL0r to VCC after the plate line voltages V(PL<0>) and V(PL<1>) are lowered to 0V. As a result of this improvement, the amount of boost of the nodes BBL1r–BBL7r of the cell transistors BTr1–BTr7 becomes small and operations become faster with less disturb.

Next, referring to FIG. 8, the operations during a write cycle are specifically explained. When selecting a word line, for example WLr<0>, it is assumed that the polarization of a direction from the plate line PL<0> to the bit line BL (namely, data "0") is written in the cell M0 on the BL side and the polarization with a direction from the bit line BBL to the plate line PL<1> (namely, data "1") is written in the cell BM0 on the BBL side; and that data "0" and data "1" are read from the memory cells M0 and BM0, respectively, and data "0" and data "1" are written from outside the chip.

In this write cycle, data is read out and then written from outside the chip with the same timing as that upon rewriting.

First, after the write enable control signal/WE is active ("L") and data is ready to be written, the equalization control signal V(BEQL) is lowered to "L" to release the equalization of the bit line pair BL and BBL to make them in a floating state to be ready to read the data.

Next, the word line voltage V(WLr<0>) is lowered from "H" to "L" to be ready to apply voltage to both electrodes of the cell M0 and BM0. Then the block select signals V(BSr<0>) and V(BSr<1>) are raised from "L" to "H" to turn on the block selection transistors QB0 and QB1 and the plate line voltages V(PL<0>) and V(PL<1>) are raised from "L" to "H" to read data out to the bit line pair BL and BBL. The charge read out to the node BL0r of the cell transistor Tr0 and the charge read out to the node BBL0R of the cell transistor BTr0 are then read out to a pair of sense nodes of the sense amplifier SA.

Then the isolation control signal φt is lowered from VPP to a specific value lower than VPP (VCC, in this case). Then the sense amplifier activation signal V(BSEP) is lowered and the sense amplifier activation signal V(SEN) is raised to perform sense amplification with the sense amplifier SA. While the isolation control signal φt is lowered to VCC, the column selection signal V(CSL) is raised to write data to the sense amplifier SA from outside the chip.

If the isolation control signal φt is lowered from VPP to VCC, the voltages at the nodes BBL1r–BBL7r of the cell transistors BTr1–BTr7 are lifted to "H" by the elevation of the plate line voltages V(PL<0>) and V(PL<1>). As a result, the voltage at the node BBL0r of the cell transistor BTr0 is lifted by the sense amplifier but to just VCC-Vth.

Therefore, the amount of boost of the nodes BBL1r–BBL7r of the cell transistors BTr1–BTr7 becomes smaller than when the node BBL0r is lifted to VCC. As a result, the amount of disturb can be reduced.

The amount of disturb against the cell transistors Tr1–Tr7 is further reduced, compared with that against the cell transistors BTr1–BTr7, and a further speedup in operation can be attained.

During a read operation of cell data, the voltages at the nodes BBL1r–BBL7r of the cell transistors BTr1–BTr7 stand at "H" as mentioned above. After the voltage at the node BL0r is once lowered to 0V, it is lifted to "H" by the sense amplifier but just up to VCC-Vth. Compared with the case in which it is lifted to VCC, the amount of boost becomes smaller and the amount of disturb becomes also smaller. Further, since the voltage at BL0r has reached VCC-Vth when the isolation control signal φt is returned to VPP, the time to VCC is shortened and thereby operations become fast.

Next, the plate line voltages V(PL<0>) and V(PL<1>) are lowered to 0V and the data latched by the sense amplifier SA is written in the cells M0 and BM0 through the bit line pair BL and BBL by turning the isolation control signal φt back to VPP to turn on the isolation transistor QS.

Namely, in this example, when the plate line voltages V(PL<0>) and V(PL<1>) are raised to "H", the voltage on the BBL side in the sense amplifier area 10 (data "0") is written in the cell BM0.

Later, the block select signals V(BSr<0>) and V(BSr<1>) are lowered from VPP to 0V to turn off the block select transistors QB0 and QB1. Next, the word line voltage V(WLr<0>) is raised to VPP, the sense amplifier activation signals V(SEN) and V(BSEP) are deactivated, and the equalization control signal V(BEQL) is raised to "H".

Namely, in the read cycle in the sixth example, since the voltage at the node BBL0r of the cell transistor BTr0 is controlled to rise to just VCC-Vth. Also the isolation control signal φt is returned to VCC to raise the voltage at the node BBL0r to VCC after the plate line voltages V(PL<0>) and V(PL<1>) are lowered to 0V. As a result of this improvement, the amount of boost of the nodes BBL1r–BBL7r of the cell transistors BTr1–BTr7 and the amount of boost of the nodes BL1r–BL7r of the cell transistors Tr1–Tr7 becomes small, and operations become faster with less disturb. In particular at the cell transistors Tr1–Tr7, the amount of disturb is remarkably reduced.

Thus the amount of disturb can be reduced in the sixth example as is the case with the first and the second examples. Furthermore, operations becomes faster than those in the first and the second examples because the time to VCC is shortened at BL0r or BBL0r when the isolation control signal φt is returned to VPP.

In the above sixth example of the present invention, a series of read/write operations in 2T2C-type cells are shown. However, even in 1T1C-type cells, the read/write operations can be performed easily by selecting a cell and comparing the voltage read out from this cell to the bit line with a reference voltage separately generated (for example, a voltage read out from a reference cell to the counterpart bit line complementary to the above bit line).

SEVENTH EXAMPLE

In the sixth example, the isolation control signal φt was fixed at a specific value at around the moment that the plate line voltage fell while the amplification by the sense amplifier was performed. However, in this example, operations are clearly divided into those required to reduce disturb and the others.

Figure 9:
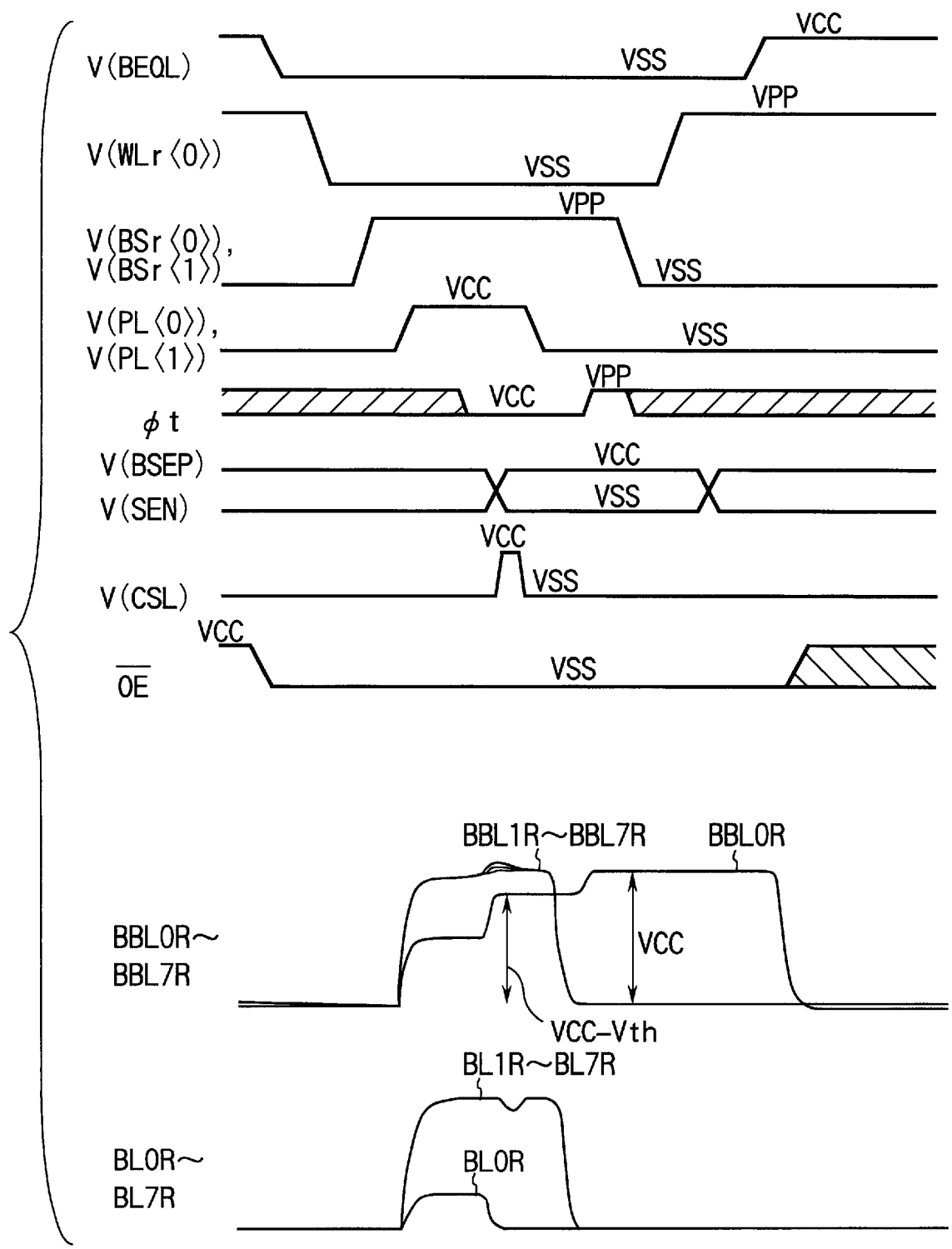
FIG. 9 is a timing chart showing a series of operations as a read cycle in the seventh embodiment of the invention of the chain type ferroelectric random access memory shown in FIG. 1 and a voltage wave figure showing detailed changes in voltage at the nodes BL0r–BL7r and BBL0r–BBL7r shown in FIG. 1.

With reference to FIG. 7, FIG. 9 shows operations during the read cycle almost equal to those shown in the sixth example and the basic operations are the same as those in the sixth example. However, the "don't care" period of the voltage of the isolation control signal φt is shown by shaded areas.

The voltage of the isolation control signal φt can be VPP or a smaller value (VCC in this example) as long as signal is conveyed from the memory cell to the sense amplifier. It is possible to shorten access time if VCC is controlled to be constant before and after sense amplification.

After data is rewritten in the memory cell, the voltage of the isolation control signal φt is lowered from VPP to VCC.

Figure 10:
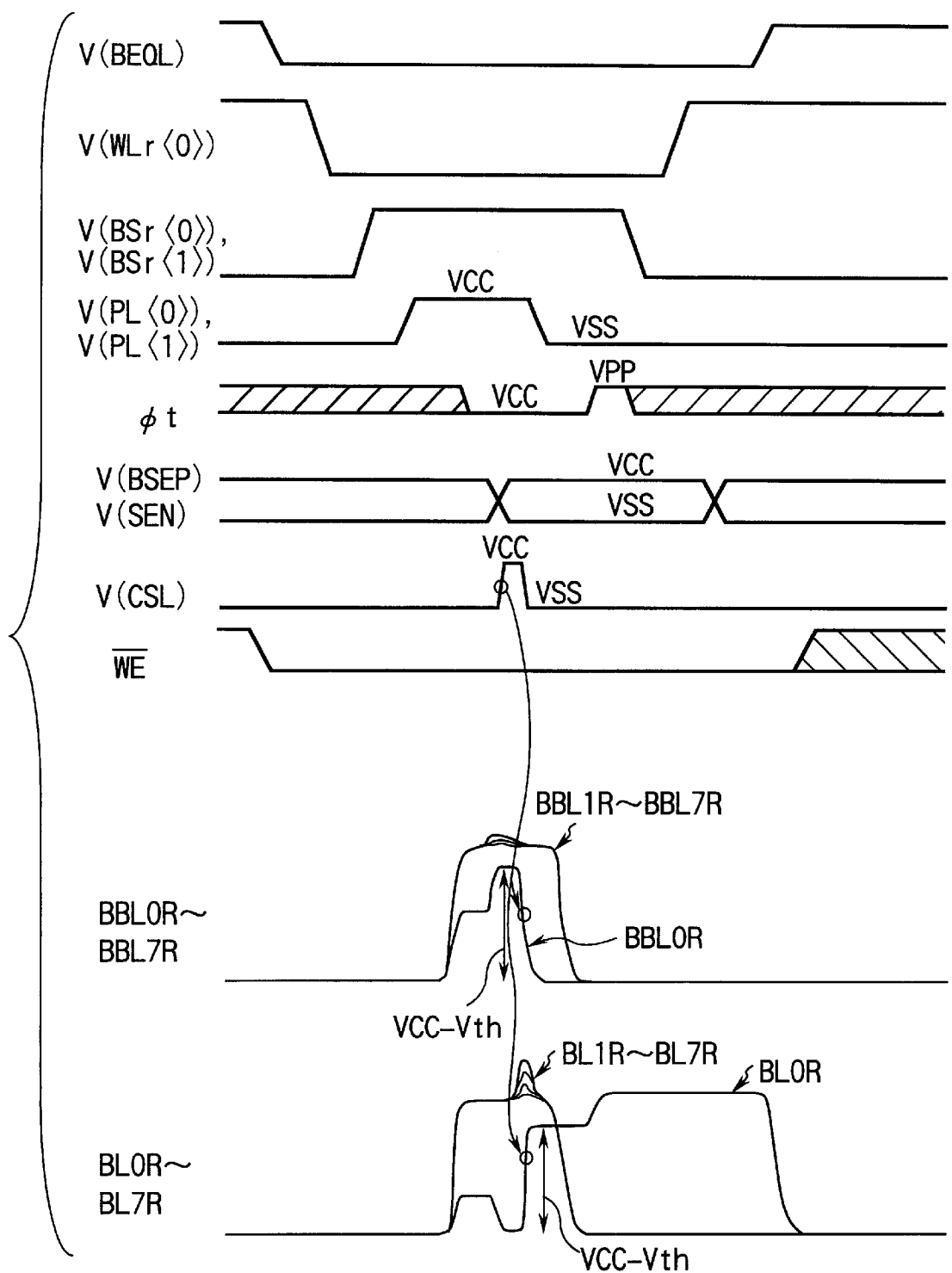
FIG. 10 is a timing chart showing a series of operations as a write cycle in the seventh embodiment of the invention of the chain type ferroelectric random access memory shown in FIG. 1 and a voltage wave figure showing detailed changes in voltage at the nodes BL0r–BL7r and BBL0r–BBL7r shown in FIG. 1.

With reference to FIG. 8, FIG. 10 shows operations during the read cycle almost equal to those shown in the sixth example. The basic operations are the same as those in the sixth example. However, the "don't care" period of the voltage of the isolation control signal φt exists, as shown by shaded areas.

The voltage of the isolation control signal φt can be VPP or a smaller value (VCC in this example) as long as signal is conveyed from the memory cell to the sense amplifier. It is possible to shorten access time if VCC is controlled to be constant before and after the sense amplification.

After data is rewritten in the memory cell, the voltage of the isolation control signal φt is lowered from VPP to VCC.

Therefore, the seventh example provides a reduction of disturb similar to that obtained in the sixth example and a further speedup of access.

In the above seventh example of the present invention, a series of read/write operations in 2T2C-type cells are shown. However, even in 1T1C-type cells, the read/write operations can be performed easily by selecting a cell and comparing the voltage read out from this cell to the bit line with a reference voltage separately generated (for example, a voltage read out from a reference cell to the counterpart bit line complementary to the above bit line).

EIGHTH EXAMPLE

In the first-seventh examples, the voltage of the isolation control signal φt was changed. In this example, however, the voltage of the isolation control signal φt is fixed at a certain value such as VPP or the isolation control transistor QS is removed.

Figure 11:
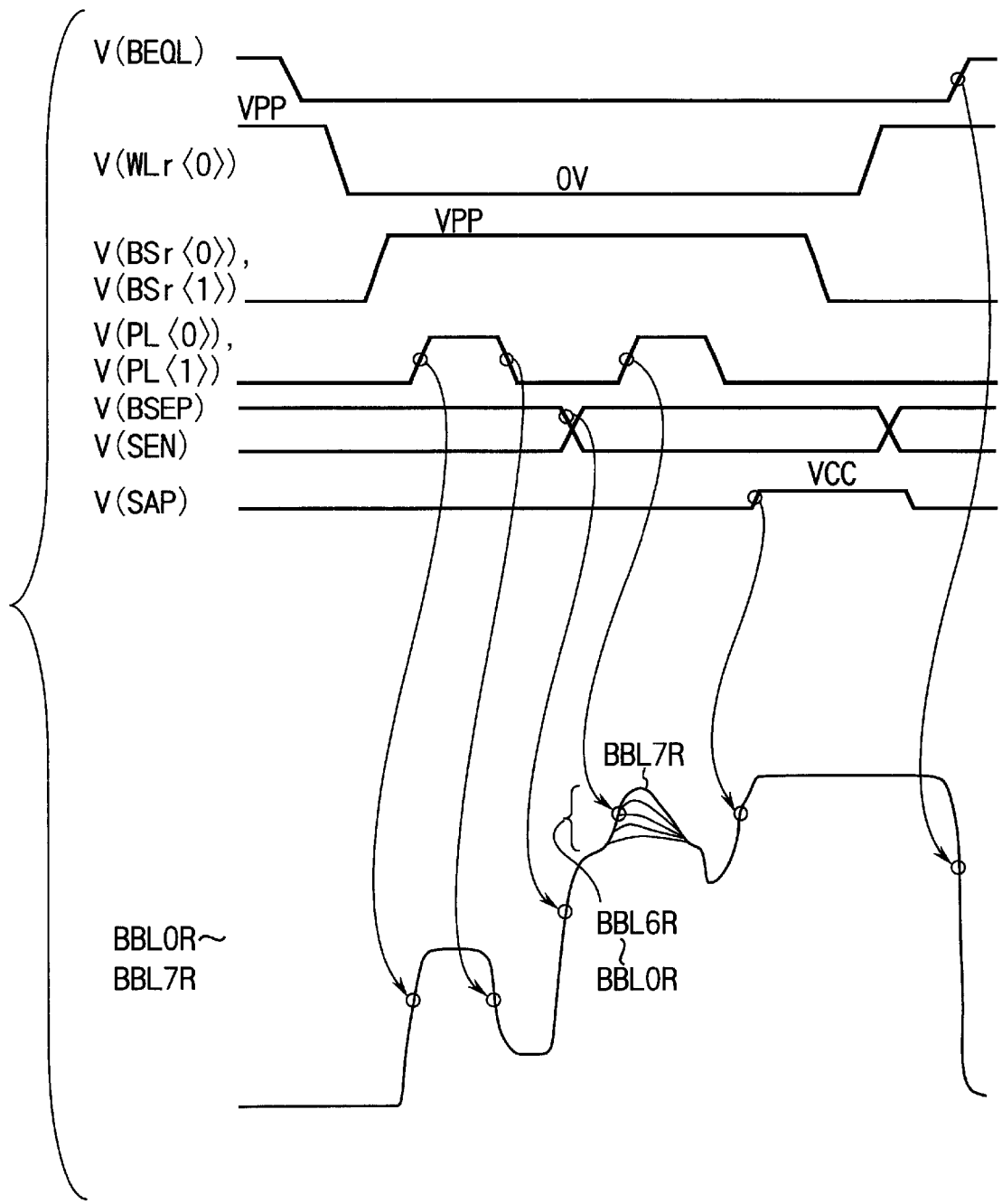
FIG. 11 is a timing chart showing a series of operations in the eighth embodiment of the invention of the chain type ferroelectric random access memory shown in FIG. 1 and a voltage wave figure showing detailed changes in voltage at the nodes BL0r–BL7r and BBL0r–BBL7r shown in FIG. 1.

FIG. 11 is a timing chart showing a series of operations of the chain type ferroelectric random access memory in FIG. 1 observed when it reads data and then writes data from outside of the chip in the 2T2C-type memory cell by the double plate pulse driving method, and a voltage wave figure showing detailed changes in voltage at the nodes BBL0r–BBL7r of the cell transistors BTr0–BTr7 shown in FIG. 1.

When selecting a word line, for example WLr<7>, it is assumed that the polarization with a direction from the plate line PL<0> to the bit line BL (namely, data "0") is written in the cell M7 on the BL side and the polarization with a direction from the bit line BBL to the plate line PL<1> (namely, data "1") is written in the cell BM7 on the BBL side; and that data "0" is read from the memory cell M7 and then written from outside the chip.

The above operation is explained in detail below with reference to FIG. 11.

First, the equalization control signal V(BEQL) is lowered to "L" to release the equalization of the bit line pair BL and BBL to make them in a floating state and the block select signals V(BSr<0>) and V(BSr<1>) are raised from 0V to VPP to turn on the transistors QB0 and QB1 to be ready to read data. The voltage of the isolation control signal φt is fixed at a constant value such as VPP.

Next, the word line voltage V(WLr<7>)) is lowered from VPP to 0V to be ready to apply voltage to both electrodes of the cells M7 and BM7. Then the block select signals V(BSr<0>) and V(BSr<1>) are raised from 0V to VPP to turn on the block select transistors QB0 and QB1. Later, the plate line voltages V(PL<0>) and V(PL<1>) are driven from "L" to "H" to "L" with pulses to read only the difference in polarization as data out to the bit line pair BL and BBL.

Next, the sense amplifier activation signal V(BSEP) is lowered and the sense amplifier activation signal V(SEN) is raised to amplify signal by the sense amplifier SA. It should be noted that the supply power voltage of the sense amplifier SA is less than VCC. By raising the column select signal V(CSL) to "H", the data on the side of the sense amplifier SA is read out to outside the chip and written to the sense amplifier SA from outside the chip.

Later, the plate line voltages V(PL<0>) and V(PL<1>) are driven from "L" to "H" to "L" with pulses to rewrite data in the cells M7 and BM7. After the plate line voltages V(PL<0>) and V(PL<1>) become "L" (0V), the supply power voltage V(SAP) of the sense amplifier SA is raised from the voltage lower than VCC to VCC.

Next, the word line voltage V(WLr<7>) is raised to VPP, the block select signals V(BSr<0>) and V(BSr<1>) are lowered to 0V, the sense amplifier activation signals V(SEN) and V(BSEP) are deactivated, and the equalization control signal V(BEQL) is raised to "H".

Namely, in the eighth example, the supply power voltage V(SAP) of the sense amplifier SA is lowered than VCC during the "H" state of the plate line voltages V(PL<0>) and V(PL<1>), and the supply power voltage V(SAP) of the sense amplifier SA is raised to VCC after the plate line voltages V(PL<0>) and V(PL<1>) have fallen to 0V.

Disturb can thus be reduced by controlling the supply power voltage V(SAP) of the sense amplifier SA during the amplification by the sense amplifier.

In the above eighth example of the present invention, a series of read/write operations in 2T2C-type cells are shown. However, even in 1T1C-type cells, the read/write operations can be performed easily by selecting a cell and comparing the voltage read out from this cell to the bit line with a reference voltage separately generated (for example, a voltage read out from a reference cell to the counterpart bit line complementary to the above bit line).

Now the first embodiment of the present invention has been summarized as follows.

It is assumed here that after the sense amplifier is activated, the plate lines are driven by the double plate pulse driving method to rewrite data.

In the operation of reading data "1" in the conventional ferroelectric random access memory, the bit line voltage is lifted to the supply power voltage of the sense amplifier and then further driven by the plate line. As a result, the node inside the memory cell unit is boosted and the transfer gate is turned off because of the bias effect in the board.

Since the plate line voltage rises further under the above state, the increment of charge given after the turn-off of the transfer gate is shared by the capacitance existing between the plate line and the cell transfer gate. As a result, a voltage bias arises at both electrodes of each cell transfer gate, resulting in a decrease in the accumulated charge of polarization in each cell capacitor and the occurrence of disturb.

To solve this problem, in the chain type ferroelectric random access memory in the first example of the present invention, the isolation transistor QS is inserted between the cell array and the sense amplifier SA, and the equalization circuit EQ to equalize the bit line pair BL and BBL to the ground voltage with a specific timing is inserted between the above isolation transistor QS and the cell array. Then it becomes possible to prevent the disturb.

In more specific, the isolation transistor QS is turned off to protect readout data and then the equalization circuit EQ is turned on to perform a second drive of the plate line in order to write data "0" in the cell first.

Next, the plate line is lowered to 0V and the isolation transistor QS is turned on after the equalization circuit EQ is turned off. Then the data which is latched by the sense amplifier SA or entered from outside the chip is written in the cell. At this time, if the data latched by the sense amplifier SA is "1", the data "0" in the cell is replaced by "1".

The above operations pose no problem of disturb which is observed in the conventional chain type ferroelectric random access memory because the plate line and the sense amplifier do not become "H" at the same time.

<Second Embodiment>

In the chain type ferroelectric random access memory described in the first embodiment, the isolation transistor QS was inserted between the equalization circuit EQ and the sense amplifier SA, and the isolation transistor QS was turned off before sense amplification and later turned on after the plate line voltage was lowered to 0V to write or rewrite data in memory cells.

The following is the explanation of a chain type ferroelectric random access memory according to the second embodiment in which the equalization circuit EQ and the sense amplifier SA are electrically isolated in a different way.

Figure 12:
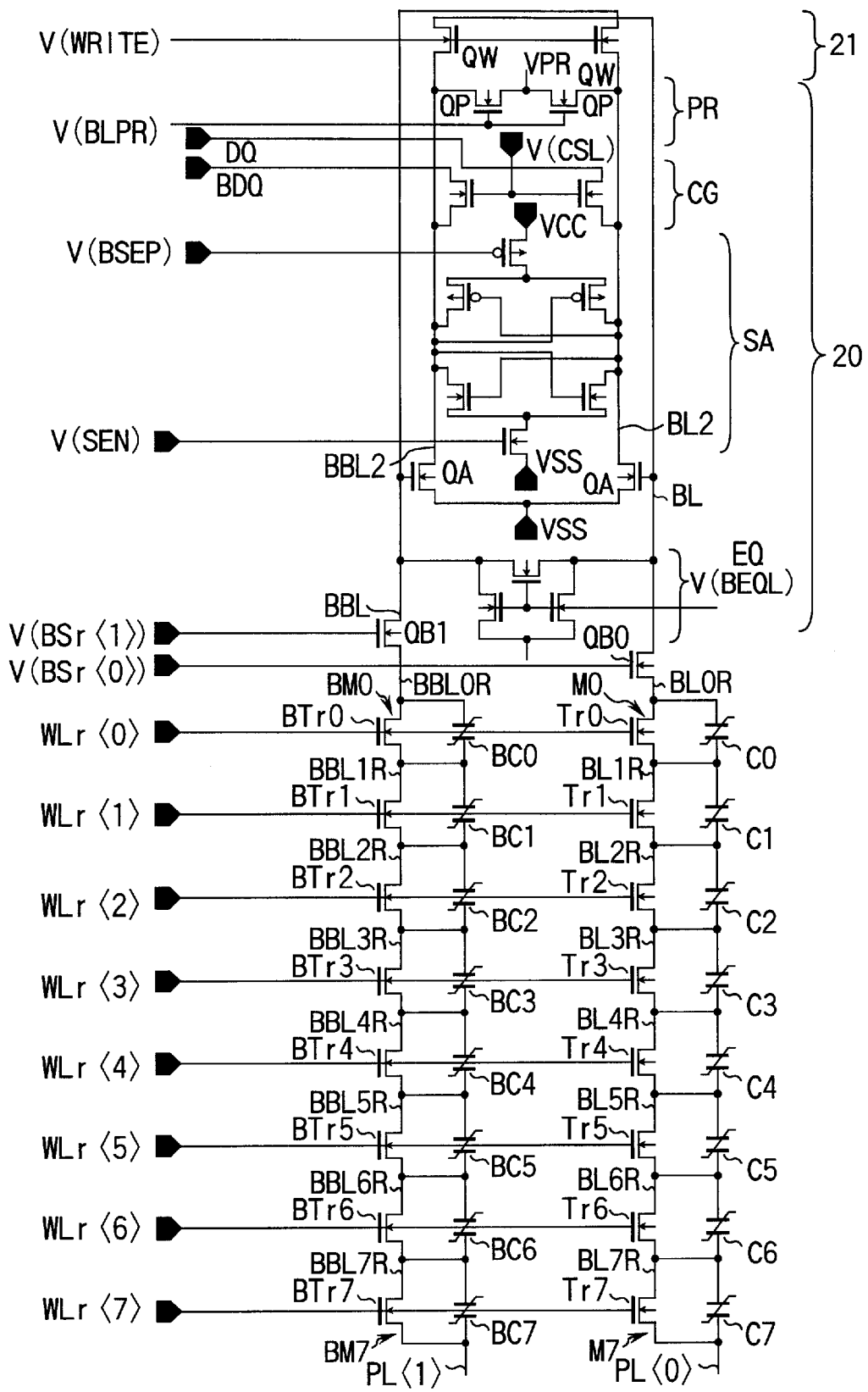
FIG. 12 is a schematic representation of part of the electric circuit of a chain type ferroelectric random access memory according to the second embodiment of the invention.

FIG. 12 is a schematic representation of part of the electric circuit of a chain type ferroelectric random access memory according to the second embodiment of the invention and more specifically part of circuit connection of the memory cell array and its peripheral circuit.

The architecture of the chain type ferroelectric random access memory according to the second embodiment is different from that of the chain type ferroelectric random access memory according to the first embodiment: the isolation transistor QS is omitted; and the sense amplifier area 20 and the write circuit 21 have difference architecture. The other parts are the same as those of the chain type ferroelectric random access memory according to the first embodiment, being denoted as the same way as in FIG. 1.

Namely, in the sense amplifier area 20, the bit line pair BL and BBL are electrically connected to the equalization circuit EQ and the control electrodes of the transistor for sense input (gate of the NMOS transistor QA, in this case). The source of this transistor QA is electrically connected to the ground voltage VSS and its drain to the second bit line pair BL2 and BBL2. This second bit line BL2 and BBL2 are electrically connected to the sense amplifier SA, the column selection gate CG and the bit line precharge circuit PR.

The difference from the first embodiment is a write circuit 21 inserted between the second bit line pair BL2 and BBL2 and the aforementioned bit line pair BL and BBL.

The bit line precharge circuit PR has NMOS transistors (QP) each of which is inserted between the bit line precharge line to which a bit line precharge voltage VPR is applied and the second bit line BL2 and between the bit line precharge line and the second precharge line BBL2. Those NMOS transistors are controlled by a bit line precharge control signal V(BLPR).

The write circuit 21 consists of NMOS transistors (QW) each of which is inserted between the bit line BL and the second bit line BL2 and between the bit line BBL and the second bit line BBL2. The QW transistors are those for writing data and controlled by a write control signal V(WRITE).

The operation of the chain type ferroelectric random access memory according to the second embodiment is different from that of the chain type ferroelectric random access memory according to the first embodiment as follow. The second bit line pair BL2 and BBL2 are precharged to the fixed voltage VPR by the bit line precharge circuit PR, and the voltages read out to the bit line pair BL and BBL from the selected cell are received directly at the gates of the transistors (QA). After they are amplified by the sense amplifier SA electrically connected to the second bit line pair BL2 and BBL2, the write circuit 21 is turned on to connect the bit line pair BL and BBL and the second bit line pair BL2 and BBL2 and then the read out voltages are written back in the selected cell.

NINTH EXAMPLE

Figure 13:
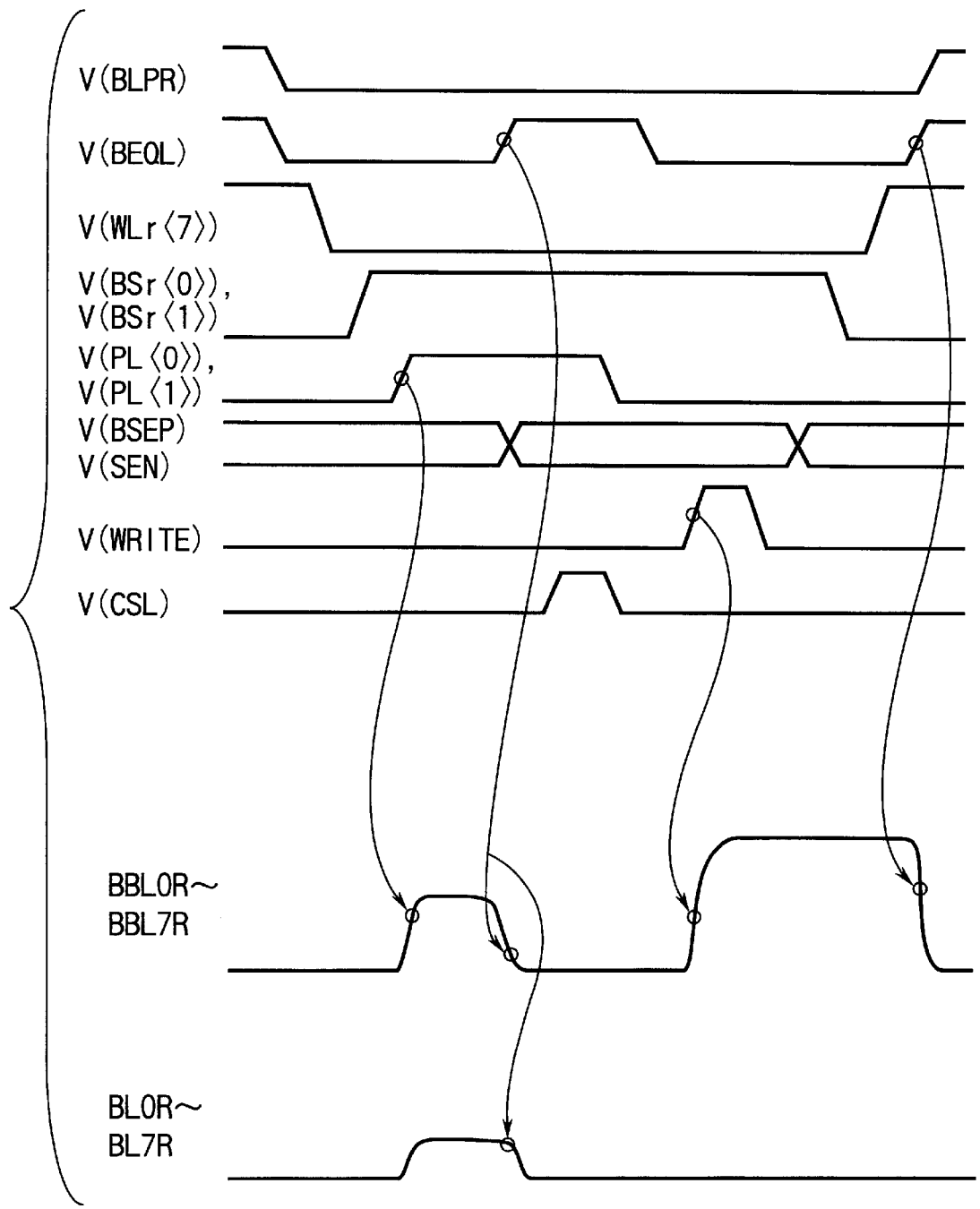
FIG. 13 is a timing chart showing a series of operations in the ninth embodiment of the invention of the chain type ferroelectric random access memory shown in FIG. 12 and a voltage wave figure showing detailed changes in voltage at the nodes BL0r–BL7r and BBL0r–BBL7r shown in FIG. 1.

FIG. 13 is a timing chart showing a series of operations of the chain type ferroelectric random access memory in FIG. 12 according to the second embodiment observed when it reads data and writes data from outside of the chip in a 2T2C-type memory cell by the single plate pulse driving method, and a voltage wave figure showing detailed changes in voltage at the nodes BL0R–BL7R of the cell transistors Tr0–Tr7 and the nodes BBL0r–BBL7r of the cell transistors BTr0–BTr7 shown in FIG. 12.

When selecting a word line, for example WLr<7>, it is assumed that the polarization with a direction from the plate line PL<0> to the bit line BL (namely, data "0") is written in the cell M7 on the BL side and the polarization with a direction from the bit line BBL to the plate line PL<1> (namely, data "1") is written in the cell BM7 on the BBL side; and that data "0" is read from the memory cell M7.

The above operation is explained in detail below with reference to FIG. 13.

First, the equalization control signal V(BEQL) is lowered to "L" to release the equalization of the bit line pair BL and BBL to 0V to make them in a floating state to be ready to read data out to the bit line pair BL and BBL. Also the bit line precharge control signal V(BLPR) is lowered to "L" to release the precharge of the bit line pair BL2 and BBL2 to be ready to convey the data read out to the bit line pair BL and BBL to the sense amplifier SA automatically.

Next, the word line voltage V(WLr<7>) is lowered from VPP to 0V to be ready to apply voltage to both electrodes of the cells M7 and BM7. Then the block select signals V(BSr<0>) and V(BSr<1>) are raised from 0V to VPP to turn on the block selection transistors QB0 and QB1 and the plate line voltages V(PL<0>) and V(PL<1>) are raised from "L" to "H" to read data out to the bit line pair BL and BBL.

Under the above state, the write control signal V(WRITE) is 0V and the sense amplifier SA is still isolated from the cell arrays. During this state, the sense amplifier activation signal V(BSEP) is lowered, and the sense amplifier activation signal V(SEN) is raised to perform sense amplification with the sense amplifier SA.

During the above isolation, the column select signal V(CSL) is raised to "H" and data stored on the side of the sense amplifier SA is read to outside the chip.

On the other hand, almost at the same time as the above sense amplification, the equalization control signal V(BEQL) is raised to "H" to equalize the bit line pair BL2 and BBL2 to 0V. Then since the bit line pair BL and BBL are 0V and the plate line voltages V(PL<0>) and V(PL<1>) are "H", data "0" (namely, the polarization with a direction from the plate line to the bit line) is written in the cells M7 and BM7.

Next, the plate line voltages V(PL<0>) and V(PL<1>) are lowered to 0V, and the equalization control signal V(BEQL) is also lowered to "L" to release the equalization of the bit line pair BL and BBL and to make the second bit line pair BL2 and BBL2 in a floating state again. Later the write control signal V(WRITE) is raised to "H" to write the data latched in the sense amplifier SA in the bit line pair BL and BBL.

If the voltage on the BL2 side in the sense amplifier area 20 is "H", the polarization with a direction from the bit line to the plate line is again written in the cell M7 on the BL side. However, if the voltage on the BL2 side in the sense amplifier area 20 is "L", the polarization with a direction from the plate line to the bit line, which was the data written for the first time, is continued to be written in the cell M7.

Namely, in this example, when the plate line voltages V(PL<0>) and V(PL<1>) are raised, while the bit line pair BL and BBL are equalized to 0V, data "0" is written in the cells M7 and BM7. Later, while the plate line voltages V(PL<0>) and V(PL<1>) are lowered to 0V, data "1" is written in the cell BM7 from the sense amplifier SA.

Next, the word line voltage V(WLr<0>) is raised to VPP, the sense amplifier activation signals V(SEN) and V(BSEP) are deactivated, and the equalization control signal V(BEQL) is raised to "H".

Therefore, in the ninth example, since both plate line voltage and bit line voltage do not become "H" at the same time, such disturb does not take place that was referred to in the third example of the conventional operation.

Also there is an secondary advantage that since the data read out to the bit line pair is received at the gate of the transistor QA, imbalance in capacitance in the cell capacitors, if any, is isolated from the sense amplifier SA. The large parasitic capacitance CB in the bit lines is also isolated from the sense amplifier SA and the sensing operation is performed at a high speed.

The chain type ferroelectric random access memory according to the second embodiment, compared with that according to the first embodiment, has a more complex structure in the sense amplifier area 20 (needed patterning area becomes large). However, in this example, compared with the fourth example of a chain type ferroelectric random access memory according to the first embodiment, the clocking operation of the isolation transistor QS to turn it off by the isolation control signal φt is not required during the pulse drive of the plate line and the sense amplification. As a result, an associated speedup of operation is possible.

<Third Embodiment>

Figure 14:
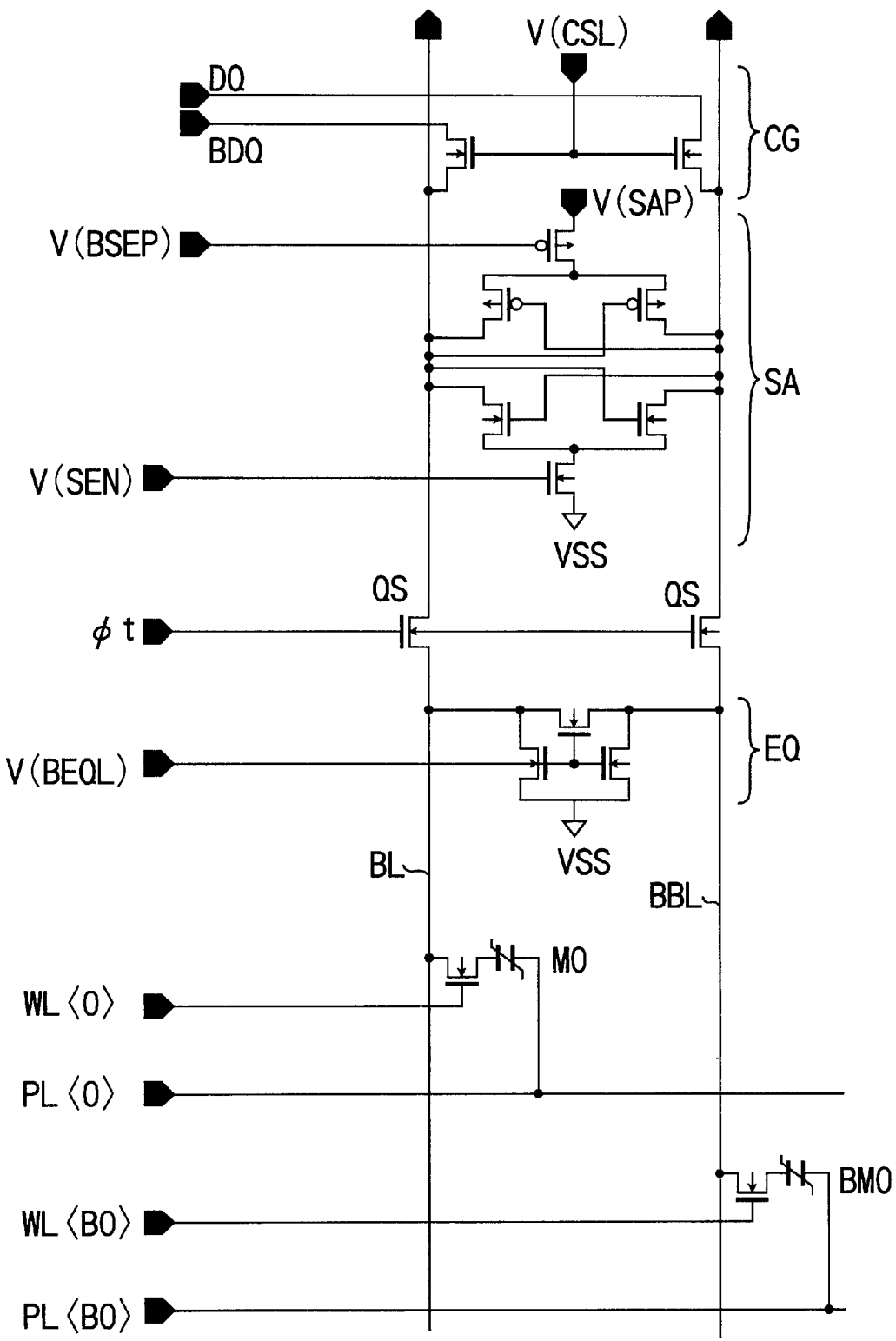
FIG. 14 is a schematic representation of part of the electric circuit of a chain type ferroelectric random access memory according to the third embodiment of the invention.

The ferroelectric random access memory according to the third embodiment has the conventional type of memory cells as shown in FIG. 14. Compared with the conventional ferroelectric random access memory, it has almost the same structure except that an NMOS transistor QS is inserted serially between an equalization circuit EQ and a sense amplifier SA each in the bit line BL and BBL.

TENTH EXAMPLE

FIG. 14 is a schematic representation of part of the electric circuit of a chain type ferroelectric random access memory according to the tenth example and more specifically part of circuit connection of the memory cell array and its peripheral circuit.

FIG. 14 shows lines of memory cells each of which consists of a cell transistor and a ferroelectric capacitor connected in series in the memory cell array area. In this embodiment, two memory cells M0 and BM0 are shown as examples and the transistors in those memory cells M0 and BM0 are denoted as Tr0 and BTr0 and the capacitors as C0 and BC0. One of the electrodes of each capacitor C0 and BC0 is electrically connected to the plate line PL<0> and PL<B0>, respectively; the gate of each transistor Tr0 and BTr0 is electrically connected to the word line WLr<0> and WLr<B0>; and the other electrode of each transistor Tr0 and BTr0 is electrically connected to the bit line BL and its complementary line BBL.

Further, an equalization circuit EQ, a flip-flop type sense amplifier SA, and a column selection gate CG are electrically connected to the bit line pair BL and BBL. In each bit line BL and BBL, an isolation transistor QS is serially inserted between the equalization circuit EQ and the sense amplifier SA.

The above equalization circuit is controlled by an equalization control signal V(BEQL), the sense amplifier SA by sense amplifier control signals V(SEN) and V(BSEP), the column selection gate CG by a column select signal V(CSL) and the isolation control transistor QS by an isolation control signal φt.

Figure 15:
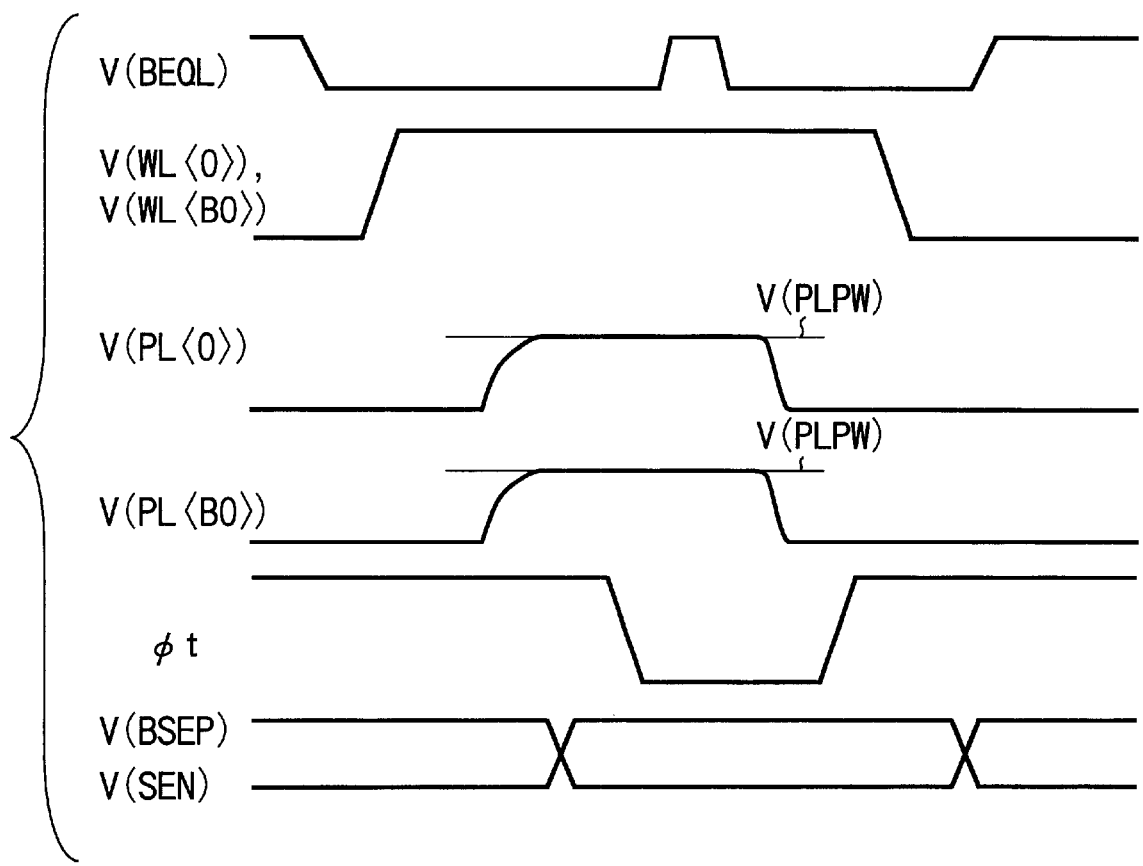
FIG. 15 is a timing chart showing a series of operations in the tenth embodiment of the invention of the chain type ferroelectric random access memory shown in FIG. 14.

FIG. 15 is a timing chart showing how the chain type ferroelectric random access memory having 2T2C-type cells in FIG. 14 operates when it selects the word lines WLr<0> and WLr<B0> to select the cell M0 and BM0, reads data "1" from the M0 and data "0" from the cell BM0, and then writes the data back there by the single plate pulse driving method.

The above operation is explained in detail below with reference to FIG. 15. It is assumed that the polarization with a direction from the bit line to the plate line (data "1") is written in the cell M0 and the polarization with a direction from the plate line to the bit line (data "0") is written in the cell BM0.

First, the equalization of the bit lines BL and BBL is released by reducing the equalization control signal V(BEQL) to be ready to read data. Next, the word lines WLr<0> and WLr<B0> are selected by elevating the word line voltages V(WLr<0>) and V(WLr<B0>) from 0V to VPP. Then the charges of polarization in the memory cells M0 and BM0 are read out to the bit line pair BL and BBL, by lifting the plate line voltage V(PL<0>) and V(PL<B0>) from 0V to V(PLPW).

Next, the isolation control signal φt is lowered from VPP to 0V to turn off the isolation transistor QS. The sense amplifier activation signal V(SEN) is raised and the sense amplifier activation signal V(BSEP) is lowered to perform sense amplification. Then the column selection signal V(CSL) is raised to turn on the column selection gate CG to read out data to outside the chip.

Next, the equalization control signal V(BEQL) is raised to turn on the equalization circuit EQ and data "0" is written in the cells M0 and BM0 by equalizing the bit line pair BL and BBL to 0V.

Next, the plate line voltages V(PL<0>) and V(PL<B0>) are lowered to 0V and the data latched by the sense amplifier SA is rewritten in the cells M0 and BM0 by turning the isolation control signal φt back to "H" from "L" to turn on the isolation transistor QS again.

When the sense amplification of data "1", which is read out from the cell M0 while the plate line voltages V(PL<0>) and V(PL<B0>) become V(PLPW), the isolation transistor QS is turned off and the capacitance coupling between the bit line BL and the plate line PL<0> is prevented. Therefore, the plate line voltage V(PL<0>) is not raised to a voltage higher than V(PLPW).

Later, the word line WL<0> and WL<B0> are made non-selective by reducing the word line control voltages V(WLr<0>) and V(WLr<B0>) from VPP to 0V. Finally, the sense amplifier activation signal V(SEN) is lowered and the sense amplifier signal V(BSEP) is raised to deactivate the sense amplifier SA.

It is possible to control the voltage at the gate of the NMOS transistor QS for isolation as shown in the first, second, fifth-eighth examples for the first embodiment.

<Fourth Embodiment>

Figure 16:
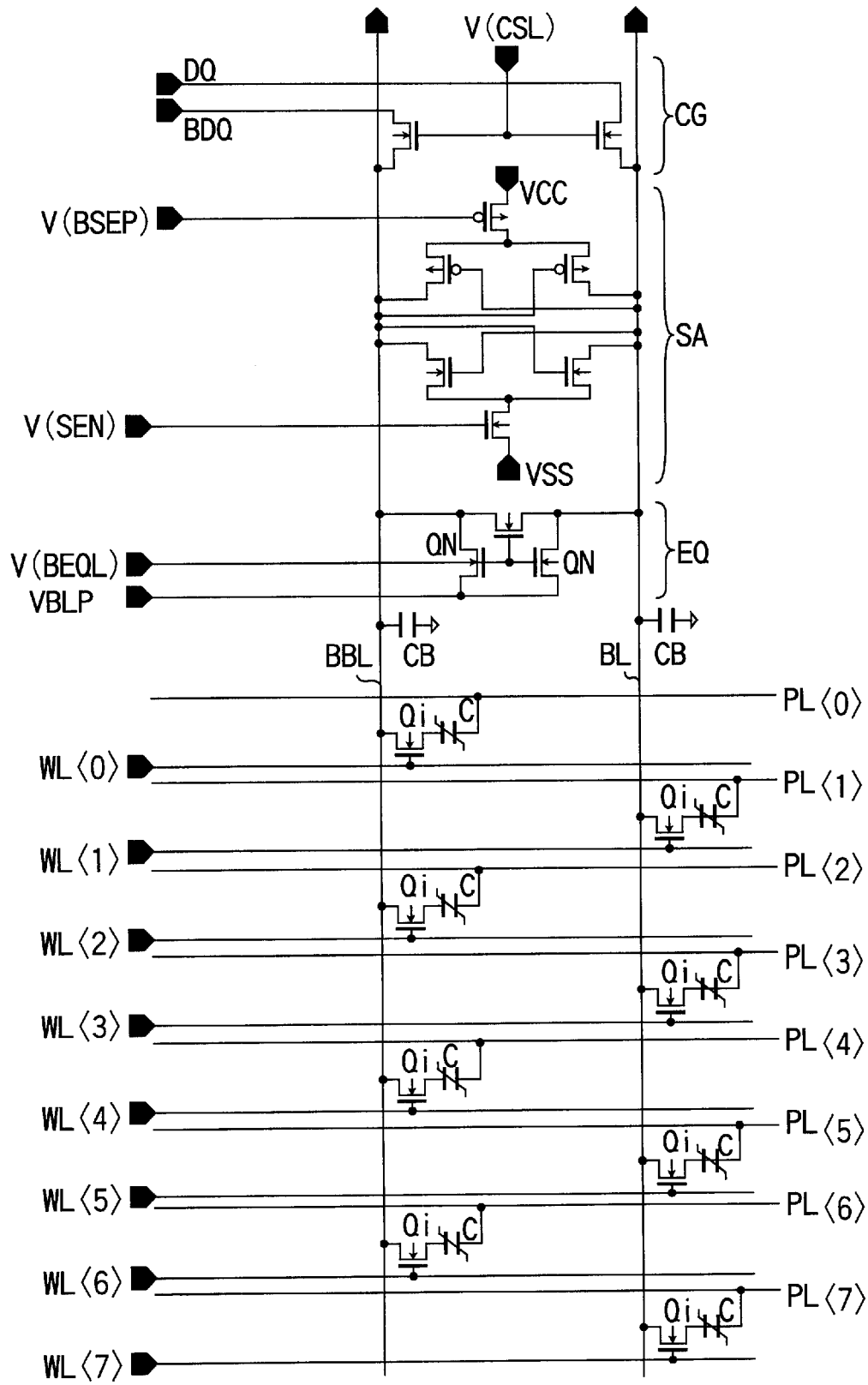
FIG. 16 is a schematic representation of part of the electric circuit of a chain type ferroelectric random access memory according to the fourth embodiment of the invention.

FIG. 16 is a schematic description of part of the electric circuit of ferroelectric random access memory according to the fourth embodiment of the present invention.

This ferroelectric random access memory has almost the same architecture as that of the conventional ferroelectric random access memory except for the following points:

(1) Each memory cell MC is made of a ferroelectric capacitor electrically connected serially to an intrinsic type (I-type) MOS transistor of which threshold value is 0V or near 0V;

(2) The word line voltage is raised to the supply power voltage VCC by the NWL or the BSG method; and (3) The equalization voltage VBLP for the bit line pair is controlled to be a value higher than 0V if the BSG method is employed.

In the memory cell area in FIG. 16, memory cells each of which is made of the ferroelectric capacitor electrically connected in series to the I-type MOS transistor Qi of which threshold value is 0V or near 0V are arrayed in lines. In each cell MC in a row in the memory cell area, one node (on the opposite side to the capacitor) of the electrodes of the transistor Qi is electrically connected to the bit line BL or its complementary line BBL.

The gate of the transistor Qi in each cell MC in a line is electrically connected to the word line WL<i> (WL<0>–WL<7> are shows as examples). The plate electrode (on the opposite side to the transistor) of the cell capacitor C in the cell MC in a line is electrically connected to the plate line PL<i> (PL<0>–PL<7> are shown as examples). The plate line PL<i> is located almost in parallel to the word line WL<i>.

The word line boost voltage is applied to select one or two (pair) of the word lines WL<i> based on the address signal sent from a word line select circuit (not shown). Also the plate line boost voltage is applied to select one or two of the plate lines PL<i> based on the address signal sent from a plate line select circuit (not shown).

EQ is the equalization circuit to equalize the bit line pair BL and BBL; SA the sense amplifier; and CG the column selection gate, configured as in FIG. 1.

ELEVENTH EXAMPLE

Figure 17:
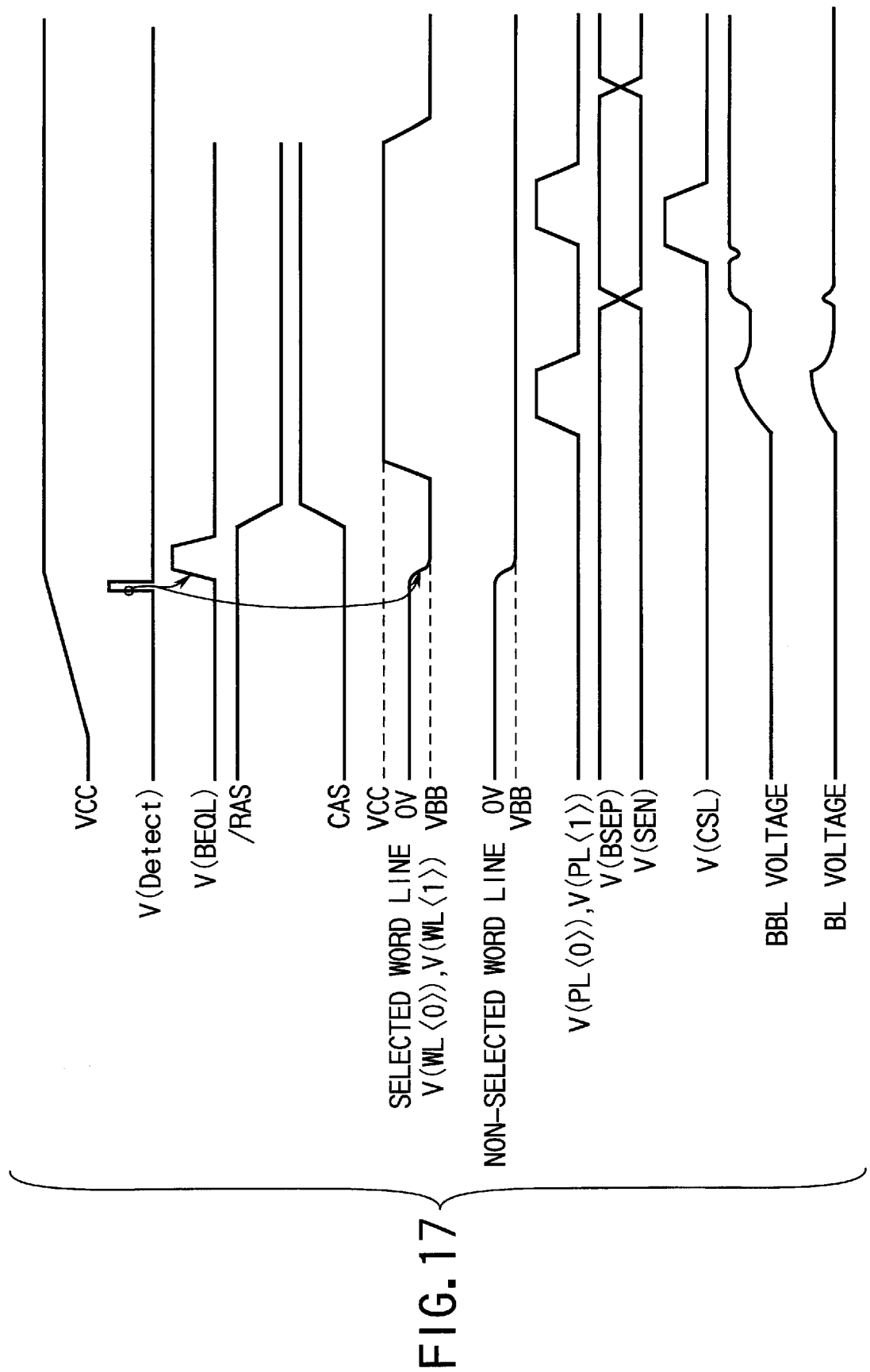
FIG. 17 is a timing chart showing a series of operations in the tenth embodiment of the invention of the chain type ferroelectric random access memory shown in FIG. 16.

FIG. 17 is a timing chart showing a series of NWL-based pseudo-SRAM operations of the ferroelectric random access memory shown in FIG. 16. The ferroelectric random access memory having the 2T2C-type cells reads data and writes data from outside the chip by the double plate pulse driving method.

When power is turned on, the supply power voltage VCC increases gradually. Then a power-on detection circuit (not shown) works and a detection pulse V(Detect) is created. Responding to this pulse, all the word lines are biased to a negative voltage VBB. Then the equalization control signal V(BEQL) becomes "H" and the bit line pair BL and BBL are equalized.

After releasing the equalization, the addresses of the row and the column are latched by lowering the row address strobe signal/RAS and raising the column address strobe signal CAS.

The voltages of the word line WL<0> and WL<1>, which are selected based on the row address, are raised from 0V to VCC to drive the plate line voltages V(PL<0>) and V(PL<1>) with pulses. The column selection gate CG is turned on by the amplification with the sense amplifier SA and the column select signal V(CSL) is activated to read data out to outside the chip. The data is rewritten by driving the plate line voltages V(PL<0>) and V(PL<1>) with pulses.

Later, the selected word line voltages are lowered to equalize the bit line pair BL and BBL again to complete operation.

As mentioned above, by the combination of the use of the NWL method and the I-type transistor Qi, the voltage to which the word lines are raised is lowered from the conventional level VPP (=VCC+Vth, or a higher value) to VCC. As a result, it is possible to improve the TDDB (Time Dependent Dielectric Breakdown) characteristic of the cell transistor Qi.

TWELFTH EXAMPLE

Figure 18:
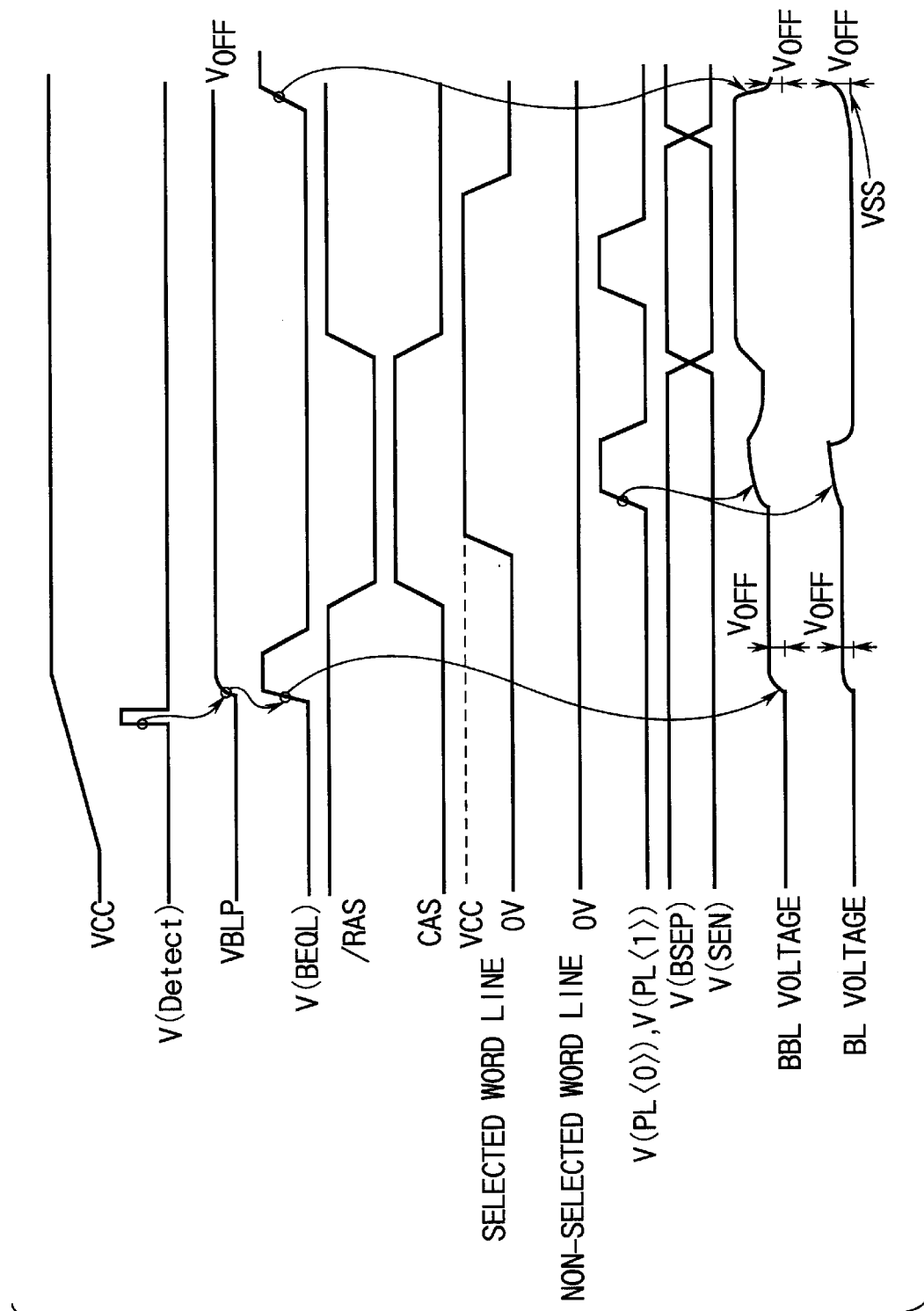
FIG. 18 is a voltage wave figure showing detailed changes in voltage at the nodes BBL0r–BBL7r shown in FIG. 16 during operations shown in FIG. 17.

FIG. 18 is a timing chart showing a series of pseudo-SRAM operations of the ferroelectric random access memory shown in FIG. 16. The ferroelectric random access memory employing 2T2C-type cells and the BSG method reads data and writes data from outside the chip by the double plate pulse driving method.

When power is turned on, the supply power voltage VCC increases gradually. Then a power-on detection circuit (not shown) works and a detection pulse V(Detect) is created. Responding to this pulse, the equalization voltage VBLP of the bit line pair is set at VOFF. Under this state, the equalization control signal V(BEQL) becomes "H" and the bit line pair BL and BBL are equalized to VOFF. After releasing the equalization, /RAS is lowered and CAS is raised to latch the addresses of the row and the column.

The voltages of the word line WL<0> and WL<1>, which are selected based on the row address, are raised from 0V to VCC to drive the plate line voltages V(PL<0>) and V(PL<1>) with pulses. After the amplification with the sense amplifier SA and the selection of the column select line V(CSL), data is read out to outside the chip and the data is written back by driving the plate line voltages V(PL<0>) and V(PL<1>) with pulses.

Later, the selected word line voltages are lowered to equalize the bit line pair BL and BBL again to complete operation.

It should be noted here that the word line voltage is not raised to VPP (=VCC+Vth, or a higher value) but to VCC from 0V.

As mentioned above, by the combination of the use of the BSG method and the I-type transistor Qi, the voltage to which the word lines are raised is lowered from the conventional level VPP to VCC. As a result, it is possible to improve the TDDB (Time Dependent Dielectric Breakdown) characteristic of the cell transistor Qi.

<Fifth Embodiment>

In the fourth embodiment, in the ferroelectric random access memory having an array of memory cells each of which consisted of a cell transistor serially connected to a ferroelectric capacitor, the I-type cell transistor Qi was employed together with the NWL method or the BSG method. Then the voltage to which the word lines were raised was lowered from the conventional level VPP to VCC and the TDDB (Time Dependent Dielectric Breakdown) characteristic of the cell transistor Qi were improved.

In the fifth embodiment for chain type ferroelectric random access memory, the NWL method or the BSG method is employed, and the I-type cell transistor can be used without lowering the word boat voltage below VPP (=VCC+Vth, or a higher value). Then the bias effect in the board is reduced and the amount of disturb (development of an electric field attenuating polarization in non-selected cells) is also reduced.

Figure 19:
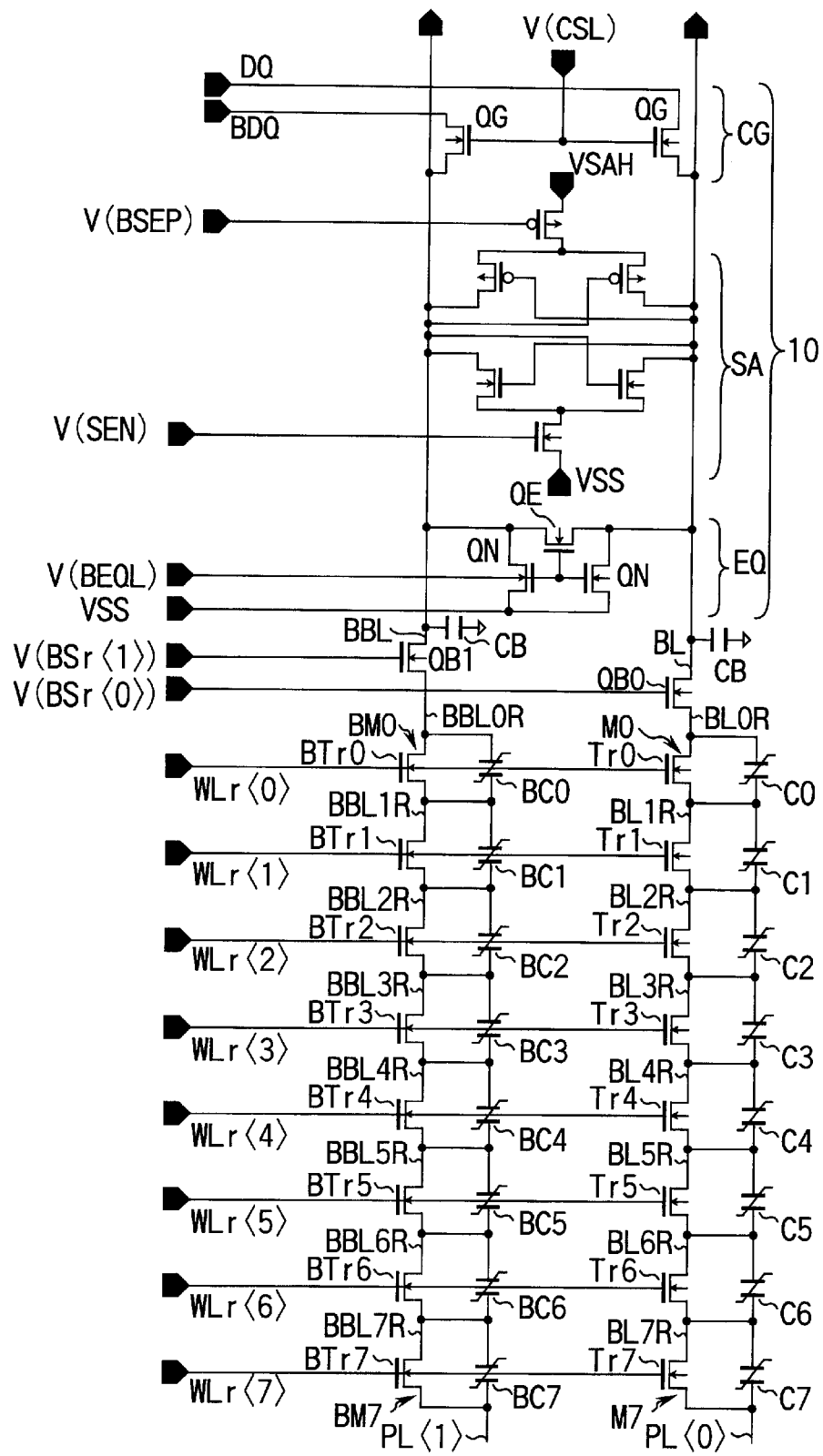
FIG. 19 is a schematic representation of part of the electric circuit of a chain type ferroelectric random access memory according to the fifth embodiment of the invention.

FIG. 19 is a schematic description of part of the electric circuit of ferroelectric random access memory according to the fifth embodiment of the present invention and in more specific shows part of a 2T2C-type cell array and its peripheral circuit.

Figure 29:
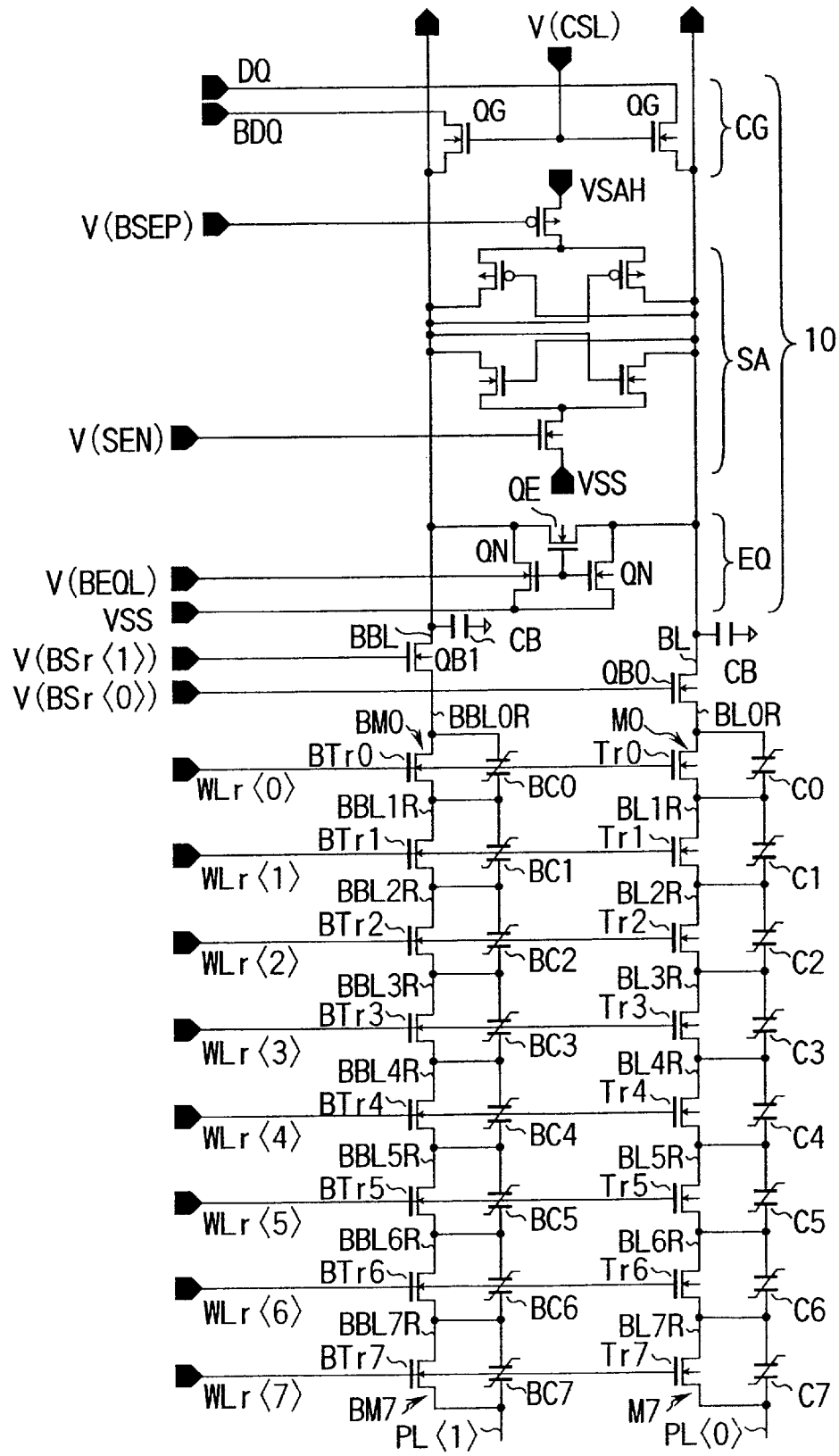
FIG. 29 is a schematic representation of part of the electric circuit of a conventional chain type ferroelectric random access memory.
Figure 30:
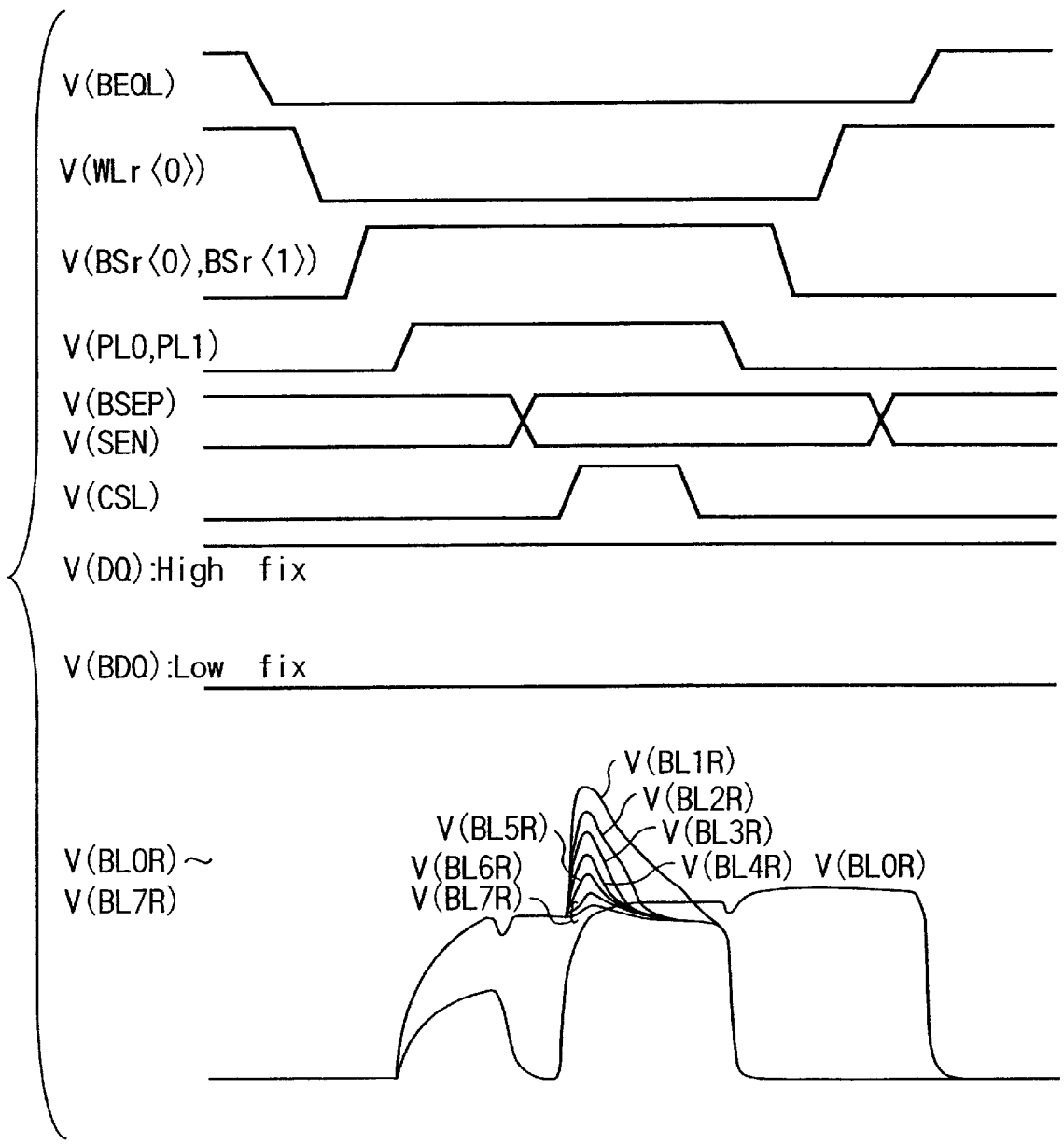
FIG. 30 is a timing chart showing a series of operations in the first embodiment of the invention of the chain type ferroelectric random access memory shown in FIG. 29 and a voltage wave figure showing detailed changes in voltage at the nodes BL0r–BL7r shown in FIG. 29.
Figure 31:
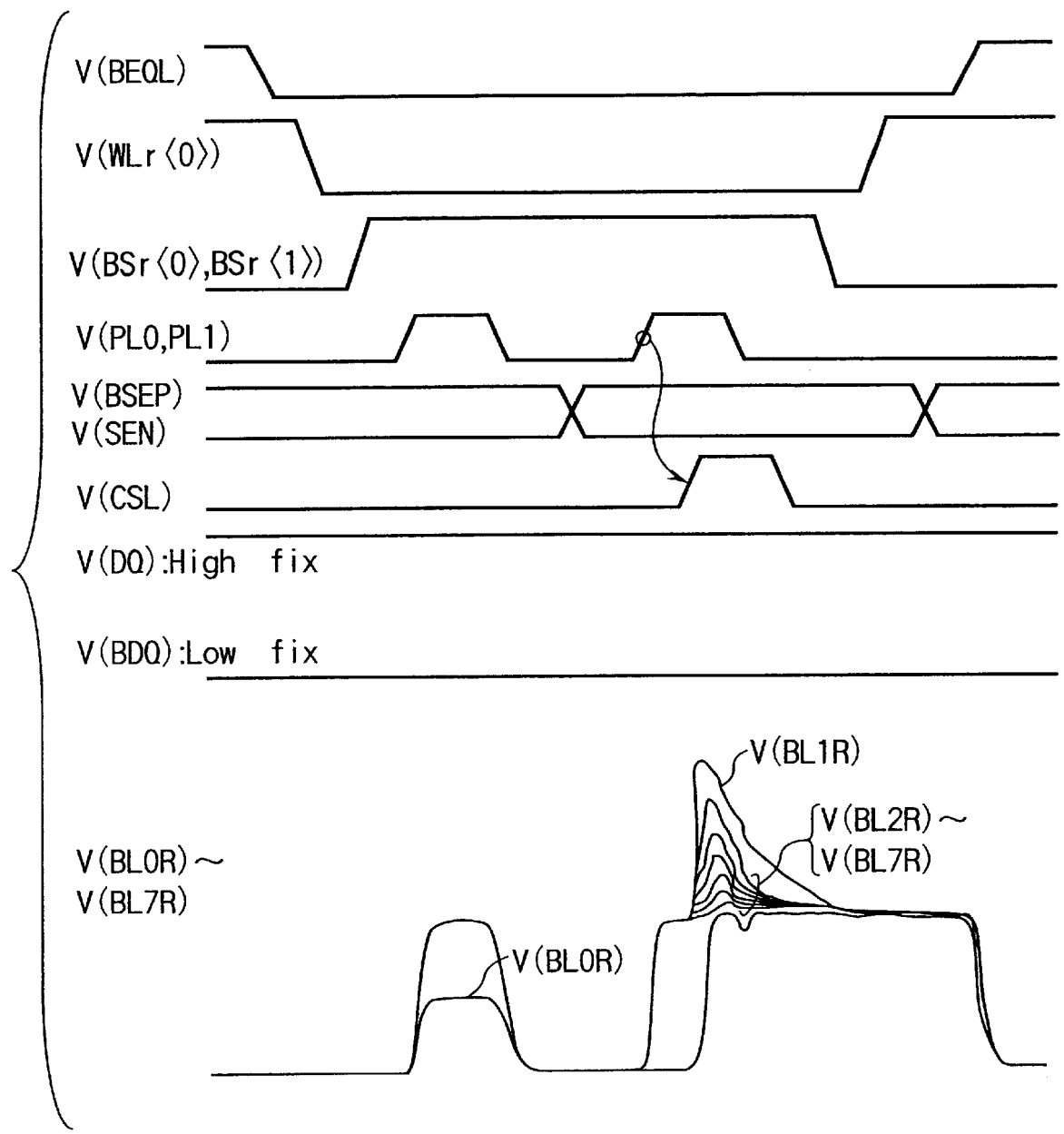
FIG. 31 is a timing chart showing a series of operations in the second embodiment of the invention of the chain type ferroelectric random access memory shown in FIG. 29 and a voltage wave figure showing detailed changes in voltage at the nodes BL0r–BL7r shown in FIG. 29.

This ferroelectric random access memory shown in FIG. 19 has almost the same architecture as that of the ferroelectric random access, memory shown in FIG. 29 except for the following points:

(1) The cell transistors Tr0–Tr7 and BTr0–BTr7 are the I-type transistors of each of which threshold value is 0V or near 0V; and (2) The NWL method or the BSG method is employed. The elements in FIG. 19 are denoted in the same way as in FIG. 29.

THIRTEENTH EXAMPLE

Figure 20:
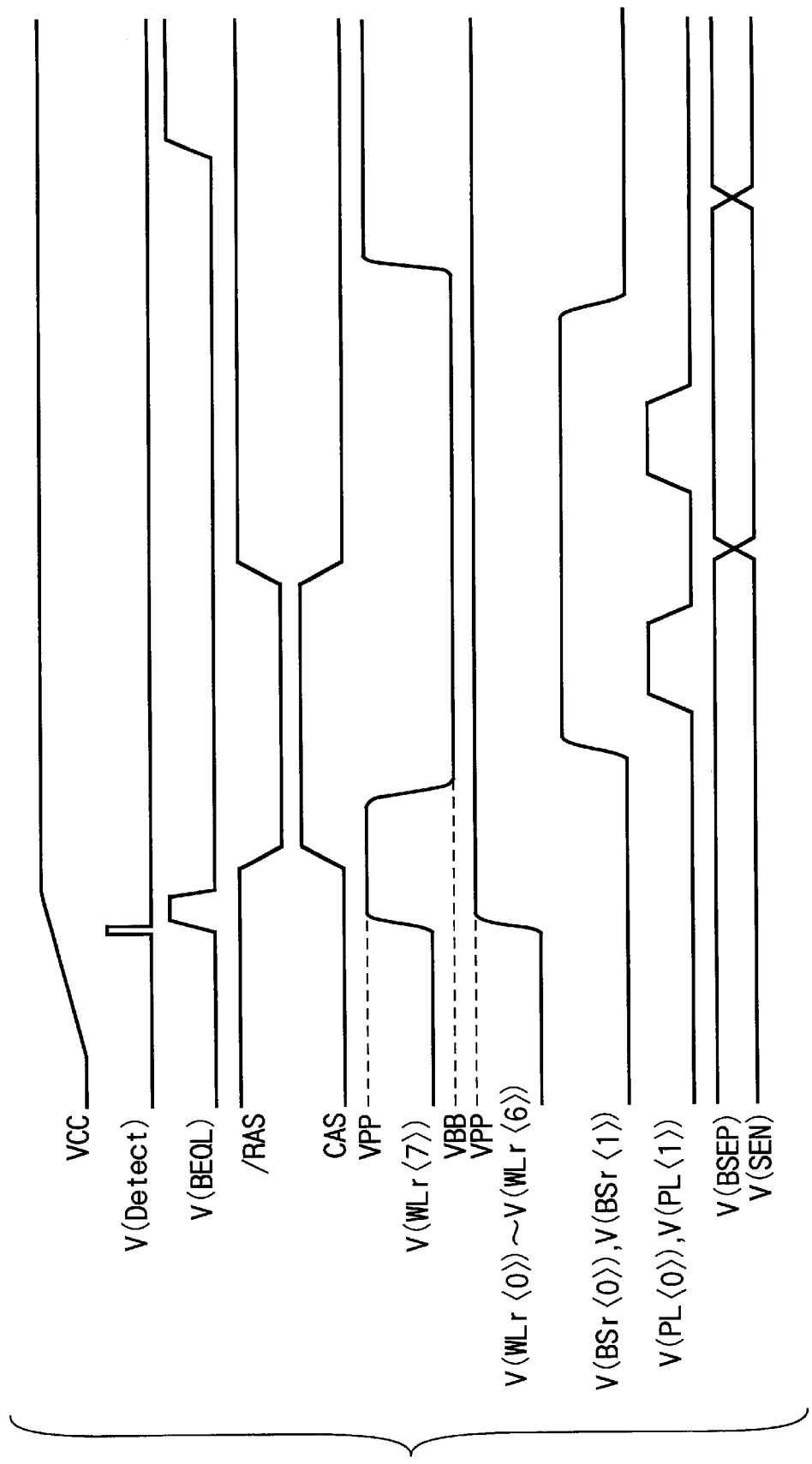
FIG. 20 is a timing chart showing a series of operations in the eleventh embodiment of the invention of the chain type ferroelectric random access memory shown in FIG. 19.

FIG. 20 is a timing chart showing a series of operations of the ferroelectric random access memory shown in FIG. 19. This ferroelectric random access memory employing 2T2C-type cells and the NWL method reads data and writes data from outside the chip by the double plate pulse driving method.

When selecting a word line, for example WLr<7>, it is assumed that the polarization with a direction from the plate line PL<0> to the bit line BL (namely, data "0") is written in the cell M7 on the BL side and the polarization with a direction from the bit line BBL to the plate line PL<1> (namely, data "1") is written in the cell BM7 on the BBL side; and that data "0" and data "1" are read from the memory cells M7 and BM7, respectively, and then written back there.

Figure 21:
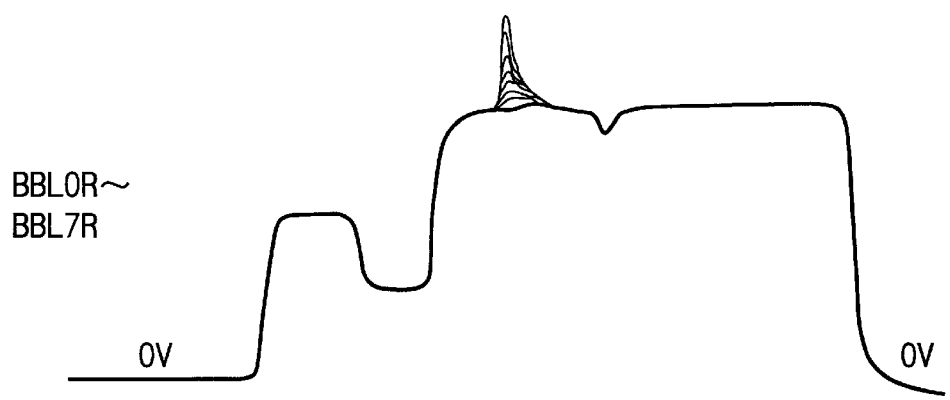
FIG. 21 is a voltage wave figure showing detailed changes in voltage at the nodes BBL0r–BBL7r shown in FIG. 19 during operations shown in FIG. 20.

FIG. 21 shows detailed changes in voltage at the nodes BBL0r–BBL7r of the cell transistors BTr0–BTr7 shown in FIG. 19.

The above operation is explained in detail below with reference to FIG. 20 and FIG. 21.

When power is turned on, the supply power voltage VCC increases gradually. Then a power-on detection circuit (not shown) works and a detection pulse V(Detect) is created. Responding to this pulse, all the word lines are raised to VPP and the equalization control signal V(BEQL) becomes "H" to equalize the bit line pair BL and BBL. After releasing the equalization, /RAS is lowered and CAS is raised to latch the addresses of the row and the column.

Next, the word line voltage V(WLr<7>) is lowered to a negative value VBB to select a word line WLr<7> to be ready to apply voltage to both electrodes of the cells M7 and BM7. Then the block select signals V(BSr<0>) and V(BSr<1>) are raised from "L" to "H" to turn on the block selection transistors QB0 and QB1, and the plate line voltages V(PL<0>) and V(PL<1>) are driven from "L" to "H" to "L" with pulses to read the difference in polarization as data out to the bit line pair BL and BBL.

When the plate line voltages V(PL<0>) and V(PL<1>) are lowered to "L", the sense amplifier activation signal V(SEN) is raised, and the sense amplifier activation signal V(BSEP) is lowered to activate the sense amplifier SA and perform sense amplification with the sense amplifier SA. The column selection gate CG is turned on and data is sent to outside the chip by raising the column selection signal V(CSL) to "H".

Later, the plate line voltages V(PL<0>) and V(PL<1>) are driven from "L" to "H" to "L" with pulses again to rewrite the data latched by the sense amplifier SA to the bit line pair BL and BBL. When the plate line voltage becomes "H", since the polarization data stored in the cell BM7 has a direction from the sense amplifier to the plate line (namely, data "1"), the voltages at the node BBL0R–BBL7R are boosted as shown in FIG. 21 as a result of comparative amplification by the sense amplifier SA and the elevation of the plate line voltage. Then voltage differences appear across:

Node BBL7R and node BBL6R;

Node BBL6R and node BBL5R;

Node BBL5R and node BBL4R;

Node BBL4R and node BBL3R;

Node BBL3R and node BBL2R;

Node BBL2R and node BBL1R.

Those voltage differences arise because the nodes BBL1R-BBL7R are boosted to a value higher than the supply power voltage of the sense amplifier SA and the cell transistors BTr0–Btr7 turn off due to a rise in their threshold level caused by the bias effect in the board.

At this moment, if the direction of polarization in the non-selected cell BM6 is from the sense amplifier to the plate line (namely, data "1"), an electric field works to attenuate this polarization.

Figure 32:
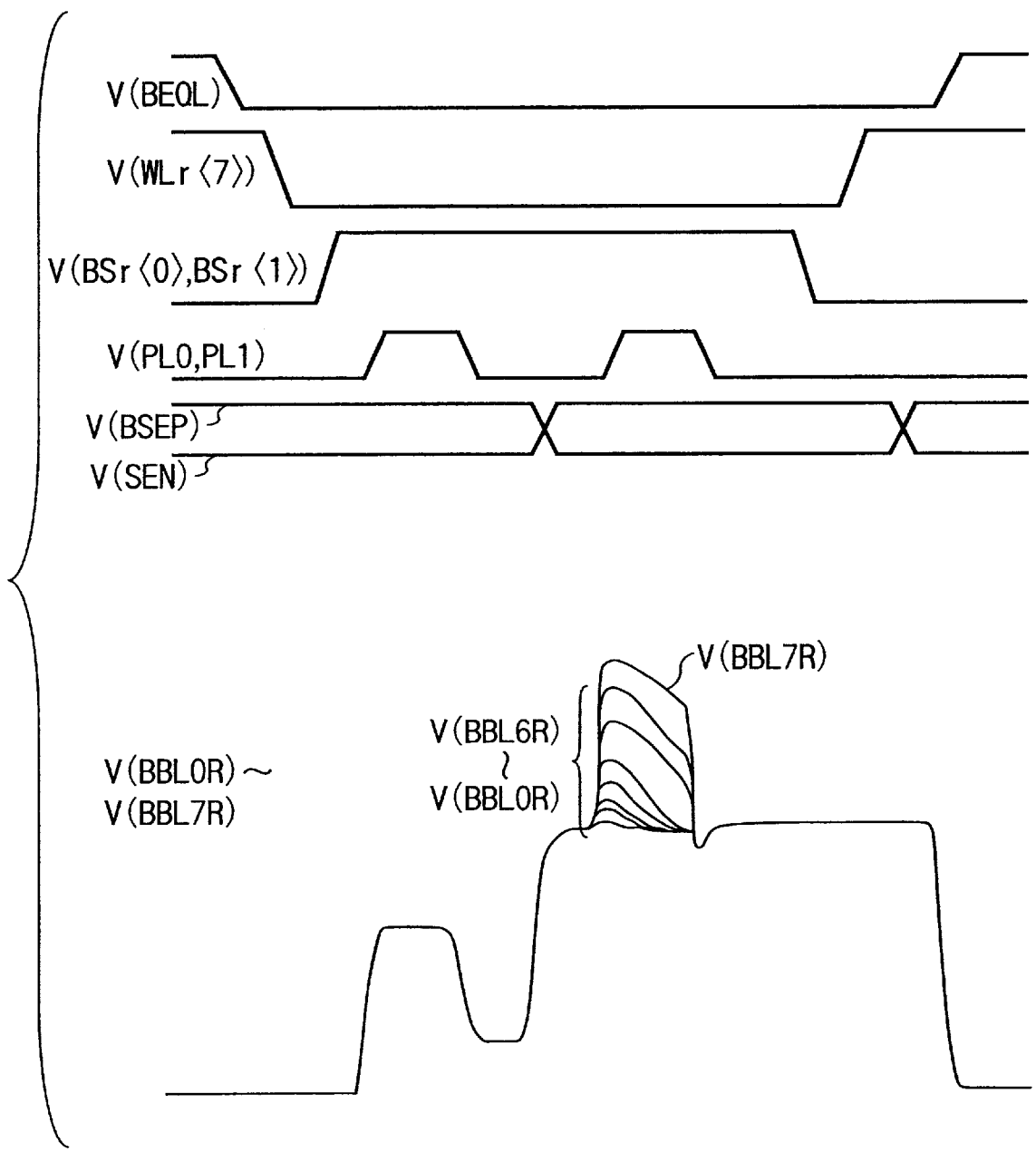
FIG. 32 is a timing chart showing a series of operations in the third embodiment of the invention of the chain type ferroelectric random access memory shown in FIG. 29 and a voltage wave figure showing detailed changes in voltage at the nodes BL0r–BL7r shown in FIG. 29.
Figure 33:
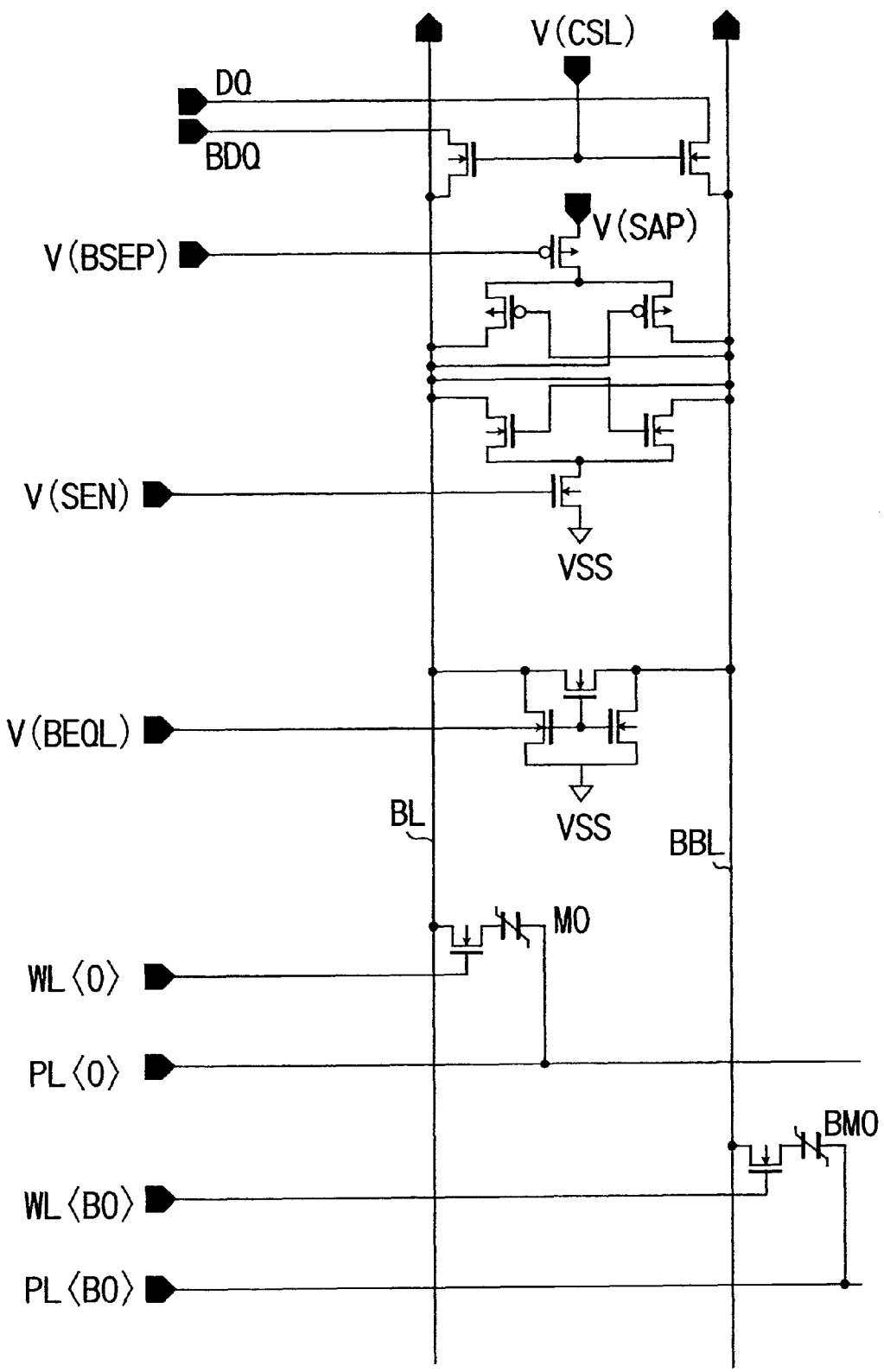
FIG. 33 is a schematic representation of part of the circuit of a conventional ferroelectric random access memory.
Figure 34:
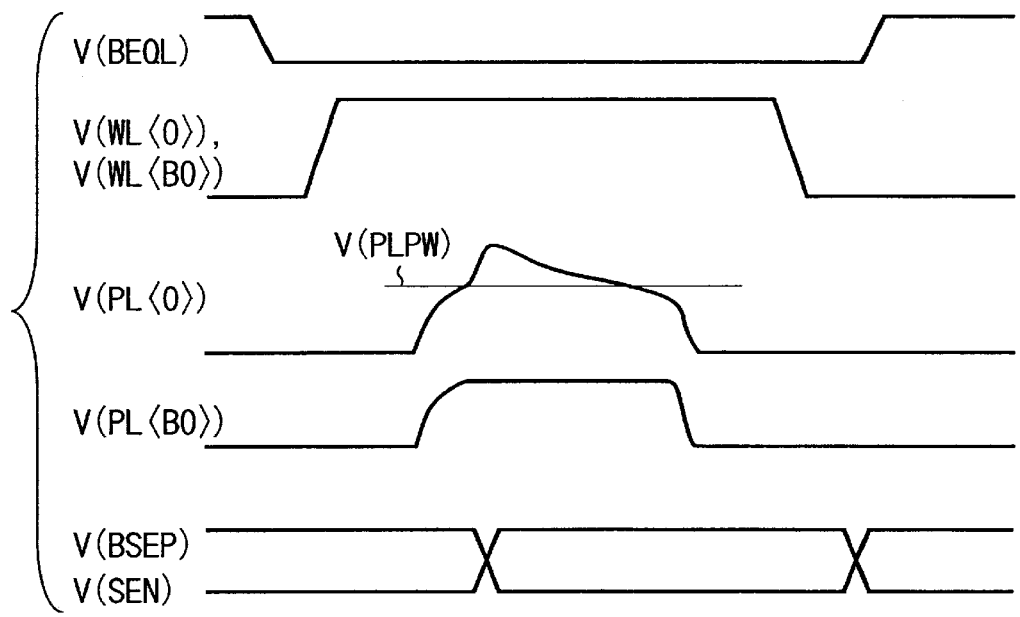
FIG. 34 is a timing chart showing the operations of the ferroelectric random access memory shown in FIG. 33.
Figure 35A:
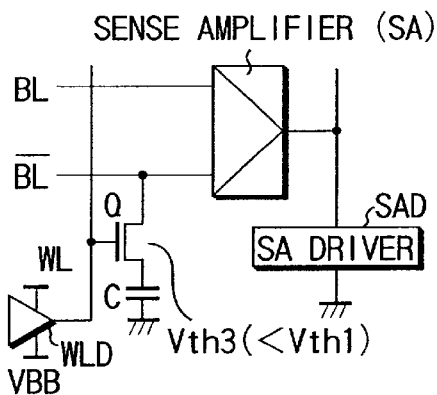
FIG. 35A is a diagram of the electric circuit of a representative part of a DRAM that employs the negative word line method (NWL).
Figure 35B:
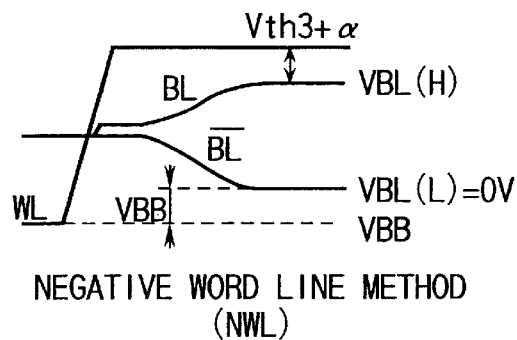
FIG. 35B is a voltage wave figure showing the relationship between a word line voltage and a bit line voltage in DRAM employing the negative word line method (NWL).
Figure 36A:
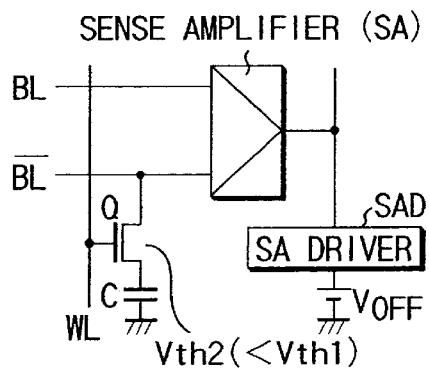
FIG. 36A is a diagram of the electric circuit of a representative part of a DRAM that employs the boosted sense ground method (BSG).
Figure 36B:
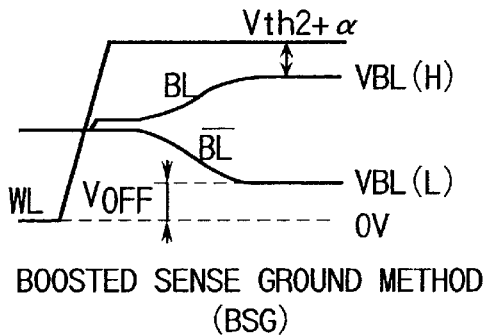
FIG. 36B is a voltage wave figure showing the relationship between a word line voltage and a bit line voltage in DRAM employing the boosted sense ground method (BSG).

However, as indicated by a comparison with the third example of the conventional operation described with reference to FIG. 32, the rise in the threshold level due to the bias effect in the board is reduced by the use of the I-type cell transistors BTr0–BTr7. As a result, the transistors become less likely to turn off and then disturb is reduced.

FOURTEENTH EXAMPLE

Figure 22:
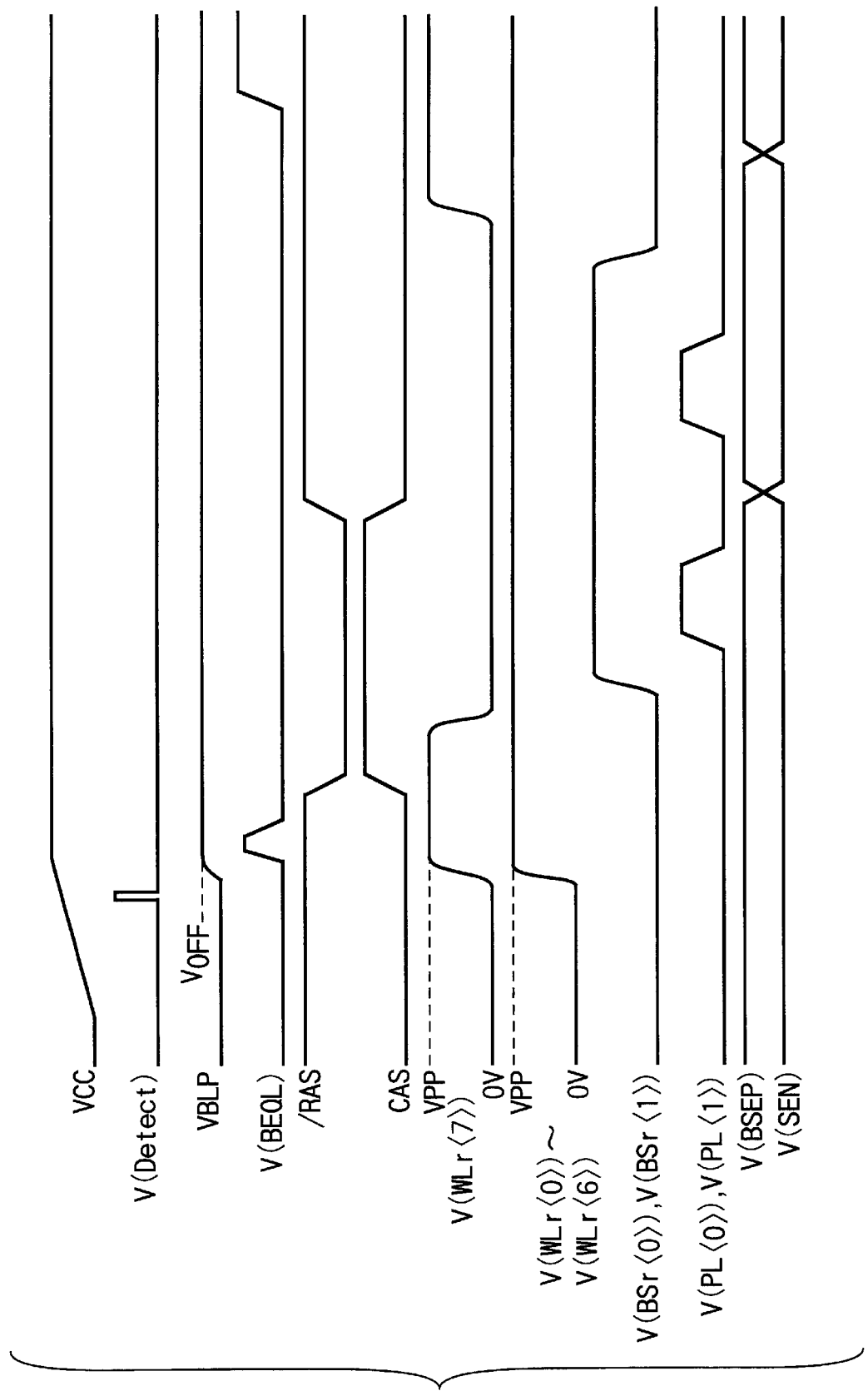
FIG. 22 is a timing chart showing a series of operations in the twelfth embodiment of the invention of the chain type ferroelectric random access memory shown in FIG. 19.
Figure 27A:
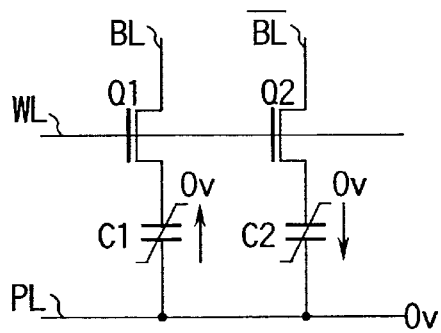
FIG. 27A–FIG. 27C are the equivalent circuits of the 2T2C-type ferroelectric random access memory cell illustrating its read operation and the direction of polarization in a ferroelectric capacitor.
Figure 27B:
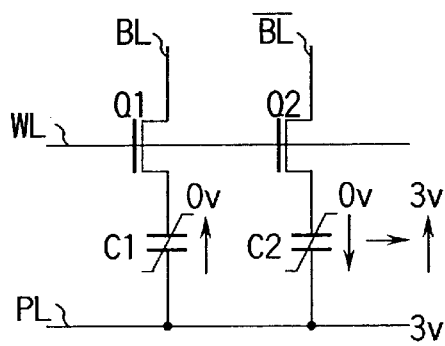
Figure 27C:
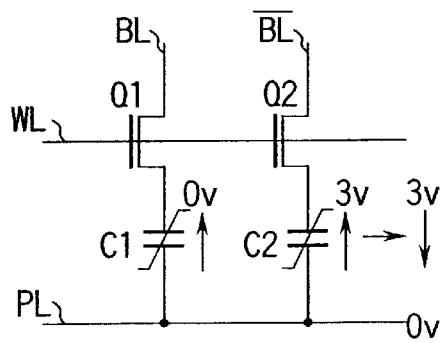
Figure 28:
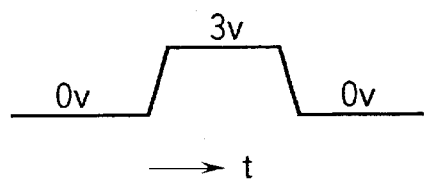
FIG. 28 is a voltage wave figure showing changes in the voltage applied to a plate line in a 2T2C-type FRAM cell during data write/read operations.

FIG. 22 is a timing chart showing a series of operations of the chain type ferroelectric random access memory shown in FIG. 19. The ferroelectric random access memory employing 2T2C-type cells and the BSG method reads data and rewrites data by the double plate pulse driving method.

When selecting a word line, for example WLr<7>, it is assumed that the polarization with a direction from the plate line PL<0> to the bit line BL (namely, data "0") is written in the cell M7 on the BL side and the polarization with a direction from the bit line BBL to the plate line PL<1> (namely, data "1") is written in the cell BM7 on the BBL side; and that data "1" and data "0" are read from the memory cells BM7 and M7, respectively, and then data "0" and data "1" are written back there from outside the chip.

Figure 23:
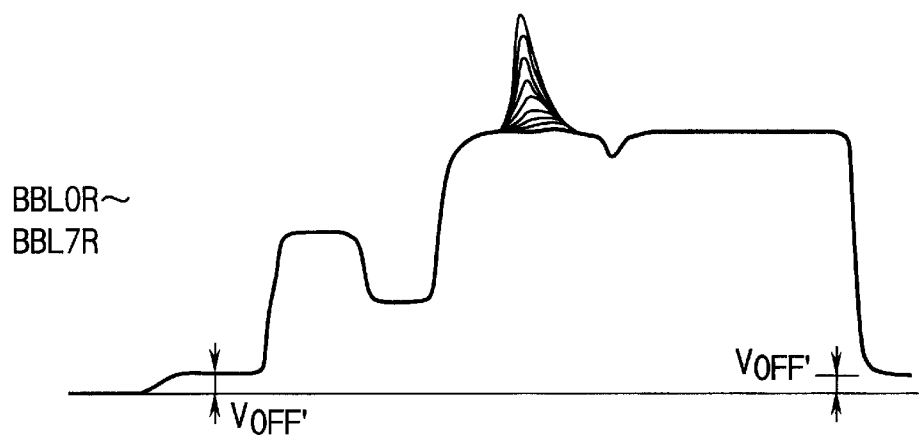
FIG. 23 is a voltage wave figure showing detailed changes in voltage at the nodes BBL0r–BBL7r shown in FIG. 19 during operations shown in FIG. 22.

FIG. 23 shows detailed changes in voltage at the nodes BBL0r–BBL7r of the cell transistors BTr0–BTr7 in FIG. 19 during operations shown in FIG. 22.

The above operation is explained in detail below with reference to FIG. 22 and FIG. 23.

When power is turned on, the supply power voltage VCC increases gradually. Then a power-on detection circuit (not shown) works and a detection pulse V(Detect) is created. Responding to this pulse, all the word lines are raised to VPP and the equalization voltage VBLP of the bit line pair is set at VOFF to provide a floating state. Under this state, the equalization control signal V(BEQL) becomes "H" and the bit line pair BL and BBL are equalized to VOFF. After releasing the equalization, /RAS is lowered and CAS is raised to latch the addresses of the row and the column.

Next, the word line voltage V(WLr<7>) is lowered to 0V to be ready to apply voltage to both electrodes of the cells M7 and BM7. Then the block select signals V(BSr<0>) and V(BSr<1>) are raised from "L" to "H" to turn on the block selection transistors QB0 and QB1, and the plate line voltages V(PL<0>) and V(PL<1>) are driven from "L" to "H" to "L" with pulses to read the difference in polarization as data out to the bit line pair BL and BBL.

When the plate line voltages V(PL<0>) and V(PL<1>) are lowered to "L", the sense amplifier activation signal V(SEN) is raised and the sense amplifier activation signal V(BSEP) is lowered to activate the sense amplifier SA and perform sense amplification with the sense amplifier SA.

Later, the plate line voltages are driven again from "L" to "H" to "L" with pulses to rewrite the data latched by the sense amplifier SA in the bit line pair BL and BBL. When the plate line voltage becomes "H", since the polarization data stored in the cell BM7 has a direction from the sense amplifier to the plate line (namely, data "1"), the voltages at the node BBL0R–BBL7R are boosted as shown in FIG. 23 as a result of the comparative amplification conducted by the sense amplifier SA and the elevation of the plate line voltage. Then voltage differences appear across:

Node BBL7R and node BBL6R;

Node BBL6R and node BBL5R;

Node BBL5R and node BBL4R;

Node BBL4R and node BBL3R;

Node BBL3R and node BBL2R;

Node BBL2R and node BBL1R.

Those voltage differences arise because the nodes BBL1R–BBL7R are boosted to a value higher than the supply power voltage and the cell transistors Tr0-tr7 turn off due to a rise in their threshold level caused by the bias effect in the board.

At this moment, if the direction of polarization in the non-selected cell BM6 is from the sense amplifier to the plate line (namely, data "1"), an electric field works to attenuate this polarization.

However, as indicated by a comparison with the third example of the conventional operation described with reference to FIG. 32, the rise in threshold level due to the bias effect in the board is reduced by the use of the I-type cell transistors BTr0–BTr7. As a result, the transistors become less likely to turn off and thereby disturb is reduced.

Later, the column select signal V(CSL) becomes "H" during the activation of the sense amplifier SA and data is written in the sense amplifier SA through the column selection gate CG from outside the chip.

Now the fifth embodiment of the present invention has been summarized as follows.

Assuming that in the conventional chain type ferroelectric random access memory, after the sense amplifier is activated, the plate lines are driven by the double plate pulse driving method to rewrite the data. When reading data "1", since the voltage which has been lifted to the supply power voltage of the sense amplifier is further boosted by the plate line, the transfer gate is turned off because of the bias effect in the board. As a result, a voltage bias arises at both electrodes of each memory cell, and the accumulated charge of polarization in each memory cell is decreased to cause disturb.

In the chain type ferroelectric random access memory according to the fifth embodiment, the I-type transistor of which threshold level is 0V or near 0V is employed as the cell transfer gate; the NWL or BSG method is employed; and VPP (VCC or a higher value) is provided as the word line voltage. As a result of the use of such I-type transistors, the rise in threshold due to the bias effect in the board is reduced. Then the transistors become less likely to turn off and thus disturb is reduced.

<Sixth Embodiment>

Next, an explanation about the DRAM according to the sixth embodiment is provided.

Figure 24:
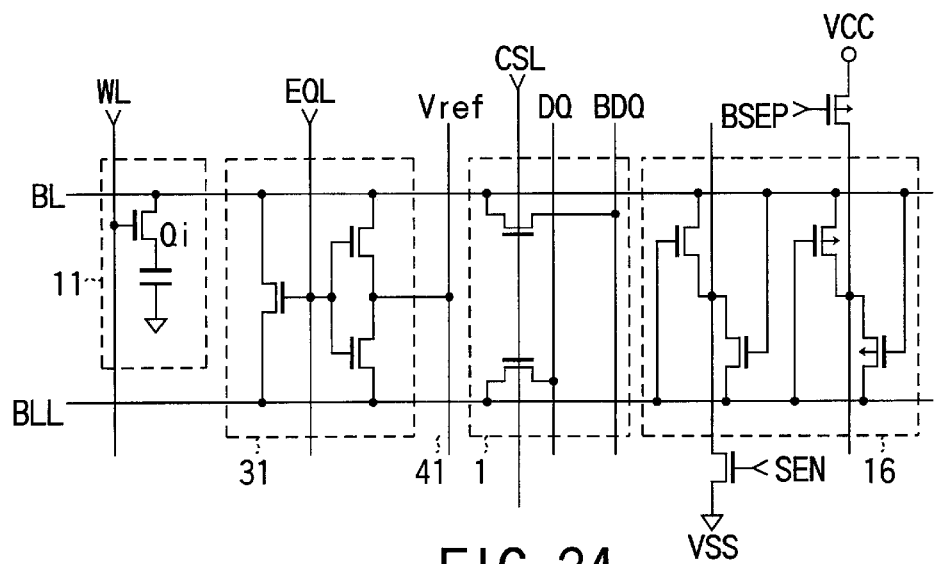
FIG. 24 is a schematic representation of part of the electric circuit of DRAM according to the sixth embodiment of the invention.

FIG. 24 is a schematic description of part of the structure of DRAM according to the sixth embodiment of the present invention and in more specific shows part of the cell array and its peripheral circuit.

This DRAM is different from the conventional DRAM at the following points:

(1) The memory cell 11 is made up of a memory capacitor C having a gate oxide film as the capacitor insulator electrically connected in series to the I-type MOS transistor Qi of which threshold value is 0V or near 0V; and (2) The word line voltage is raised to the supply power voltage VCC according to the NWL or the BSG method.

The other architecture is almost the same as that of the conventional DRAM.

In the memory cell area in FIG. 24, the memory cell 11 which is made of one capacitor electrically connected in series to the I-type MOS transistor Qi of which threshold value is 0V or near 0V is arrayed in lines (only one cell is shown in the figure, as an example).

A plurality of word lines (only one line is shown in the figure, as an example) to select the memory cell 11 in the memory cell area and pairs of the bit lines BL and BBL (only one pair is shown in the figure, as an example) are provided crossing each other.

Between the bit line pair BL and BBL, a bit line precharge circuit 31, a sense amplifier 16, and a column selection gate 17 are inserted. A pair of data lines DQ and BDQ are electrically connected to the column selection gate 17.

The above bit line precharge circuit 31 is controlled by an equalization control signal EQL and precharges the bit line pair BL and BBL to the voltage Vref which is supplied by a precharge supply power source line 41.

The sense amplifier 16 consists of an NMOS sense amplifier part controlled by a sense amplifier control signal SEN and a PMOS sense amplifier part controlled by a sense amplifier control signal BSEP. The column selection gate 17 is controlled by a column select control signal CSL.

FIFTEENTH EXAMPLE

As the fifteenth example, a series of operations of the DRAM shown in FIG. 24 are explained. The DRAM employing the NWL method reads and writes data using the supply power voltage VCC as its word line boost voltage.

This DRAM is different from the conventional DRAM employing the NWL method in that the supply power voltage VCC is used as its word line boost voltage. The other operations are the same as those of the conventional DRAM.

When power is turned on, the supply power voltage VCC increases gradually. Then a power-on detection circuit (not shown) works and a detection pulse V is created. Responding to this pulse, all the word lines are biased at a negative level VBB and the equalization control signal EQL becomes "H" to equalize the bit line pair BL and BBL.

When data is read from a memory cell, the equalization control signal EQL is lowered from "H" to "L" to release the equalization, and the bit line pair BL and BBL stand at a floating state.

Next, a row address strobe signal (not shown) is activated and a column address strobe signal (not shown) is also activated to latch the row and column addresses. The word line WL selected based on the row address is raised from the negative voltage VBB to VCC and then data in the memory cell is read out to the bit line BL.

Later, the sense amplifier control signal SEN becomes "H" from "L" and the sense amplifier control signal BSEP becomes "L" from "H". Then the sense amplifier 16 is activated and the voltages in the bit line pair BL and BBL are amplified.

The amplified output (readout) from the sense amplifier 16 is rewritten in the cell and sent out to a buffer circuit (not shown) through the data line pair DQ and BDQ.

Later, the selected word line WL is lowered from "H" to "L" to stop access to the cell, and the sense amplifier 16 is deactivated by switching the sense amplifier control signal BSEP from "L" to "H" and the sense amplifier control signal SEN from "H" to "L".

The equalization control signal EQL is raised to "H" to set the bit line pair BL and BBL at the precharge voltage Vref for a stand-by mode.

Since the DRAM in the fifteenth example employs the NWL method (the word line is biased negatively while the memory cell is not selected), substantially a negative voltage is applied between the gate and the source of the cell transistor. As a result, a sufficient cut-off is provided to the cell transistor when the cell is not selected.

In the DRAM employing the NWL method, if NMOS transistors of which threshold values are positive are used as cell transistors as is the case with the conventional DRAM, the boost voltage of the word lines is required to be VPP which is VCC (supply power voltage)+Vth, or a higher level. However, in this example, the I-type transistor is employed of which threshold is 0V and near 0V and thus the threshold of the cell transistor is lowered. Therefore, it is possible to set the word line boost voltage at the supply power voltage VCC, and the TDDB characteristics of the cell transistor are improved.

SIXTEENTH EXAMPLE

In the sixteenth example, a series of operations of the DRAM shown in FIG. 24 are explained. The DRAM employing the BSG method reads and rewrites data using the supply power voltage VCC as the word line boost voltage.

This DRAM is different from the conventional DRAM employing the BSG method in that the supply power voltage VCC is used as its word line boost voltage. The other operations are the same as those of the conventional DRAM.

When power is turned on, the supply power voltage VCC increases gradually. Then a power-on detection circuit (not shown) works and a detection pulse V(Detect) is created. Responding to this pulse, the equalization voltage of the bit line pair (Vref supplied from the precharge power source voltage 41) is set at an offset value higher by VOFF than the word line "L" level. Under the above state, the equalization control signal EQL becomes "H" and the bit line pair BL and BBL are equalized to VOFF.

When data is read from the memory cell, the equalization control signal EQL is lowered from "H" to "L" to release the equalization and the bit line pair BL and BBL stand at a floating state.

Next, a row address strobe signal (not shown) is activated and a column address strobe signal (not shown) is also activated to latch the row and column addresses. The word line WL selected based on the row address is raised from 0V to VCC and then data in the memory cell is read out to the bit line BL.

Later, the sense amplifier control signal SEN becomes "H" from "L" and the sense amplifier control signal BSEP becomes "L" from "H". Then the sense amplifier 16 is activated and the voltages in the bit line pair BL and BBL are amplified by the sense amplifier.

The amplified output (readout) from the sense amplifier 16 is rewritten in the cell and sent out to a buffer circuit (not shown) through the data line pair DQ and BDQ.

Later, the selected word line WL is lowered from "H" to "L" to stop access to the cell, and the sense amplifier 16 is deactivated by switching the sense amplifier control signal BSEP from "L" to "H" and the sense amplifier control signal SEN from "H" to "L".

The equalization control signal EQL is raised to "H" to set the bit line pair BL and BBL at the precharge voltage Vref (offset voltage VOFF) to be in a stand-by mode.

Since the DRAM in the sixteenth example employs the BSG method (the sense amplifier output "L", namely, the bit line level "L" is higher by VOFF than the word line level "L"), substantially a negative voltage is applied between the gate and the source of the cell transistor. As a result, a sufficient cut-off is provided to the cell transistor when the cell is not selected.

In the DRAM employing the BSG method, if NMOS transistors of which threshold values are positive are used as cell transistors as is the case with conventional DRAM, the boost voltage of the word lines is required to be VPP which is VCC (supply power voltage)+Vth, or a higher level. However, in this example, the I-type transistor is employed of which threshold is 0V and near 0V and thus its threshold level is lowered. Therefore, it is possible to set the word line boost voltage at the supply power voltage VCC, and then the TDDB characteristics of the cell transistor are improved.

In the chain type ferroelectric random access memory, particularly when the word line boost voltage is lowered, such a problem occurs that the polarization in the memory cell decreases during read/write operations. However, the ferroelectric memory according to this invention can reduce the amount of disturb that causes the above problem.

Also when the read operation is performed by the single pulse driving method in an ferroelectric random access memory having memory cells of the conventional type, the present invention can reduce the amount of boost in the plate line so as not to affect the reliability of the cell capacitor.

The present invention enables operations at low voltages and eventually at low power consumption, and provides semiconductor memory devices of high reliability.

Namely, in the ferroelectric memory according to the first aspect of the present invention, the occurrence of an electric field that works to attenuate the polarization in the non-selected cell, namely, disturb, is prevented because the plate line and the sense amplifier do not become "H" at the same time when data "1" is rewritten and data "1" is written from outside the chip in the chain type ferroelectric random access memory.

Also in the ferroelectric memory according to the second aspect of the present invention, disturb due to the development of an electric field that works to attenuate the polarization in the non-selected cells is prevented because the plate line and the sense amplifier do not become "H" at the same time when data "1" is rewritten and data "1" is written from outside the chip in the ferroelectric random access memory that has an array of memory cells each of which consists of one ferroelectric capacitor serially connected to one transistor.

In the semiconductor memory according to the third aspect of the present invention, the word line boat voltage can be lowered in the semiconductor memory that uses an array of ordinary 1T1C-type memory cells.

Also, in the semiconductor memory according to the fourth aspect of the present invention, the TDDB characteristics of the transistor used in the cell memory in the chain type ferroelectric random access memory can be improved.

The present invention has been described in detail with respect to various embodiments, and it will now be apparent from the foregoing to those skilled in art that changes and modifications may be made without departing from the invention in its broader aspects, and it is the intention, therefore, in the appended claims to cover all such changes and modifications as fallen within the true spirit of the invention.

Additional advantages and modifications will readily occur to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalents.

What is claimed is:

1. A ferroelectric memory comprising:
    a memory cell unit comprising a plurality of memory cells in each of which one of two electrodes of a ferroelectric capacitor is electrically connected to a source of a first MOS transistor and the other electrode to a drain thereof;
    a plurality of word lines each of which is electrically connected to a gate of said first MOS transistor;
    a plate line electrically connected to one of the two electrodes of a first memory cell in said memory cell unit;
    a bit line electrically connected to the other electrode of a second memory cell in the memory cell unit via a block select switching device;
    a sense amplifier to compare and amplify voltages of a bit line pair of said bit line and a bit line complementary to said bit line; and
    a second MOS transistor inserted between the block select switching device and the sense amplifier;
    wherein a relation VPP1<VPP2 is provided, VPP1 being a minimum voltage appearing at a gate of the second MOS transistor when a plate line voltage has been elevated and the sense amplifier is performing comparative amplification, and VPP2 being a maximum voltage appearing at the gate of the second MOS transistor when the plate line voltage has been lowered and the sense amplifier is performing comparative amplification.

2. A ferroelectric memory according to claim 1, wherein a relation VPP1<VPP3 is provided, VPP3 being the maximum voltage appearing at the gate of the second MOS transistor when the plate line voltage has been elevated and the sense amplifier is not performing comparative amplification.

3. A ferroelectric memory according to claim 2, wherein VPP3 is equal to or more than a sum of the maximum amplitude of the voltage on the bit line and a threshold voltage of the second MOS transistor.

4. A ferroelectric memory according to claim 2, wherein an equalization circuit is added between the second MOS transistor and the memory cells and equalizes the bit line pair to 0V with a specific timing.

5. A ferroelectric memory according to claim 1, wherein VPP2 is equal to or more than a sum of a maximum amplitude of a voltage on the bit line and a threshold voltage of the second MOS transistor.

6. A ferroelectric memory according to claim 5, wherein VPP2 is equal to VPP, which is the voltage that the word line is electrically elevated to.

7. A ferroelectric memory according to claim 1, wherein VPP1 is less than a sum of the maximum amplitude of a voltage on the bit line and a threshold voltage of the second MOS transistor.

8. A ferroelectric memory according to claim 1, wherein VPP1 is equal to the maximum amplitude of voltage on the bit line or VCC which is a supply voltage supplied from outside the memory.

9. A ferroelectric memory according to claim 1, wherein VPP1 is equal to 0V.

10. A ferroelectric memory according to claim 1, wherein an equalization circuit is added between the second MOS transistor and the memory cells and equalizes the bit line pair to 0V with a specific timing.

11. A ferroelectric memory according to claim 10, wherein polarization with a direction from the plate line to the sense amplifier is rewritten in the memory cell by controlling the equalization circuit to turn on during the time the gate of the second MOS transistor stands at 0V.

12. A ferroelectric memory which performs operations described in claim 11 when writing data from outside the ferroelectric memory after reading data from a selected memory cell in the memory cell unit and performs operations described in claim 11 when reading data from a selected memory cell in the memory cell unit and then rewrites the data.

13. A ferroelectric memory according to claim 12, wherein a cycle time for the read operations is shorter than a cycle time for the write operations.

14. A ferroelectric memory which performs operations described in claim 11 when it reads data from a selected memory cell in the memory cell unit and then rewrites it and when it reads data from a selected memory cell in the memory cell unit and then writes data from outside the chip.

15. A ferroelectric memory according to claim 10, wherein the equalization circuit is controlled to turn on only when the sense amplifier is inactive.

16. A ferroelectric memory comprising:

a memory cell unit comprising a plurality of memory cells in each of which one of two electrodes of a ferroelectric capacitor is electrically connected to a source of a first MOS transistor and the other electrode to a drain thereof;

a plurality of word lines each of which is electrically connected to a gate of said first MOS transistor;

a plate line electrically connected to one of the two electrodes of a first memory cell of said memory cell unit;

a bit line electrically connected to the other electrode of a second memory cell of the memory cell unit via a block select switching device;

a sense amplifier to compare and amplify voltages of a bit line pair of said bit line and a bit line complementary to said bit line;

an equalization circuit connected between the bit line pair, for equalizing the bit line pair to 0V with a specific timing; and a second MOS transistor inserted between the equalization circuit and the sense amplifier, for selectively disconnecting the equalization circuit from the sense amplifier through a disconnection control signal applied to a gate of the second MOS transistor.

* * * * *